United States Patent
Seto et al.

(10) Patent No.: US 7,357,882 B2
(45) Date of Patent: Apr. 15, 2008

(54) LIGHT EMITTING DEVICE AND ILLUMINATOR USING THE SAME

(75) Inventors: Takatoshi Seto, Kanagawa (JP); Naoto Kijima, Kanagawa (JP); Akira Ohno, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 415 days.

(21) Appl. No.: 10/918,339

(22) Filed: Aug. 16, 2004

(65) Prior Publication Data
US 2005/0145854 A1    Jul. 7, 2005

Related U.S. Application Data

(63) Continuation of application No. PCT/JP03/01506, filed on Feb. 13, 2003.

(30) Foreign Application Priority Data

| Feb. 15, 2002 | (JP) | ............................ P2002-038705 |
| Feb. 27, 2002 | (JP) | ............................ P2002-050938 |
| Apr. 30, 2002 | (JP) | ............................ 2002-129143 |
| Jul. 24, 2002 | (JP) | ............................ P2002-214992 |
| Nov. 29, 2002 | (JP) | ............................ P2002-348200 |
| Jan. 10, 2003 | (JP) | ............................ P2003-004521 |

(51) Int. Cl.
*H01L 33/00* (2006.01)

(52) U.S. Cl. ..................... 252/301.4 R; 252/301.4 P; 252/301.4 F; 252/301.4 H; 252/301.6 R; 252/301.6 F; 252/301.6 P; 313/503; 257/98

(58) Field of Classification Search ......... 252/301.4 R, 252/301.4 P, 301.6 P, 301.4 H, 301.4 F, 301.6 F, 252/301.6 R; 313/503; 257/98
See application file for complete search history.

(56) References Cited

U.S. PATENT DOCUMENTS 3,651,363 A    3/1972   Barry (Continued)

FOREIGN PATENT DOCUMENTS

EP    0766285 A1    4/1997

(Continued)

*Primary Examiner*—C. Melissa Koslow
(74) *Attorney, Agent, or Firm*—Oblon, Spivak, McClelland, Maier & Neustadt, P.C.

(57) ABSTRACT

An object of the present invention is to provide a light emitting device having a high emission intensity, and a light emitting device having a high emission intensity and a good color rendering property.

The present invention provides a light emitting device which comprises:
  a first light emitter emitting light of from 350 to 415 nm and
  a second light emitter emitting visible light by exposure to the light from the first light emitter, wherein said second light emitter comprises a phosphor capable of satisfying any one of the following conditions (i) to (iv):
  (i) the phosphor comprises:
  (a) a crystal phase whose Eu concentration providing the maximum emission intensity at any one of excitation wavelengths of from 350 to 415 nm is higher than that providing the maximum emission intensity at an excitation wavelength of 254 nm; and
  (b) a crystal phase which is activated by Eu having at least 1.1 times the concentration providing the maximum emission intensity at an excitation wavelength of 254 nm and 0.5 to 9 times the concentration providing the maximum emission intensity at an excitation frequency of 400 nm:
  (ii) the phosphor comprises a crystal phase having an Eu—Eu mean distance, as calculated from the Eu concentration in a crystal matrix, of 4 Å or greater but not greater than 11 Å:
  (iii) the phosphor has a quantum absorption efficiency $\alpha_q$ of 0.8 or greater:
  (iv) the phosphor has a product $\alpha_q \cdot \eta_i$ of a quantum absorption efficiency $\alpha_q$ and an internal quantum efficiency $\eta_i$ of 0.55 or greater.

39 Claims, 29 Drawing Sheets

U.S. PATENT DOCUMENTS

| | | |
|---|---|---|
| 3,691,482 A | 9/1972 | Pinnow et al. |
| 3,699,478 A | 10/1972 | Pinnow et al. |
| 5,998,925 A | 12/1999 | Shimizu et al. |
| 6,051,925 A | 4/2000 | Boerner et al. |
| 6,069,440 A | 5/2000 | Shimizu et al. |
| 6,252,254 B1 | 6/2001 | Soules et al. |
| 6,255,670 B1 | 7/2001 | Srivastava et al. |
| 6,273,589 B1 * | 8/2001 | Weber et al. ............... 362/293 |
| 6,278,135 B1 | 8/2001 | Srivastava et al. |
| 6,294,800 B1 | 9/2001 | Duggal et al. |
| 6,608,332 B2 | 8/2003 | Shimizu et al. |
| 6,614,179 B1 | 9/2003 | Shimizu et al. |
| 6,717,353 B1 * | 4/2004 | Mueller et al. ............. 313/501 |
| 7,091,656 B2 * | 8/2006 | Murazaki et al. ........... 313/487 |
| 2001/0001207 A1 | 5/2001 | Shimizu et al. |
| 2003/0080344 A1* | 5/2003 | Yoo .......................... 257/103 |
| 2004/0000868 A1 | 1/2004 | Shimizu et al. |
| 2004/0004437 A1 | 1/2004 | Shimizu et al. |
| 2004/0090180 A1 | 5/2004 | Shimizu et al. |

FOREIGN PATENT DOCUMENTS

| | | |
|---|---|---|
| GB | 1217818 A | 12/1970 |
| JP | 60-141782 A | 7/1985 |
| JP | 10-321943 A | 12/1998 |
| JP | 2000-183408 A | 6/2000 |
| JP | 2002-42525 A | 2/2002 |
| JP | 2002-171000 | 6/2002 |
| JP | 2003-124526 A | 4/2003 |
| WO | WO 01/89000 A1 | 11/2001 |
| WO | WO 01/89001 A2 | 11/2001 |
| WO | WO 01/93342 A1 | 12/2001 |
| WO | WO 02/11214 A1 | 2/2002 |
| WO | WO 02/086978 * | 10/2002 |

* cited by examiner

LIGHT EMITTING DEVICE AND ILLUMINATOR USING THE SAME

This application is a continuation of International application PCT/JP03/01506, filed Feb. 13, 2003.

FIELD OF THE INVENTION

The present invention relates to a light emitting device, more specifically, to a light emitting device having a high color rendering property under any using environment and capable of emitting light with high intensity, which device is obtained by using, in combination, a first light emitter which emits light in the ultraviolet to visible light region, driven by a power source, and as a wavelength conversion material, a second light emitter which emits longwave visible light, absorbing the light in the ultraviolet to visible light region and has a phosphor whose matrix compound contains an emission center ion.

BACKGROUND ART

With a view to generating various colors including white uniformly with a good color rendering property by mixing blue, red and green colors, a light emitting device which radiates colored light from a first light emitter such as LED or LD to a phosphor as a second light emitter to cause color conversion is proposed. For example, in Japanese Patent Publication No. Sho 49-1221, proposed is a method of forming a display by exposing a phosphor $(Y_{3-x-y}Ce_xGd_y M_{5-z}Ga_zO_{12}$ (in which Y represents Y, Lu or La, and M represents Al, Al—In or Al—Sc) to the beam of a laser (first light emitter) which radiates a beam with wavelengths of from 300 to 530 nm and thereby causing its light emission.

In recent days, a white-light emitting device having, as a first light emitter, a gallium nitride (GaN) LED or LD which has attracted attentions as a blue light emitting semiconductor light emitting element and having a high emission efficiency and, as a second light emitter, a variety of phosphors is proposed as a radiation source for an image display device or illuminator by making use of its features such as low power consumption and long life.

For example, described in Japanese Patent Application Laid-Open No. Hei 10-242513 is a light emitting device having, as a first light emitter, a nitride semiconductor LED or LD chip and, as a second light emitter, a yttrium•aluminum•garnet phosphor. In U.S. Pat. No. 6,294,800, a substance having a green-light emitter containing $Ca_8Mg(SiO_4)_4Cl_2:Eu^{2+},Mn^{2+}$, a red light emitting phosphor and a blue light emitting phosphor in combination is disclosed as a substance capable of generating white light when exposed to light in a range of from 330 to 420 nm, that is, typified by light from LED. As an example of the blue light emitting phosphor, $(Sr,Ba,Ca)_5(PO_4)_3Cl:Eu^{2+}$ is mentioned. In U.S. Pat. No. 6,278,135, described is a light emitting device which emits visible light when a phosphor is exposed to ultraviolet light from LED. As the phosphor, $BaMg_2Al_{16}O_{27}:Eu^{2+}$ is given.

The above-described light emitting devices using such phosphors have not emission intensity enough for use as a light emitting source for displays, backlight sources or traffic signals. There is accordingly a demand for further improvement.

When a light emitting device using a first light emitter and a second emitter in combination is employed as a light emitting source for displays, backlight sources and traffic signals, it is required to have high emission intensity and at the same time, to be excellent in a color rendering property which serves as a measure for showing how the appearance of an object exposed to white light from a light emitting device resembles to that exposed to sunlight.

For example, as described in Japanese Patent Application Laid-Open No. Hei 10-242513, when a blue LED or blue laser as a first light emitter is used in combination with a cerium-activated yttrium aluminum garnet phosphor as a second light emitter, a white color is generated by mixing the blue light generated from the first light emitter with a yellow color generated by the second light emitter. When the emission spectrum produced by this combination is compared with the spectrum of sunlight, emission intensity is considerably low in an intermediate region (470 nm to 540 nm) between the blue light emission peak top (near 450 nm) and yellow light emission peak top (near 550 nm), and in a long wavelength region (580 to 700 nm) of a yellow peak. A blue•yellow mixed color system light emitting device has, in its emission spectrum, a low emission intensity portion different from the spectrum of a sunlight, so that its color rendering property is very low.

On the other hand, a white light emitting device using, as a second light emitter, a mixture of blue, green and red phosphors is expected to have an improved color rendering property, because three peaks overlap each other different from the conventional blue•yellow mixing system in which two peaks overlap and a low emission intensity portion between peaks is narrowed. Even this blue•green•red mixed system, however, has a low emission intensity portion when half-width of each emission peak is small so that the problem of a low color rendering property still remains unsolved.

[Patent Document 1]
  Japanese Patent Publication No. Sho 49-1221
[Patent Document 2]
  Japanese Patent Application Laid-Open No. Hei 10-242513
[Patent Document 3]
  U.S. Pat. No. 6,294,800
[Patent Document 4]
  U.S. Pat. No. 6,278,135

With the above-described background art in view, the present invention has been made to develop a light emitting device having a considerably high emission intensity and good color rendering property. An object of the present invention is therefore to provide a double light emitter type light emitting device which can be manufactured easily, has a high emission intensity and has improved color rendering property.

DISCLOSURE OF THE INVENTION

The present inventors have carried out an extensive investigation with a view toward overcoming the above-described problems and completed the present invention. Described specifically, in the case of a conventional phosphor excited by light (mercury emission line) having a wavelength of 254 nm, an increase in the concentration of an activator causes a phenomenon called concentration quenching, which leads to energy loss and lowering in emission intensity. When the concentration of an activator is raised, the emission intensity tends to be smaller.

It has however been found that in the case of a phosphor excited by light with a wavelength ranging from 350 to 415 nm, especially from 390 to 410 nm, moreover, 400 nm, even if the concentration of an activator (Eu) is made greater than that causing concentration quenching upon excitation by light of 254 nm, the emission intensity does not lower but shows a marked increase. It has also been found that a light emitter having a large quantum absorption efficiency or a phosphor having a product of a quantum absorption efficiency and internal quantum efficiency within a specific range emits visible light with high intensity, when exposed to light with the wavelength in a range of about 350 to 415 nm, leading to the completion of the present invention.

The subject matter of the present invention resides in a light emitting device comprising a first light emitter generating light of 350-415 nm and a second light emitter generating visible light by exposure to the light from the first light emitter, wherein the second light emitter comprises a phosphor capable of satisfying any one of the following conditions (i) to (iv):

(i) the phosphor comprises:
(a) a crystal phase whose Eu concentration providing the maximum emission intensity at any one of excitation wavelengths of from 350 to 415 nm is higher than that providing the maximum emission intensity at an excitation wavelength of 254 nm; and
(b) a crystal phase which is activated by Eu having at least 1.1 times the concentration providing the maximum emission intensity at an excitation wavelength of 254 nm and 0.5 to 9 times the concentration providing the maximum emission intensity at an excitation frequency of 400 nm:

(ii) the phosphor comprises a crystal phase having an Eu—Eu mean distance, as calculated from the Eu concentration in a crystal matrix, of 4 Å or greater but not greater than 11 Å:

(iii) the phosphor has a quantum absorption efficiency $\alpha_q$ of 0.8 or greater:

(iv) the phosphor has a product $\alpha_q \cdot \eta_i$ of a quantum absorption efficiency $\alpha_q$ and an internal quantum efficiency $\eta_i$ of 0.55 or greater.

In a preferred aspect of the present invention, there is provided a light emitting device, characterized in that the phosphor contains a crystal phase having a chemical composition represented by any one of the following formulas [1] to [4]:

$$Eu_a Sr_b M^1{}_{5-a-b}(PO_4)_c X_d \qquad [1]$$

(wherein, $M^1$ represents a metal element other than Eu and Sr, X represents a monovalent anionic group other than $PO_4$, a and b stand for numbers satisfying a>0, b≧0, a+b≦5 and at least one of a≧0.1 and b≧3, c stands for a number satisfying 2.7≦c≦3.3, and d stands for a number satisfying 0.9≦d≦1.1):

(wherein, $M^2$ represents at least one element selected from the group consisting of Ba, Sr and Ca, $M^{2'}$ represents a monovalent element or a divalent metal element (except Ba, Sr, Ca and Eu) having a radius of 0.92 Å or greater in the divalent form upon coordination number 6, $M^3$ represents at least one element selected from the group consisting of Mg and Zn, $M^{3'}$ represents a divalent metal element (except Mg and Zn) having a radius less than 0.92 Å in the divalent form upon coordination number 6, $M^4$ represents at least one element selected from the group consisting of Al, Ga and Sc, $M^{4'}$ represents a trivalent metal element (except Al, Ga and Sc), f stands for a number satisfying 0.11≦f≦0.99, e stands for a number satisfying 0.9≦(e+f)≦1.1, g stands for a number satisfying 0.9≦g≦1.1, h stands for a number 9≦h≦11, i stands for a number satisfying 15.3≦i≦18.7, x stands for a number satisfying 0≦x<0.2, y stands for a number satisfying 0≦y<0.2, and z stands for a number satisfying 0≦z<0.2):

$$M^5{}_j Eu_k M^6{}_l M^7{}_m O_n \qquad [3]$$

(wherein, $M^5$ represents a metal element comprising at least one element selected from the group consisting of Ba, Sr and Ca in a total amount of 90 mol % or greater, $M^6$ represents a metal element comprising at least one element selected from the group consisting of Mg and Zn in a total amount of 90 mol % or greater, $M^7$ represents a metal element comprising at least one element selected from the group consisting of Si and Ge in a total amount of 90 mol % or greater, j stands for a number satisfying 2.5≦j≦3.3, k stands for a number satisfying 0.0001≦k≦1.0, l stands for a number satisfying 0.9≦l≦1.1, m stands for a number satisfying 1.8≦m≦2.2 and n stands for a number satisfying 7.2≦n≦8.8):

$$Eu_o M^8{}_p (PO_4)_q (BO_3)_{2-q} Z_r \qquad [4]$$

(wherein, $M^8$ represents a metal element which contains Ca and 80 mol % or greater of which is composed of at least one element selected from the group consisting of Ca and Mg; Z represents an anionic group other than $PO_4{}^{3-}$ and $BO_3{}^{3-}$; o stands for a number satisfying 0.003≦o≦2.1, p stands for a number satisfying 2.7≦(o+p)≦3.3, q stands for a number satisfying 1.2≦q≦2 and r stands for a number satisfying 0≦r≦0.1).

The present inventors have also found that the above-described object can be attained by using, in a light emitting device having a first light emitter emitting light of 350-415 nm and a second light emitter emitting visible light by exposure to the light from the first light emitter, a phosphor comprising a crystal phase having a specific chemical composition as the second light emitter.

More specifically, it has been found that the above-described object, particularly, high emission intensity can be attained by using, as the second light emitter, a crystal phase composed principally of $(Sr,Ba,Ca)_5(PO_4)_3Cl:Eu^{2+}$ and having a higher Sr content and/or a higher Eu content, leading to the completion of the present invention.

Accordingly, in an another aspect of the present invention, there is provided a light emitting device comprising a first light emitter emitting light of 350-415 nm and a second light emitter emitting visible light by exposure to the light from the first light emitter, said second light emitter comprising a phosphor comprising a crystal phase having a chemical composition of the formula [1]:

$$Eu_a Sr_b M^1{}_{5-a-b}(PO_4)_c X_d \qquad [1]$$

(wherein, $M^1$ represents a metal element other than Eu and Sr, X represents a monovalent anionic group other than $PO_4$, a and b stand for numbers satisfying a>0, b≧0, a+b≦5 and at least one of a≧0.1 and b≧3, c stands for a number satisfying 2.7≦c≦3.3, and d stands for a number satisfying 0.9≦d≦1.1).

It has also been found that the above-described object, particularly, high emission intensity can be attained by using, as the second light emitter, a crystal phase composed principally of $(Ba,Sr,Ca)(Mg,Zn)Al_{10}O_{17}:Eu^{2+}$ and having a higher Eu content, leading to the completion of the present invention.

Accordingly, in a further aspect of the present invention, there is provided a light emitting device comprising a first light emitter emitting light of 350-415 nm and a second light emitter emitting visible light by exposure to the light from the first light emitter, said second light emitter comprising a phosphor comprising a crystal phase having a chemical composition of the formula [2]:

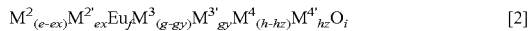

(wherein, $M^2$ represents at least one element selected from the group consisting of Ba, Sr and Ca, $M^{2'}$ represents a monovalent element or a divalent metal element (except Ba, Sr, Ca and Eu) having a radius of 0.92 Å or greater in the divalent form upon coordination number 6, $M^3$ represents at least one element selected from the group consisting of Mg and Zn, $M^{3'}$ represents a divalent metal element (except Mg and Zn) having a radius less than 0.92 Å in the divalent form upon coordination number 6, $M^4$ represents at least one element selected from the group consisting of Al, Ga and Sc, $M^{4'}$ represents a trivalent metal element (except Al, Ga and Sc), f stands for a number satisfying $0.11 \leq f \leq 0.99$, e stands for a number satisfying $0.9 \leq (e+f) \leq 1.1$, g stands for a number satisfying $0.9 \leq g \leq 1.1$, h stands for a number $9 \leq h \leq 11$, i stands for a number satisfying $15.3 \leq i \leq 18.7$, x stands for a number satisfying $0 \leq x \leq 0.2$, y stands for a number satisfying $0 \leq y < 0.2$, and z stands for a number satisfying $0 \leq z < 0.2$).

It has also been found that the above-described object, particularly high emission intensity can be attained by using, as the second light emitter, a crystal phase composed principally of $(Ba,Sr,Ca)_3MgSi_2O_8:Eu$, leading to the completion of the present invention.

Accordingly, in a still further aspect of the present invention, there is provided a light emitting device comprising a first light emitter emitting light of 350-415 nm and a second light emitter emitting visible light by exposure to the light from the first light emitter, said second light emitter comprising a phosphor having a crystal phase having a chemical composition of the formula [3]:

(wherein, $M^5$ represents a metal element comprising at least one element selected from the group consisting of Ba, Sr and Ca in a total amount of 90 mol % or greater, $M^6$ represents a metal element comprising at least one element selected from the group consisting of Mg and Zn in a total amount of 90 mol % or greater, $M^7$ represents a metal element comprising at least one element selected from the group consisting of Si and Ge in a total amount of 90 mol % or greater, j stands for a number satisfying $2.5 \leq j \leq 3.3$, k stands for a number satisfying $0.0001 \leq k \leq 1.0$, l stands for a number satisfying $0.9 \leq l \leq 1.1$, m stands for a number satisfying $1.8 \leq m \leq 2.2$ and n stands for a number satisfying $7.2 \leq n \leq 8.8$).

It has also been found that by using of an orthophosphate of Ca or Ca—Mg as the second light emitter, a lower portion of emission intensity in an intermediate region (470-500 nm) between blue and green colors on an emission spectrum can be narrowed and thereby the object of the present invention to heighten a color rendering property can be attained, leading to the completion of the present invention.

Accordingly, a still further aspect of the present invention is to provide a light emitting device comprising a first light emitter emitting light of 350-415 nm and a second light emitter emitting visible light by exposure to the light from the first light emitter, said second light emitter comprising a phosphor comprising a crystal phase having the chemical composition of the formula [4]:

(wherein, $M^8$ represents a metal element which contains Ca and 80 mol % or greater of which is composed of at least one element selected from the group consisting of Ca and Mg; Z represents an anionic group other than $PO_4^{3-}$ and $BO_3^{3-}$; o stands for a number satisfying $0.003 \leq o \leq 2.1$, p stands for a number satisfying $2.7 \leq (o+p) \leq 3.3$, q stands for a number satisfying $1.2 \leq q \leq 2$ and r stands for a number satisfying $0 \leq r \leq 0.1$).

Figure 1:
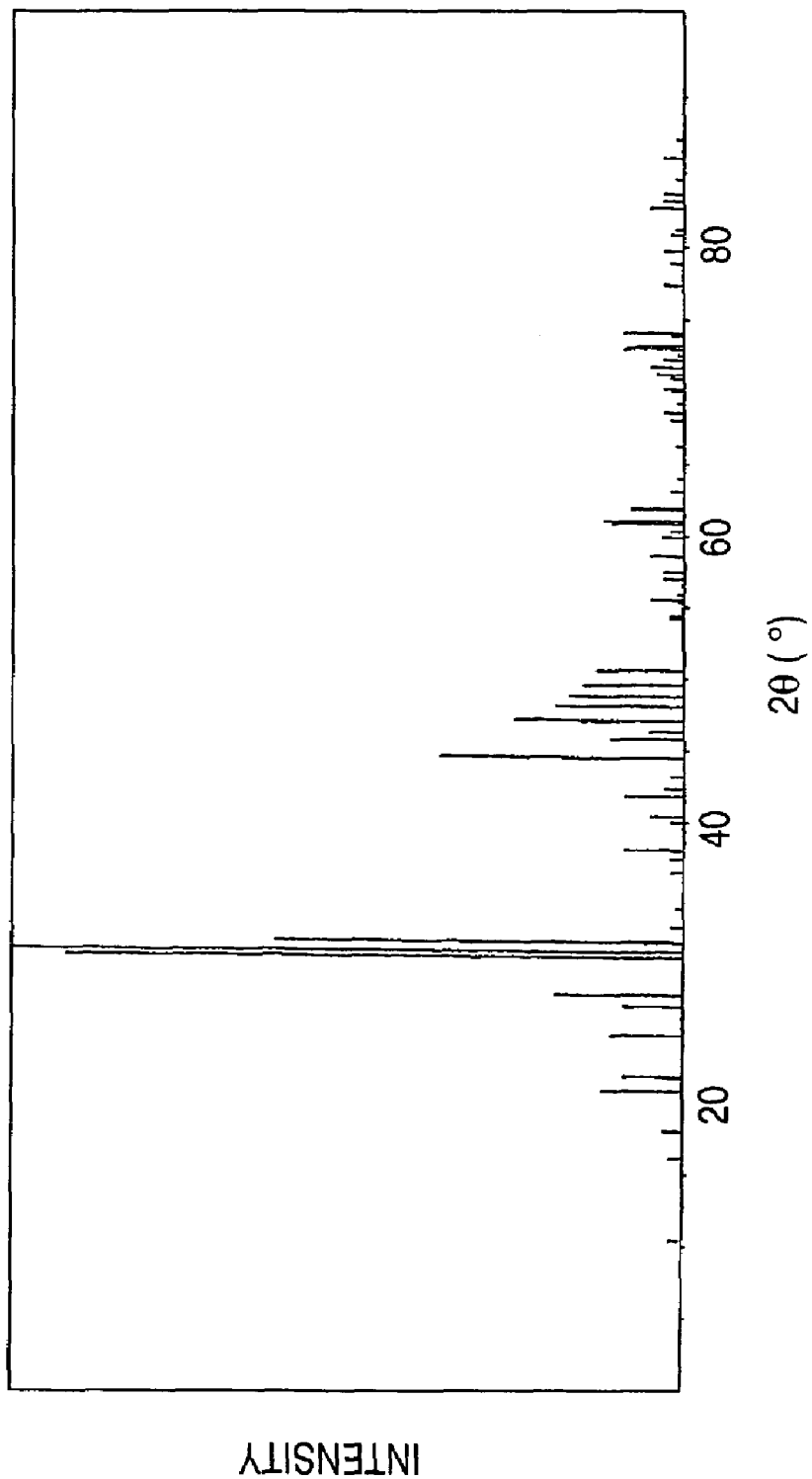
FIG. 1 is an X-ray diffraction pattern (in terms of an X-ray source Cu Kα) of $Sr_5(PO_4)_3Cl$.

In these diagrams, indicated at numeral 1 is a second phosphor, 2 a vertical cavity surface emitting GaN LED, 3 a substrate, 4 a light emitting device, 5 a mount lead, 6 an inner lead, 7 a first light emitter (light emitter of from 350 to 415 nm), 8 a resin portion having the phosphor of the present invention incorporated therein, 9 a conductive wire, and 10 a molding member.

BEST MODE FOR CARRYING OUT THE INVENTION

The present invention provides a light emitting device comprising a first light emitter emitting light of 350-415 nm and a second light emitter containing a phosphor, wherein the phosphor contained in the second light emitter satisfies any one of the following conditions (i) to (iv):

(i) the phosphor comprises:
(a) a crystal phase whose Eu concentration providing the maximum emission intensity at any one of excitation wavelengths of from 350 to 415 nm is higher than that providing the maximum emission intensity at an excitation wavelength of 254 nm; and
(b) a crystal phase which is activated by Eu having at least 1.1 times the concentration providing the maximum emission intensity at an excitation wavelength of 254 nm and 0.5 to 9 times the concentration providing the maximum emission intensity at an excitation frequency of 400 nm:

(ii) the phosphor comprises a crystal phase having an Eu—Eu mean distance, as calculated from the Eu concentration in a crystal matrix, of 4 Å or greater but not greater than 11 Å:

(iii) the phosphor has a quantum absorption efficiency $\alpha_q$ of 0.8 or greater:

(iv) the phosphor has a product $\alpha_q \cdot \eta_i$ of a quantum absorption efficiency $\alpha_q$ and an internal quantum efficiency $\eta_i$ of 0.55 or greater.

The phosphor to be used for the second light emitter in the invention preferably has an Eu-activated crystal phase.

Under the above-described condition (i), both the conditions (a) and (b) must be satisfied simultaneously.

(a) The crystal phase is a crystal phase in which the Eu concentration providing the maximum emission intensity at any excitation wavelength of 350-415 nm, especially 390 to 410 nm, moreover 400 nm is higher than the Eu concentration providing the maximum emission intensity at an excitation wavelength of 254 nm.

This condition must be satisfied because since the excitation at wavelength of 254 nm means excitation by light having a relatively short wavelength, light emission occurs by excitation of a crystal matrix and transmission of the resulting energy to Eu, while since light of 350-415 nm is presumed to pass through the crystal matrix and excite Eu directly, the concentration of Eu must be raised to attain a sufficient absorption efficiency and, in turn, a high emission intensity at an excitation wavelength of 350-415 nm.

(b) The Eu concentration of the crystal phase is at least 1.1 times the Eu concentration providing the maximum emission intensity at an excitation wavelength of 254 nm and is activated by Eu having a concentration of 0.5 to 9 times the Eu concentration providing the maximum emission intensity at 400 nm.

When the Eu concentration is lower than 1.1 times the Eu concentration providing the maximum intensity at an excitation wavelength of 254 nm, sufficient emission intensity is not available because of a low absorption efficiency. In view of emission intensity and the like, the lower limit of the Eu concentration in the crystal phase is preferably at least 0.7 time the Eu concentration providing the maximum emission intensity at 400 nm, while the upper limit is preferably 6 times or less, more preferably 2.5 times or less, especially preferably 2 times or less the Eu concentration providing the maximum emission intensity at 400 nm.

The Eu concentration providing the maximum emission intensity can be determined from a ratio of the number of sites actually substituted by Eu to the number of all the sites substitutable by Eu in the crystal matrix. The ratio is determined in the following manner.

First, the emission intensity of a phosphor sample varied in the EU concentration by 0.1 between 0.1 to 1 provided that the number of all the sites is 1 is measured and a ratio A of Eu providing the maximum emission intensity is determined. Then, the emission intensity of a phosphor sample varied in the Eu concentration by 0.01 within a range of A±0.09 is measured and a ratio B providing the maximum emission intensity is determined. When B falls within a range of from 0.01 to 0.1, the emission intensity of a phosphor sample varied in Eu concentrations by 0.001 within B±0.09 is measured and a ratio C of Eu providing the maximum emission intensity is determined. A ratio of Eu providing the maximum emission intensity which ratio has been determined in the final stage of these operations is regarded as an Eu ratio providing the maximum emission intensity in the present invention and from this value, the Eu concentration providing the maximum emission intensity is determined. Described specifically, when the substitutable molar number of Eu in the crystal matrix is 3, the Eu concentration providing the maximum emission intensity is obtained by multiplying the Eu ratio providing the maximum emission intensity by 3. The ratio of Eu not greater than 0.1 is divided by narrower intervals because when there is a peak of the Eu concentration providing the maximum emission intensity in the vicinity, a change ratio of the emission intensity relative to the Eu concentration tends to be large.

In the above-described condition (ii), the Eu—Eu mean distance calculated from the Eu concentration in the crystal matrix of the crystal phase to be used in the present invention is 4 Å or greater but not greater than 11 Å. In consideration of the emission intensity, the lower limit is preferably 5 Å, more preferably 6.5 Å, while the upper limit is preferably 10.5 Å. The Eu—Eu mean distance is calculated by dividing the number of Eu(s) in the unit lattice of the crystal matrix by the volume of the unit lattice and then raising the reciprocal of the quotient to the ⅓rd power.

When the Eu—Eu mean distance is too short, a phenomenon called concentration quenching occurs, leading to a lowering tendency of the emission intensity. Even if the Eu—Eu mean distance is too long, on the other hand, there is also a lowering tendency of the emission intensity because of deterioration in an absorption efficiency, by the phosphor, of the excited light from the first light emitter.

Under the above-described condition (iii), the quantum absorption efficiency $\alpha_q$ of the phosphor to be used in the present invention is 0.8 or greater. From the viewpoint of emission intensity, the efficiency is preferably 0.9 or greater, more preferably 0.95 or greater. The upper limit of the possible quantum absorption efficiency $\alpha_q$ is substantially 1.

When the phosphor satisfies the above-described condition (iii), the number of photons, among those released from the first light emitter, capable of causing elementary excitation in the phosphor increases, resulting in an increase in the number of photons released from the phosphor per unit time. In short, a light emitting device having a high emission intensity can be obtained. The term "elementary excitation" as used herein means energy excitation owing to a change of the spin state of Eu (which is usually called "emission center excitation"), energy excitation caused by a change in the average number of electrons having an existence probability in the vicinity of each ion (usually called "CT excitation"), and energy excitation owing to band-to-band transition of electrons (usually called "band excitation").

Under the above-described condition (iv), the product $\alpha_q \cdot \eta_i$ of a quantum absorption efficiency $\alpha_q$ and an internal quantum efficiency $\eta_i$, of the phosphor to be used in the present invention is 0.55 or greater, preferably 0.6 or greater, more preferably 0.65 or greater.

Substantially, the possible upper limit of $\alpha_q$ is 1, while the possible upper limit of $\eta_i$ is 0.99. When the phosphor satisfies the above-described condition (iv), $\alpha_q$ and $\eta_i$ usually fall within a range of $0.55 \leq \alpha_q \leq 1$ and $0.55 \leq \eta_i \leq 0.99$, respectively. When the phosphor satisfies the above-described condition (iv), a proportion of the elementary excitations which will cause photon formation among those caused by photons released from the first light emitter increases, resulting in a rise of the number of photons released from the phosphor per unit time. In short, a light emitting device having high emission intensity can be obtained.

An increase in the quantum absorption efficiency $\alpha_q$ itself is expected to heighten luminance because it usually leads to a rise in the number of photons from the excitation light source introduced into a sample. In practice, however, an attempt to increase $\alpha_q$ by heightening the concentration of Eu or the like serving as an emission center did not lead to sufficient emission intensity, because prior to the arrival of photons to the final photoluminescence step, a probability to change the energy to phonon excitation in the sample crystal increased.

It has been found, however, that particularly when 350-415 nm is selected as the wavelength of the excitation light source and a phosphor having a high quantum absorption efficiency $\alpha_q$ is employed as the second light emitter of the light emitting device, the above-described non-photoluminescence step is suppressed and a light emitting device with high emission intensity can be actualized.

It has also been found that use of the second light emitter containing a phosphor high in both $\alpha_q$ and $\alpha_q \cdot \eta_i$ and the first light emitter having a wavelength of 350-415 nm in combination makes it possible to provide a light emitting device having more preferred properties.

A method for determining the quantum absorption efficiency $\alpha_q$ and internal quantum efficiency $\eta_i$ will next be described.

A phosphor sample to be measured which is in the form of powder or the like is filled in a cell while flattening the surface of the sample sufficiently to keep measurement accuracy and the cell is attached to a spectrophotometer equipped with an integrating sphere or the like. The spectrophotometer which can be used here is, for example, "MCPD2000", product of Otsuka Electronics. The integrating sphere is used here in order to count all the photons reflected by the sample and those released from the sample by photoluminescence, in other words, in order to prevent photons from scattering out of the measurement system and slipping out from the measurement data. The spectrophotometer is then installed with a light source for exciting the phosphor.

As this light source, a Xe lamp can be employed for example and its emission peak wavelength is adjusted to 400 nm by using a filter or the like. The sample to be measured is exposed to light from the light source having a wavelength peak adjusted at 400 nm and emission spectrum of the sample is measured. The spectrum thus measured includes, as well as the photons released from the sample by photoluminescence using light from an excitation light source (which will hereinafter be called "excitation light" simply), photons originated from the reflection of an excitation light by the sample. The absorption efficiency $\alpha_q$ is a quotient obtained by dividing the number of photons $N_{abs}$ of the excitation light absorbed by the sample by the total number of photons N of the excitation light. The latter total number N of photons of the excitation light is determined in the following manner. First, a substance having substantially 100% of reflectance R to the excitation light, for example, a reflector such as "Spectralon" (product of Labsphere having 98% of reflectance to the excitation light of 400 nm) is attached to the spectrophotometer as an object to be measured and its reflection spectrum $I_{ref}(\lambda)$ is measured. The numeral determined from this reflection spectrum $I_{ref}(\lambda)$ in accordance with the (Formula 1) is in proportion to N.

$$\frac{1}{R}\int \lambda \cdot I_{ref}(\lambda)d\lambda \qquad \text{(Formula 1)}$$

Figure 16:
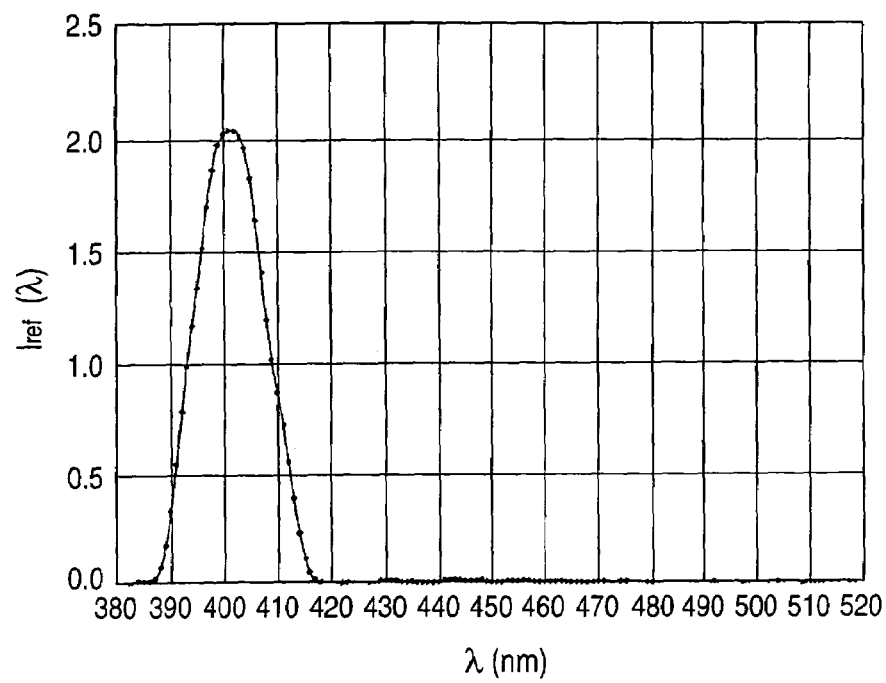
FIG. 16 is a spectrum $I_{ref}(\lambda)$ measured after a reflector is attached to a spectrophotometer.

In the above-described formula, the integral interval may be an interval in which $I_{ref}(\lambda)$ has a substantially significant value. One example of $I_{ref}(\lambda)$ is shown in FIG. 16 and in this case, a range of from 380 nm to 420 nm is sufficient as the interval. The former $N_{abs}$ is in proportion to the amount determined in accordance with the (Formula 2).

$$\frac{1}{R}\int \lambda \cdot I_{ref}(\lambda)d\lambda - \int \lambda \cdot I(\lambda)d\lambda \qquad \text{(Formula 2)}$$

In the above-descried formula, $I(\lambda)$ is a reflection spectrum when a sample is attached, to measure its $\alpha_q$. The integral range of (Formula 2) is made equal to that defined for (Formula 1). By thus defining the integral range, the second term of (Formula 2) corresponds to the number of photons generated by the reflection of excitation light by the sample, that is, the number of photons obtained by subtracting, from the total number of photons generated from the sample, photons generated by the excitation light through photoluminescence. In practice, the spectrum is obtained as digital data divided by some finite bandwidths relating to $\lambda$ so that the integral of (Formula 1) and (Formula 2) is determined by a finite sum based on the bandwidths. This leads to the following equation:

$\alpha_q = N_{abs}/N = $(Formula 2)/(Formula 1)

A method for determining the internal quantum efficiency $\eta_i$ will next be described. The internal quantum efficiency $\eta_i$ is a quotient obtained by dividing the number of photons $N_{PL}$ generated by photoluminescence by the number of photons $N_{abs}$ absorbed by the sample.

The $N_{PL}$ is in proportion to an amount determined by (Formula 3):

$$\int \lambda \cdot I(\lambda)d\lambda \qquad \text{(Formula 3)}$$

Figure 17:
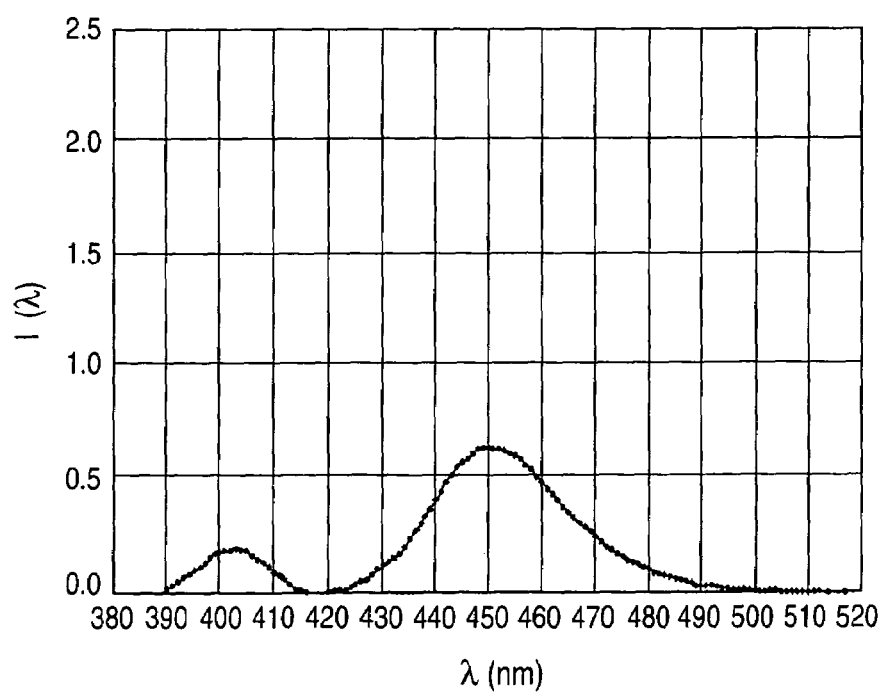
FIG. 17 is a spectrum $I(\lambda)$ measured after a sample whose quantum absorption efficiency $\alpha_q$ and internal quantum efficiency $\eta_i$ are to be measured is attached to a spectrophotometer.

In this formula, an integral interval is limited to a wavelength region of photons generated from the sample by photoluminescence, whereby contribution of the photons reflected by the sample is removed from I ($\lambda$). More specifically, concerning the lower limit of the integral of (Formula 3), the upper end of the integral of (Formula 1) is omitted and a region appropriate for including the spectrum derived from photoluminescence is used as the upper end. FIG. 17 is an example of $I(\lambda)$. In this case, the integral region for (Formula 3) may be from 420 nm to 520 nm. In such a manner, $\eta_i$ can be determined from the following equation $\eta_i = $(Formula 3)/(Formula 2).

Integration of spectrum obtained as digital data can be performed in a similar manner to that employed for the determination of $\alpha_q$.

In the present invention, either a divalent Eu or trivalent Eu can be used as an activator Eu, but they are different in the transition process of light emission. The divalent Eu tends to be excited by ultraviolet light having a longer wavelength so that divalent Eu is preferred. In the present invention, the term "Eu concentration" means the Eu concentration determined by the number of divalent Eu(s).

When a phosphor contains both the divalent Eu(s) and trivalent Eu(s), the Eu concentration is determined by the number of divalent Eu(s).

In the light emitting device of the present invention, the second light emitter is required to contain a phosphor capable of satisfying any one of the above-described conditions (i) to (iv). Incorporation of a phosphor capable of satisfying the conditions 1 and 3 is however particularly preferred, because it enables manufacture of a light emitting device having a higher emission intensity.

Although no particular limitation is imposed on the materials constituting the phosphor insofar as the phosphor satisfies any one of the above-described conditions, the materials having a crystal phase are preferred. It is more preferred to select the materials from those having a crystal phase having the chemical composition of the below-described formulas [1] to [4] (which may be called "crystal phases of the formulas [1] to [4], simply). The desired phosphor tends to be available by selecting the preferred crystal phase from those of the formulas [1] to [4]. The phosphor may comprise, as a component other than the crystal phase, a light scattering substance and the like within an extent not impairing its performance.

The phosphor contains the crystal phase usually in an amount of 10 wt. % or greater, preferably 50 wt. % or greater, more preferably 80 wt. % or greater.

In a light emitting device having a first light emitter emitting light of 350-415 nm and a second light emitter emitting visible light by exposure to the light from the first light emitter, the light emitting device of the present invention having the second light emitter containing a phosphor having any one of the crystal phases of the formulas [1] to [4] is novel and has emission intensity superior to that of the conventional light emitting device.

A description will next be made of the crystal phases represented by the formulas [1] to [4]:

<Mode 1>

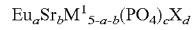
[1]

$M^1$s each represents a metal element other than Eu and Sr. In view of emission intensity and the like, it is preferred to adjust the total amount of Ba, Mg, Ca, Zn and Mn in $M^1$s to 70 mol % or greater. It is more preferred to adjust the total amount of Ba, Mg and Ca in $M^1$s to 70 mol % or greater. It is still more preferred to adjust the total amount of Ba, Mg and Ca in $M^1$s to 90 mol % or greater. It is still more preferred that $M^1$s are all composed of at least one element selected from the group consisting of Ba, Mg, Ca, Zn and Mn and it is most preferred that $M^1$s are all composed of at least one element selected from the group consisting of Ba, Mg and Ca.

When a metal element other than the above-described ones is incorporated as $M^1$, it is desired to add a metal element having an equal valence number to Sr or these 5 metal elements (Ba, Mg, Ca, Zn and Mn), that is, divalent metal element to facilitate the maintenance of the crystal structure. A small amount of a monovalent, trivalent, tetravalent, pentavalent or hexavalent metal element may be introduced for the purpose of accelerating crystallization of a complex oxide caused by the diffusion, in solid, of the divalent metal element and emission center $Eu^{2+}$ upon sintering. In one example, a portion of $Sr^{2+}$ in an $Sr_5(PO_4)_3$Cl:Eu phosphor can be substituted with an equimolar amount of $Li^+$ and $Ga^{3+}$ while maintaining charge compensation effects. It may also possible to substitute with a metal element which will serve as a sensitizer.

X represents a monovalent anionic group other than $PO_4$. Examples of such an anionic group include halogen ions and hydroxyl ion ($OH^-$). The halogen ions include $Cl^-$, $F^-$ and $Br^-$, of which $Cl^-$ is preferred. In view of emission intensity and the like, preferably 50 mol % or greater, more preferably 70 mol % or greater, especially preferably 90 mol % or greater of X is composed of halogen ions.

When 50 mol % or greater of X is composed of halogen ions, the remaining anionic groups may contain a hydroxyl ion and the like. In the most preferred mode, 50 mol % or greater, especially 70 mol % or greater, still more preferably 90 mol % or greater of X is composed of Cl$^-$. In this case, other halogen ions and a hydroxyl ion can be used as the remaining group.

In the formula [1], a molar ratio a of Eu is a number greater than 0 and satisfies a+b≦5. When a+b=5, the crystal phase of the formula [1] does not contain M$^1$. More specifically, a usually satisfies 0<a<5, usually a≧0.0001, preferably a≧0.001, more preferably a≧0.005. In view of emission intensity and the like, a usually satisfies a≧0.1, preferably a≧0.2, more preferably a>0.2, still more preferably a≧0.3, especially preferably a≧0.4, still more preferably a≧0.45.

When the molar ratio a of Eu$^{2+}$ as an emission center ion is too small, the emission intensity tends to lower. When it is too large, on the other hand, the emission intensity also tends to lower owing to a phenomenon called concentration quenching. Therefore, a usually satisfies a≦4.8, preferably a≦3, more preferably a≦2.5, especially preferably a≦2, most preferably a≦1.5.

In addition, use of a satisfying a>0.2, moreover a≧0.3 is especially preferred in order to obtain a light emitting device composed of a second light emitter having a phosphor satisfying the above-described condition 3 and/or 4.

In the formula [1], the molar ratio b of Sr is 0 or greater, preferably greater than 0 and satisfies a+b≦5. More specifically, b satisfies 0≦b<5, preferably 0<b<5. Usually b is adjusted to fall within the following range: b≧0.01, preferably b≧0.1, more preferably b≧0.2. In view of emission intensity and the like, it is most preferred to adjust b to fall within the following range: b≧3, especially b≧4. In the crystal phase composed principally of (Sr,Ba,Ca)$_5$(PO$_4$)$_3$Cl: Eu$^{2+}$, the molar ratio of Sr is not narrowly limited. In the present invention, adoption of a relatively large number with b<5 as an upper limit makes it possible to attain a remarkably high emission intensity. When the molar ratio of Sr is smaller, in other words, b stands for a smaller number, especially 0, the raw material cost can be reduced. A smaller molar ratio of Sr is therefore preferred. In particular, adjustment of the molar ratio of Ca to 50 mol % or greater while decreasing (b) is preferred. In this case, a relatively high emission intensity can also be attained.

In the formula [1], sufficient emission intensity can be attained by satisfying either one of a≧0.1 and b≧3, in addition to the above-described conditions for a and b. Accordingly, it is not always necessary to satisfy both of these conditions simultaneously if one of a and b satisfies the above-described equation.

Preferred examples of the combination of a and b include (1) a≧0.1 and b≧0.01, (2) a≧0.1 and b≧0.1, (3) a≧0.1 and b≧0.2, (4) a≧0.2 and b>0.01, (5) a≧0.2 and b≧0.1, (6) 0.0001≦a and b≧3, (7) 0.001≦a and b≧3, (8) 0.005≦a and b≧3, (9) 0.0001≦a and b≧4, (10) 0.001≦a and b≧4, and (11) 0.005≦a and b≧4.

In the present invention, it is especially preferred to satisfy both a≧0.1 and b≧3 in order to attain higher emission intensity. Example of the combination of a and b preferred from this viewpoint include (1) a≧0.1 and b≧3, (2) a≧0.1 and b≧4, (3) a≧0.2 and b≧3, (4) a≧0.2 and b≧4. The emission intensity can be increased by satisfying both a>0.2 and b≧3.

Examples of the combination of a and b preferred in this viewpoint include (1) a>0.2 and b≧3, (2) a>0.2 and b≧4, (3) a≧0.3 and b≧3, (4) a≧0.3 and b≧4, (5) a≧0.4 and b≧3, (6) a≧0.4 and b≧4, (7) a≧0.45 and b≧3, and (8) a≧0.45 and b≧4.

The c is a number satisfying c≧2.7, preferably c≧2.8, more preferably c≧2.9 and c≦3.3, preferably c≦3.2, more preferably c≦3.1. When these upper and lower limits are combined, c is preferably 2.7≦c≦3.3, more preferably 2.8≦c≦3.2, more preferably 2.9≦c≦3.1.

The d stands for a number satisfying d≧0.9, preferably d≧0.93, more preferably d≧0.95 and d≦1.1, preferably d≦1.07, more preferably d≦1.05. When these upper and lower limits are combined, d is 0.9≦d≦1.1, preferably 0.93≦d≦1.07, more preferably 0.95≦d≦1.05.

In the principal crystal of the formula [1]: Eu$_a$Sr$_b$M$^1_{5-a-b}$(PO$_4$)$_c$X$_d$, generation of some crystal defects has little influence on the intended fluorescence performance of the present invention so that it can be used within the above-described ranges of the inequalities for a, b, c and d.

In general, A$_5$(PO$_4$)$_3$Cl (A representing an alkaline earth metal) has a hexagonal crystal structure and its space group is P6$_3$/m.

The crystal phase of the formula [1] has a crystal structure of A$_5$(PO$_4$)$_3$Cl as described above. A typical X-ray diffraction pattern (from powder X-ray diffraction data base) of Sr$_5$(PO$_4$)$_3$Cl is shown in FIG. 1. The Sr site of Sr$_5$(PO$_4$)$_3$Cl can be substituted with a divalent metal such as Ba, Mg, Ca, Zn or Mn within a broad composition range. It can also be substituted with a metal having a different valence such as Na or La if its amount is small. Its Cl site can be substituted with an anionic species such as F, Br or OH without changing the structure. The crystal phase in the present invention corresponds to that having as a matrix a substituted product using Sr as a cationic species and the cation site substituted with Eu$^{2+}$ as an activator.

The phosphor containing the crystal phase of the formula [1] is excited by light of 350-415 nm from the first light emitter and generates visible light having very high emission intensity.

In particular, the second light emitter containing the phosphor satisfying the above-described conditions (iii) and/or (iv) tends to be available by selecting a preferable phosphor, as that to be incorporated in the second light emitter, from the phosphors of the formula [1].

<Mode 2>

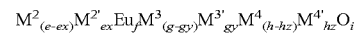

$$M^2_{(e-ex)}M^{2'}_{ex}Eu_fM^3_{(g-gy)}M^{3'}_{gy}M^4_{(h-hz)}M^{4'}_{hz}O_i \qquad [2]$$

M$^2$ represents at least one element selected from the group consisting of Ba, Sr and Ca.

The cation M$^{2'}$ substituted at the site M$^2$ is a monovalent metal element or a divalent one having a relatively large ion radius. It represents a monovalent metal element or a divalent metal element (except Ba, Sr, Ca and Eu) having a radius of 0.92 Å or greater in the divalent form upon coordination number 6. Specific examples include K, Sm, Pb and Na. The coordination number of oxygen is 6 in M$^2$ and M$^3$ sites, so that in the present invention, M$^{2'}$ and M$^{3'}$ are distinguished therefrom by the cationic radius of the divalent metal element upon coordination number 6.

In view of emission intensity and the like, a ratio of the total amount of Ba, Sr and Ca in the sum of M$^2$ and M$^{2'}$ is preferably adjusted to 80 mol % or greater. It is more preferred that a ratio of Ba in the sum of M$^2$ and M$^{2'}$ is 30 mol % or greater and at the same time, a ratio of Sr or Ca in the sum of M$^2$ and M$^{2'}$ is 20 mol % or greater.

M$^3$ represents at least one element selected from the group consisting of Mg and Zn.

The cation M$^{3'}$ substituted at the site M$^3$ is a relatively small divalent cation. It represents a divalent metal element (except Mg and Zn) having a radius less than 0.92 Å in the divalent form upon coordination number 6. Specific examples include Zn, Mn, V and Zr.

In view of emission intensity and the like, a ratio of the total amount of Mg and Zn in the sum of $M^3$ and $M^{3'}$ is preferably adjusted to 80 mol % or greater.

$M^4$ represents at least one element selected from the group consisting of Al, Ga and Sc, preferably Al.

$M^{4'}$ represents a trivalent metal element (except Al, Ga and Sc) and specific examples of it include Y, In and Lu.

In view of emission intensity and the like, a ratio of Al in the sum of elements $M^4$ and $M^{4'}$ is preferably adjusted to 80 mol % or greater.

For the purpose of accelerating crystallization of a complex oxide caused by the diffusion, in solid, of the divalent or trivalent metal element and emission center $Eu^{2+}$ upon sintering, a monovalent, trivalent, tetravalent, pentavalent or hexavalent metal element as $M^{2'}$ and $M^{3'}$ and a monovalent, divalent, tetravalent, pentavalent or hexavalent metal element as $M^{4'}$ may be introduced in a small amount within an extent not impairing the advantage of the present invention.

In one example, a portion of $Ba^{2+}$ in a $BaMgAl_{10}O_{17}$:Eu phosphor can be substituted with an equimolar amount of $Li^+$ and $Ga^{3+}$ while maintaining charge compensation effects. In order to control emission wavelength or emission intensity, it may be substituted with a metal element such as Mn which will serve as a sensitizer.

The molar ratio f of Eu in the formula [2] is a number satisfying $f \geq 0.11$, preferably $f \geq 0.15$ and $f \leq 0.99$, preferably $f \leq 0.85$. When the molar ratio f of $Eu^{2+}$ which is an emission center ion is too small, the emission intensity tends to become smaller. When f is too large, on the other hand, the emission intensity also tends to decrease owing to a phenomenon called concentration quenching.

The e stands for a number satisfying $(e+f) \geq 0.9$, preferably $(e+f) \geq 0.95$, more preferably $(e+f) \geq 0.98$ and $(e+f) \leq 1.1$, preferably $(e+f) \leq 1.05$, more preferably $(e+f) \leq 1.02$.

The g stands for a number satisfying $g \geq 0.9$ and $g \leq 1.1$.
The h stands for a number satisfying $h \geq 9$ and $h \leq 11$.
The i stands for a number satisfying $i \geq 15.3$ and $i \leq 18.7$.

The x stands for a number satisfying $x \geq 0$ and $x<0.2$, preferably $x \leq 0.1$, more preferably $x \leq 0.05$, of which $x=0$ is especially preferred.

The y stands for a number satisfying $y \geq 0$ and $y<0.2$, preferably $y \leq 0.1$, more preferably $y \leq 0.05$, of which $y=0$ is especially preferred. It is most preferred that x and y each stands for 0.

The z stands for a number satisfying $z \geq 0$ and $z<0.2$, preferably $z \leq 0.1$, more preferably $z \leq 0.05$, of which $z=0$ is especially preferred.

In the principal crystal $M^2_e Eu_f M^3_g M^4_h O_i$ of the above-described formula [2], existence of some cation deficiencies or oxygen deficiencies has less influence on the intended fluorescence performance of the present invention so that it can be used within the above-described ranges of the inequalities for (e+f), g, h and i.

In general, the crystal of $BaMgAl_{10}O_{17}$ has a hexagonal system and its space group is $P6_3/mmc$.

Figure 20:
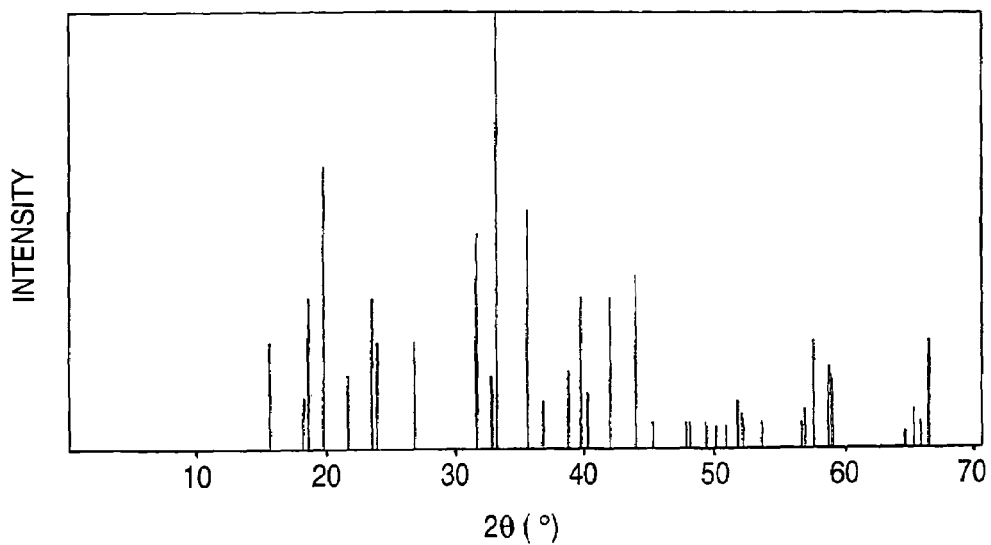
FIG. 20 is an X-ray diffraction pattern (in terms of X-ray source Cu Kα) of $BaMgAl_{10}O_{17}$.

The crystal structure represented by the formula [2] is usually the above-described $BaMgAl_{10}O_{17}$ structure. In FIG. 20, a typical X-ray diffraction pattern (from Powder X-ray Diffraction Data Base) of $BaMgAl_{10}O_{17}$. In (Ba,Sr,Ca) (Mg,Zn)$Al_{10}O_{17}$, $Ba^{2+}$, $Sr_{2+}$, or $Ca^{2+}$ is located in an intermediate layer sandwiched between spinel blocks made of $Al^{3+}$ and $O^{2-}$, while $Mg^{2+}$ or $Zn^{2+}$ is located at a substituted position of the $Al^{3+}$. The coordination number of oxygen around $Ba^{2+}$ site and $Mg^{2+}$ site is six. A divalent metal element such as Ba, Sr and Ca can form a solid solution with the $Ba^{2+}$ site within a broad composition range. The $Ba^{2+}$ site may be substituted with a divalent metal element other than B, Sr or Ca in such a manner if its amount is small, because it does not adversely affect the emission intensity.

A trivalent metal such as Ga and B can form a solid solution with the $Al^{3+}$ site within a specific composition range. The $Al^{3+}$ site can be substituted with a trivalent metal such as Ga or B in such a manner if its amount is small, because it does not adversely affect the emission intensity.

In the present invention, the crystal phase corresponds to a substance having such a substituted product as a matrix and $Eu^{2+}$ as an activator and moreover, having a markedly increased $Eu^{2+}$ amount.

The phosphor containing the crystal phase of the formula [2] is excited by light of 350-415 nm from the first light emitter and generates visible light with remarkably high emission intensity.

The second light emitter containing the phosphor with the crystal phase satisfying the above-described conditions (i) and/or (ii) tends to be available by selecting the crystal phase, as a crystal phase to be incorporated in the second light emitter, from the crystal phases of the formula [2].

Described specifically, the crystal phase of $BaMgAl_{10}O_{17}$ is known and it is known that its Ba site can be substituted with the other divalent metal element such as Ca, Sr or $Eu^{2+}$ and its Mg site can be substituted with the other divalent metal element such as Zn. A substance having $BaMg_2Al_{16}O_{27}$ as a chemical composition and substituted with $Eu^{2+}$ is also known. A phosphor having a crystal phase of $Ba_{1-x}Eu_xMgAl_{10}O_{17}$, for example, the former one and that having a crystal phase $Ba_{1-x}Eu_xMg_2Al_{16}O_{27}$, for example, the latter one can be used as a blue light emitting phosphor of a fluorescent lamp and it makes use of light emission, excited by short ultraviolet rays at Hg resonance line at 254 nm. When the molar ratio of Eu to Mg is 0.1 or less, the emission intensity of these crystal phases is very high. {For example, a description on $Ba_{1-x}Eu_xMg_2Al_{16}O_{27}$ can be found on page 418 of Phosphor Handbook (Ed. by S. Shionoya and W. M. Yen, CRC Press, 1999), while a suggestion on $Ba_{1-x}Eu_xMgAl_{10}O_{17}$ can be found on page 55 of the dissertation "Development of phosphor by using aluminates of an alkaline earth metal" (written by Takayuki Hisamune, 2000)}. Concerning a $Ba_{1-x}Eu_xMgAl_{10}O_{17}$ single phase system which can be manufactured by an easy process, very intense blue light emission cannot be obtained even by exposing such a commercially available $Ba_{0.9}Eu_{0.1}MgAl_{10}O_{17}$ system to light of 350-415 nm from a GaN LED.

Finding that when the Eu concentration of $Ba_{1-x}Eu_xMgAl_{10}O_{17}$ is adjusted to exceed 0.1, different from the Eu molar ratio=0.05 to 0.1 which is an Eu concentration adopted for a fluorescent lamp, very intense blue light emission is available upon light excitation at 350-415 nm, the present inventors have completed the present invention. The present invention is based on the finding that compared with blue light emitting $BaMgAl_{10}O_{17}$:Eu having Eu at a molar ratio of from 0.05 to 0.1 or yellow light emitting $Y_3Al_5O_{12}$:Ce, the above-described phosphor displays a particularly high emission intensity by light excitation at around 400 nm.

<Mode 3>

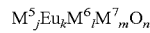 [3]

$M^5$s represent metal elements comprising at least one element selected from the group consisting of Ba, Sr and Ca in a total amount of 90 mol % or greater, preferably 95 mol % or greater. It is preferred that all of $M^5$s are at least one element selected from the group consisting of Ba, Sr and Ca. As a result, higher emission intensity can be attained.

The crystal phase preferably comprises Ba and/or Sr as $M^5$, especially preferably Ba. When Ba is incorporated, the molar ratio of Ba to Sr is preferably 0.05 or greater, because it facilitates control of emission wavelength and brings higher emission intensity. In this case, the molar ratio of Sr may be 0 (which means an infinite molar ratio of Ba), but the molar ratio of Ba is preferably adjusted to not greater than 100 without omitting Sr.

$M^6$ represents a metal element comprising at least one element selected from the group consisting of Mg and Zn in a total amount of 90 mol % or greater, preferably 95 mol % or greater. It is preferred that all the elements of $M^6$s are at least one element selected from the group consisting of Mg and Zn. As a result, higher emission intensity can be attained. The crystal phase preferably contains Mg as $M^6$.

$M^7$ represents a metal element comprising at least one element selected from the group consisting of Si and Ge in a total amount of 90 mol % or greater, preferably 95 mol % or greater, more preferably 97 mol % or greater. It is preferred that all the elements of $M^7$s are at least one element selected from the group consisting of Si and Ge. As a result, higher emission intensity can be attained. The crystal phase preferably comprises Si as $M^7$.

As a metal element in $M^5$, $M^6$ and $M^7$, metal elements other than the above-described ones may be incorporated in the crystal with 10 mol %, preferably 5 mo %, more preferably 3 mol % as an upper limit. Although no particular limitation is imposed on the metal element, incorporation of divalent, divalent and tetravalent metal elements, that is, elements having a valence number equal to Ba, Mg and Si, respectively is preferred because it facilitates maintenance of the crystal structure. A small amount of monovalent, trivalent, pentavalent or hexavalent metal element may be introduced in the crystal with a view to accelerating crystallization of a complex oxide caused by the diffusion, in solid, of divalent and tetravalent metal elements and $Eu^{2+}$ serving as an emission center upon sintering. For example, it is possible to substitute a portion of $Ba^{2+}$ or $Mg^{2+}$ in the phosphor of $Ba_3MgSi_2O_8$:Eu with an equimolar amount of $Li^+$ and $Ga^{2+}$ while maintaining a charge compensation effect.

The j stands for a number satisfying $j \geqq 2.5$, preferably $j \geqq 2.7$, more preferably $j \geqq 2.8$, still more preferably $j \geqq 2.9$ and $j \leqq 3.3$, preferably $j \leqq 3.2$, more preferably $j \leqq 3.1$.

The molar ratio k of Eu in the formula [3] stands for a number satisfying $k \geqq 0.0001$, preferably $k \geqq 0.001$, more preferably $k \geqq 0.003$ and $k \leqq 1.0$, preferably $k \leqq 0.5$, more preferably $k \leqq 0.3$, still more preferably $k \leqq 0.15$, especially preferably $k \leqq 0.1$. When the molar ratio k of $Eu^{2+}$ which is an emission center ion is too small, the emission intensity tends to decrease.

When the molar ratio k is too large, on the other hand, there is also a tendency of the emission intensity decreasing owing to a phenomenon called concentration quenching. The j and k preferably satisfy $2.7 \leqq j+k \leqq 3.3$ in order to obtain a crystal phase with less crystal defects and have higher emission intensity.

The l stands for a number satisfying $l \geqq 0.9$, preferably $l \geqq 0.93$, more preferably $l \geqq 0.95$ and $l \leqq 1.1$, preferably $l \leqq 1.07$, more preferably $l \leqq 1.05$.

The m stands for a number satisfying $m \geqq 1.8$, preferably $m \geqq 1.85$, more preferably $m \geqq 1.9$ and $m \leqq 2.2$, preferably $m \leqq 2.15$, more preferably $m \leqq 2.1$.

The n stands for a number satisfying $n \geqq 7.2$, preferably $n \geqq 7.4$, more preferably $n \geqq 7.6$, most preferably $n \geqq 7.8$ and $n \leqq 8.8$, preferably $n \leqq 8.6$, more preferably $n \leqq 8.4$, most preferably $n \leqq 8.2$.

The j+k, l, m and n are usually 3, 1, 2 and 8, respectively. They however fall within a permissible range embracing these values, because appearance of some cation deficiencies, oxygen deficiencies or interstitial atoms has little influence on the fluorescence performance.

The typical crystal structure of the phosphor represented by the formula [3] is a $Ba_3MgSi_2O_8$, $Sr_3MgSi_2O_8$ or $Ca_3MgSi_2O_8$ structure. The $Ca_3MgSi_2O_8$ structure is usually called merwinite. The $Ba_3MgSi_2O_8$ and $Sr_3MgSi_2O_8$ structures are not strictly merwinite but are presumed to be analogous thereto. The $Ba_3MgSi_2O_8$ and $Sr_3MgSi_2O_8$ structures have an orthorhombic system and their lattice constants are about: a=5.5 Å, b=9.8 Å and c=7.6 Å, and a=5.4 Å, b=9.6 Å and c=7.2 Å. The $Ca_3MgSi_2O_8$ has a monoclinic system, has a space group of P21/a, and a lattice constant of: a=13.254 Å, b=5.293 Å and c=9.328 Å.

Figure 24:
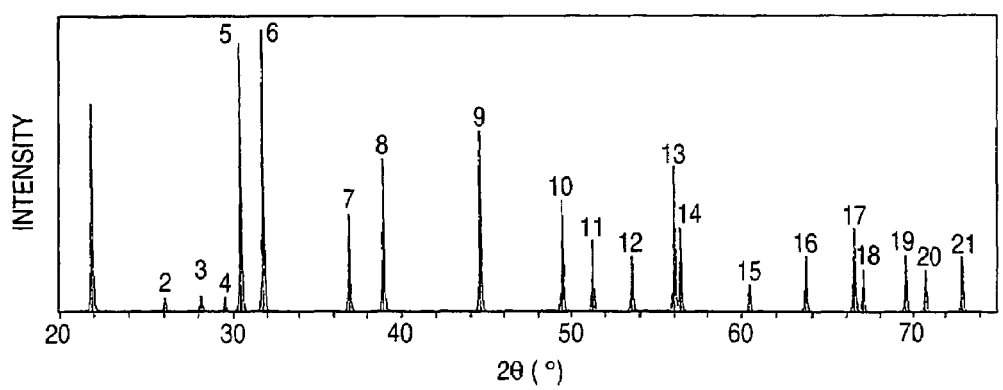
FIG. 24 is an X-ray diffraction pattern (in terms of X-ray source Cu Kα) of $Ba_3MgSi_2O_8$.
Figure 25:
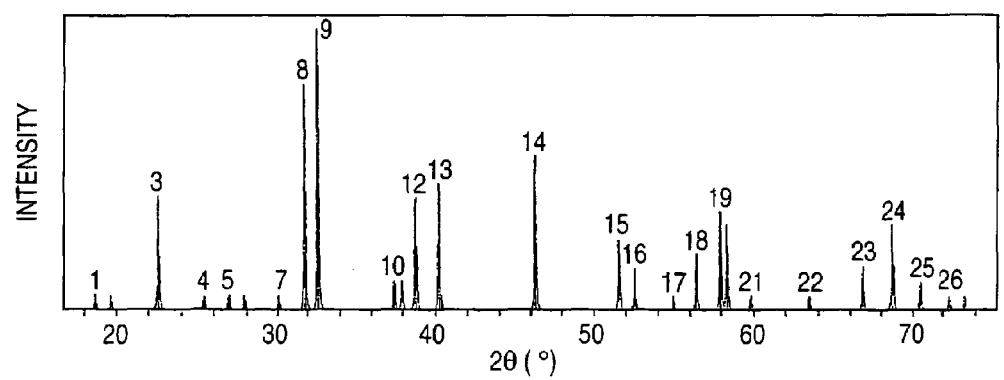
FIG. 25 is an X-ray diffraction pattern (in terms of X-ray source Cu Kα) of $Sr_3MgSi_2O_8$.
Figure 26:
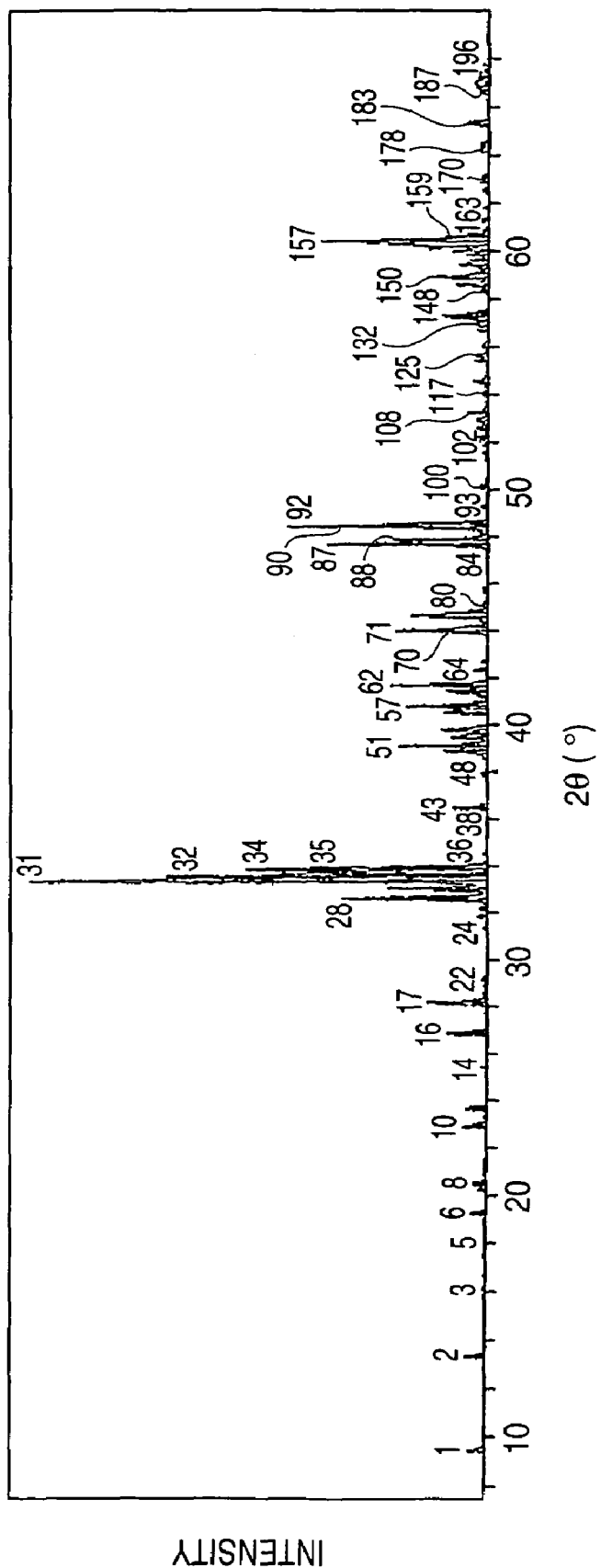
FIG. 26 illustrates an X-ray diffraction pattern (in terms of X-ray source Cu Kα) of $Ca_3MgSi_2O_8$.

In FIGS. 24, 25 and 26, X-ray diffraction patterns of $Ba_3MgSi_2O_8$, $Sr_3MgSi_2O_8$ and $Ca_3MgSi_2O_8$ (from Powder X-ray Diffraction Data base) are shown. Judging from that in these crystal structures, a composition range of divalent metals including Ba, Sr and Ca permitting the formation of a solid solution is wide, they have a similar structure. The crystal phase of the phosphor represented by the formula [3] corresponds to that obtained by substituting a substance having a $Ba_3MgSi_2O_8$, $Sr_3MgSi_2O_8$ or $Ca_3MgSi_2O_8$ structure with $Eu^{2+}$ as an activator.

The crystal phase such as $Ba_3MgSi_2O_8$ or $Sr_3MgSi_2O_8$ is known and it is also known that Ba or Sr can be substituted with other divalent metal element such as $Eu^{2+}$. The present invention is based on the finding that when a phosphor containing a crystal phase having the chemical composition of the formula [3] including the chemical composition such as $Ba_{3-x}Eu_xMgSi_2O_8$ or $Sr_{3-x}Eu_xMgSi_2O_8$ is exposed to light of 350-415 nm from the first light emitter, it emits light having remarkably higher intensity than the other phosphor. The above-described phosphor generates light having overwhelmingly high intensity than blue light emitting $BaMgAl_{10}O_{17}$:Eu or yellow light emitting $Y_3Al_5O_{12}$:Ce.

The phosphor containing the crystal phase of the formula [3] is excited by light of 350-415 nm from the first light emitter and generates visible light having remarkably high emission intensity.

<Mode 4>

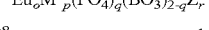

$$Eu_oM^8_p(PO_4)_q(BO_3)_{2-q}Z_r \qquad [4]$$

$M^8$ represents a metal element which has at least one valence but is other than Eu, P and B. From the viewpoints of color rendering property, emission intensity and the like, it represents a metal element which contains Ca and at the same time, contains Ca and Mg in a total amount of 80 mol % or greater. A proportion of Ca in the total amount of Ca and Mg contained in $M^8$ is preferably 40 mol % or greater. It is more preferred that $M^8$ is at least one element selected from the group consisting of Ca and Mg and contains at least 40 mol % of Ca.

When a metal element other than Ca and Mg is added as $M^8$ to the crystal, no particular limitation is imposed on the kind of the metal element. Addition of a metal element having the same valence with Ca and Mg, that is, a divalent metal element such as Sr, Zn, Ba, Pb or Sn, preferably Sr, Zn or Ba is however desired, because it facilitates the maintenance of the crystal structure. A small amount of a monovalent, trivalent, tetravalent, pentavalent or hexavalent metal element may be introduced as a metal element in M for the purpose of accelerating crystallization of a complex oxide caused by the diffusion, in solid, of the divalent metal element and emission center $Eu^{2+}$ upon sintering.

In one example, a portion of $Ca^{2+}$ in an $Eu_{0.15}Ca_{2.85}(PO_4)_2$ phosphor can be substituted with an equimolar amount of $Li^+$ and $Ga^{3+}$ while maintaining charge compensation effects. It may be also possible to substitute it with a metal element which will serve as a sensitizer in order to control the emission wavelength or emission intensity.

Z represents an anionic group other than $PO_4^{3-}$ and $BO_3^{3-}$ and specific examples include hydroxyl ion ($OH^-$), metal oxide anions and halogen ions. The metal oxide anions include $SiO_4^{4-}$, $SiO_3^{2-}$, $TiO_3^{2-}$ and $ZrO_3^{2-}$, while the halogen ions include $F^-$, $Cl^-$, $Br^-$ and $I^-$. Examples are however not limited thereto.

The molar ratio o of Eu in the formula [4] is 0.003 or greater, preferably 0.015 or greater in consideration of the color rendering property and emission intensity. Its upper limit is 2.1 or less, preferably 1 or less. When the molar ratio o of $Eu^{2+}$ serving as an emission center ion is too small, the emission intensity tends to lower.

When it is too large, on the other hand, the emission intensity also tends to decrease owing to a phenomenon called concentration quenching.

The p is a number satisfying $2.7 \leq (o+p) \leq 3.3$. In the principal crystal $Eu_oM^8_p(PO_4)_q(BO_3)_{2-q}Z_r$ of the formula [4], the fundamental stoichiometric molar ratio (o+p) when Z is neglected as an impurity is 3. Appearance of some cation deficiencies or anion deficiencies has less influence on the intended fluorescence performance of the present invention so that (o+p) can be used within the above-described range.

The molar ratio q of the $PO_4$ group stands for a number satisfying $1.2 \leq q \leq 2$. From the viewpoints of color rending property, emission intensity and the like, q is preferably 1.6 or greater. In the above-described formula [4], the total molar ratio of the $PO_4$ and $BO_3$ groups serving as main anions is 2. The existence of the $BO_3$ group does not have a serious adverse effect on the color rendering property, emission intensity and the like.

The molar ratio r of Z which is an anion other than the $PO_4$ and $BO_3$ groups is a number satisfying $0 \leq r \leq 0.1$. The anion Z may be incorporated in the crystal if its amount is not large enough to adversely affect the intended fluorescence performance of the present invention. The smaller its content, the better. The r is preferably 0.05 or less.

A substance having an orthophosphate $A_{3(PO4)2}$ (in which A represents an alkaline earth metal) as a crystal matrix and activated with $Eu^{2+}$ is known as an ordinary phosphor excited at 254 nm. The present invention is however based on the finding that the emission intensity caused by the excitation of light at around 400 nm and the half-width of its emission peak differ largely, depending on the kind of the alkaline earth metal A of $A_3(PO_4)_2$; a substance of $A_3(PO_4)_2$:$Eu^{2+}$ containing Ca or Ca—Mg complex cation as A emits blue light with high emission intensity, exposed to excitation light of 350-415 nm; and a distribution of emission wavelength—emission intensity relating to a great improvement in color rendering property is wide, in other words, the half-width is large so that the phosphor can provide a high color rendering property.

The phosphor to be used in the present invention can be obtained by preparing a pulverized mixture in a dry method, more specifically, by pulverizing, in a dry pulverizer such as hammer mill, roll mill, ball mill or jet mill, compounds as $M^1$ source, X source, $PO_4$ source and Sr source and compounds as an element source for an emission center ion (Eu) when the phosphor contains the crystal phase of the formula [1], compounds as a $M^2$ source, $M^{2'}$ source, $M^3$ source, $M^{3'}$ source, $M^4$ source and $M^{4'}$ source and compounds as an element source for an emission center ion ($Eu^{2+}$) when the phosphor contains the crystal phase of the formula [2], compounds as a $M^5$ source, $M^6$ source and $M^7$ source and compounds as an element source for an emission center ion ($Eu^{2+}$) when the phosphor contains the crystal phase of the formula [3], or compounds as $M^8$ source, $PO_4$ source, $BO_3$ source and Z source and compounds as an element source for an emission center ion ($Eu^{2+}$) when the phosphor contains the crystal phase of the formula [4], and then mixing the pulverized product in a mixer such as ribbon blender, twin cylinder mixer or Henschel mixer, or reversing the order of mixing and pulverizing; or preparing a pulverized mixture in a wet method, more specifically, by adding the corresponding compounds in a medium such as water and pulverizing or mixing the resulting mixture in a wet pulverizer such as medium-stirring type pulverizer or pulverizing the corresponding compounds in a dry pulverizer, mixing the pulverized product with a medium such as water to prepare the corresponding slurry and then drying the slurry by spray drying or the like; and then sintering the thus-prepared pulverized mixture by heating.

Of these pulverizing and mixing methods, that using a liquid medium is preferred because a compound to be added in a small amount such as a compound as an element source for emission center ion must be mixed and dispersed uniformly. The latter wet method is preferred also for the compounds as the other element sources, because it enables preparation of a uniform mixture of them.

Heating is performed in a heat-resistant container such as alumina or quartz crucible or tray ordinarily at 700 to 1700° C., preferably at 900 to 1500° C. in an atmosphere of a single gas such as air, oxygen, carbon monoxide, carbon dioxide, nitrogen, hydrogen or argon, or a mixture thereof for 10 minutes to 24 hours. The heating is followed by washing, drying and classification as needed.

Upon heating, atmosphere necessary for obtaining an ion state (number of valence) of the element of an emission center ion enough for contributing light emission is selected. When the element is divalent as Eu in the present invention, a neutral or reducing atmosphere such as carbon monoxide, nitrogen, hydrogen or argon is preferred, but an oxidizing atmosphere such as air or oxygen can also be adopted under properly selected conditions.

Examples of the compounds as $M^1$ to $M^8$ sources, $M^{2'}$ to $M^{4'}$ sources, Sr source and Eu source include oxides, hydroxides, carbonates, nitrates, sulfates, oxalates, carboxylates, halides, hydrogen phosphates and phosphates of $M^1$ to $M^8$, $M^{2'}$ to $M^{4'}$, Sr and Eu.

Specific examples of the compounds as a Sr source include SrO, $Sr(OH)_2.8H_2O$, $SrCO_3$, $Sr(NO_3)_2$, $Sr(OCO)_2.H_2O$, $Sr(OCOCH_3)_2.0.5H_2O$ and $SrCl_2$.

Specific examples of the compounds as a Ba source include BaO, $Ba(OH)_2.8H_2O$, $BaCO_3$, $Ba(NO_3)_2$, $BaSO_4$, $Ba(OCO)_2.2H_2O$, $Ba(OCOCH_3)_2$ and $BaCl_2$.

Specific examples of the compounds as a Mg source include MgO, $Mg(OH)_2$, $MgCO_3$, $Mg(OH)_2$, $3MgCO_3.3H_2O$, $Mg(NO_3)_2.6H_2O$, $Mg(OCO)_2.2H_2O$, $Mg(OCOCH_3)_2.4H_2O$, and $MgCl_2$.

Specific examples of the compounds as a Ca source include CaO, $Ca(OH)_2$, $CaCO_3$, $Ca(NO_3)_2.4H_2O$, $Ca(OCO)_2.H_2O$, $Ca(OCOCH_3)_2.H_2O$, and $CaCl_2$.

Specific examples of the compounds as a Zn source include ZnO, $Zn(OH)_2$, $ZnCO_3$, $Zn(NO_3)_2 \cdot 6H_2O$, $Zn(OCO)_2$, $Zn(OCOCH_3)_2$ and $ZnCl_2$.

Specific examples of the compounds as a Mn source include $MnO_2$, $Mn_2O_3$, $Mn_3O_4$, MnOOH, $MnCO_3$, $Mn(NO_3)_2$, $Mn(OCOCH_3)_2 \cdot 2H_2O$, $Mn(OCOCH_3)_3 \cdot nH_2O$, and $MnCl_2 \cdot 4H_2O$.

Specific examples of the compounds as an element source for $Eu^{2+}$ include $Eu_2O_3$, $Eu(OCOCH_3)_3 \cdot 4H_2O$, $EuCl_3 \cdot 6H_2O$ and $Eu_2(OCO)_3 \cdot 6H_2O$.

Examples of the compounds as a $PO_4$ source include hydrogen phosphates, phosphates, metaphosphates, pyrophosphates of $M^1$, $M^8$, Eu and $NH_4$, $P_2O_5$, $PX_3$, $PX_5$, $M_2PO_4X$, phosphoric acid, metaphosphoric acid and pyrophosphoric acid.

Examples of the compounds as a $BO_3$ source include borates, hydrogen borates, tetraborates, octaborates, diborates, and pentaborates of $M^8$, Eu and $NH_4$, boric acid and boron oxide. Of these, borates and hydrogen borates of $M^8$, Eu and $NH_4$, boric acid and boron oxide are preferred.

Examples of the compounds as an X source include $M^1X$, $NH_4X$, HX and $M^1{}_2PO_4X$.

Examples of the compounds as a Z source include $M^8{}_2SiO_4$, $M^8SiO_3$, $MBTiO_3$, $M^8ZnO_3$, $M^8F_2$, $M^8Cl_2$, $M^8Br_2$, $NH_4F$, $NH_4Cl$, $NH_4Br$, HF, HCl and HBr.

Of these compounds, a proper one is selected in consideration of the chemical composition, reactivity and sintering without emitting a gas such as $NO_x$ and $SO_x$.

In the present invention, the first light emitter which irradiates light to the phosphor emits light having a wavelength of 350-415 nm. A light emitter generating light with a peak wavelength within a wavelength range of from 350 to 415 nm is preferred. More preferred from the viewpoint of emission efficiency is a light emitter emitting light having a peak wavelength within a wavelength range of from 390 to 410 nm. Specific examples of the first light emitter include light emitting diode (LED) and laser diode (LD). The laser diode is more preferred, because it consumes less power.

Of these, a GaN-based LED and LD using a GaN compound semiconductor are especially preferred, because their emission output or external quantum efficiency is by far great compared with an SiC-based LED emitting light of this region so that very bright light emission is available at a considerably low electricity by using it in combination with the above-described phosphor. For example, when a current of 20 mA is applied, a GaN-based diode has emission intensity at least 100 times that of an SiC-based diode. The GaN-based LED or LD preferably has an $Al_xGa_yN$ luminescent layer, GaN luminescent layer or $In_xGa_yN$ luminescent layer. The GaN-based LED having an $In_xGa_yN$ luminescent layer is especially preferred because it has remarkably high emission intensity, while the GaN-based LD having a multiple quantum well structure with an $In_xGa_yN$ layer and a GaN layer is especially preferred because of remarkably high emission intensity.

In the above-described compounds, X+Y is usually a value within a range of from 0.8 to 1.2. As the GaN-based LED, that with a luminescent layer having Zn or Si doped therein or no dopant therein is preferred, because it facilitates control of luminescent properties. The GaN-based LED has such a luminescent layer, p layer, n layer, electrode and substrate as principal constituents, of which that having a hetero structure in which the luminescent layer has been sandwiched between the n type and p type $Al_xGa_yN$ layers, GaN layers or $In_xGa_yN$ layers is preferred because of having high emission efficiency; that having, as the hetero structure, a quantum well structure is more preferred because of having higher emission efficiency.

In the present invention, use of a vertical cavity surface emitting light emitter, especially a vertical cavity surface light emitting type GaN laser diode as the first light emitter is especially preferred in order to heighten the emission efficiency of the whole light emitting apparatus. The vertical cavity surface emitter generates intense light in the plane direction of a film. In the vertical cavity surface type GaN-based laser diode, light emission in the plane direction can be made more intense than the edge direction of the luminescent layer by controlling the crystal growth of the luminescent layer and at the same time using a reflecting layer successfully. When the vertical cavity surface emitting diode is used, a light emitting cross-sectional area per unit emission amount can be made greater than that of a diode emitting light from the edge of the luminescent layer.

As a result, when a phosphor constituting the second light emitter is exposed to the light, the exposed area can be increased remarkably at the same light intensity, meaning an improvement in irradiation efficiency. As a result, more intense light is available from the phosphor.

The second light emitter may be in film form.

When a vertical cavity surface emitting type is used as the first light emitter, the second light emitter is preferably in the film form. The vertical cavity surface emitting type light emitter has a large light-emitting cross-sectional area so that formation of the second light emitter in the film form in the cross-sectional direction makes it possible to heighten the emission intensity from the phosphor, because the irradiation cross-sectional area from the first light emitter to the phosphor becomes large per unit amount of the phosphor.

When a vertical cavity surface emitting type is used as the first light emitter and the second light emitter in the film form is used, it is preferred to bring the second light emitter in the film form into direct contact with the light emitting surface of the first light emitter. The term "bring into direct contact" as used herein means "bring the first light emitter into close contact with the second light emitter without having air or another gas inserted therebetween".

As a result, it is possible to avoid a light power loss, which otherwise occurs owing to reflection of light from the first light emitter by the film surface of the second light emitter and leakage of it to the outside, and thereby improving the emission efficiency of the whole device.

Figure 2:
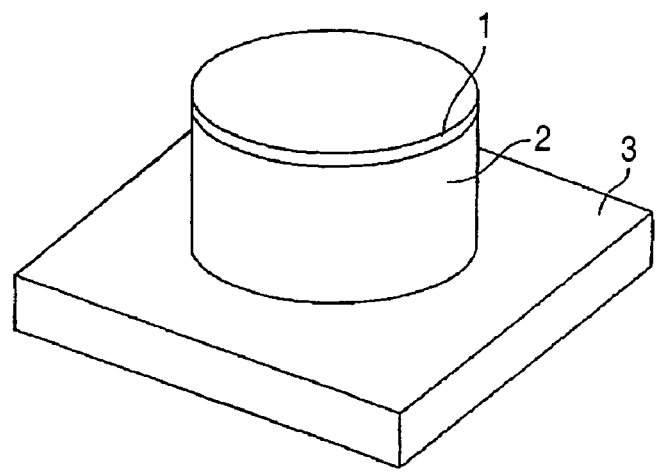
FIG. 2 is a schematic perspective view illustrating one example of a light emitting device in which a phosphor in the film form is brought into contact with a vertical cavity surface emitting GaN diode.

FIG. 2 is a schematic perspective view illustrating the positional relationship between the first light emitter and the second light emitter in one example of the light emitting device of the present invention, in which indicated at numeral 1 is a second light emitter in the film form having the phosphor, 2 a vertical cavity surface emitting GaN-based LD as the first light emitter, and 3 a substrate. These three components can be brought into contact with each other by bringing the LD 2 and the second light emitter 1, which have been prepared separately in advance, into contact at their surfaces by various means including an adhesive; or forming (as a film) or molding the second light emitter over the luminescent surface of the LD 2. As a result, the LD 2 can be brought into contact with the second light emitter 1.

Light from the first light emitter or second light emitter usually scatters in all directions. When powder of the phosphor to be used as the second light emitter is dispersed in a resin, a portion of light is reflected when it comes outside of the resin so that the light can be adjusted to one direction to some extent. Light can thus be induced to an efficient direction to some extent so that use of a dispersion of the phosphor powder in a resin as the second light emitter is preferred. As the phosphor powder, that having an average particle size of from 0.5 to 15 μm is usually employed. For effective use of the light from the first light emitter, the average diameter is preferably 0.8 to 5 μm, more preferably from 0.8 to 2 μm.

Use of a dispersion of the phosphor in a resin has another advantage that it can heighten the intensity of light from the second light emitter, because the total area of light irradiated from the first light emitter toward the second light emitter becomes large. Examples of the resin which can be used for this purpose include epoxy resin, polyvinyl resin, polyethylene resin, polypropylene resin and polyester resin. The epoxy resin is preferred because the phosphor powder can be well dispersed therein. When the phosphor powder is dispersed in the resin, a weight ratio of the phosphor powder to the whole resin is usually from 10 to 95%, preferably from 20 to 90%, more preferably from 30 to 80%. When the amount of the phosphor is too large, agglomeration of powder happens to lower the emission efficiency, while too small amount happens to deteriorate the emission efficiency owing to absorption or scattering of light in the resin.

The light emitting device of the present invention is capable of emitting white light by mixing light from the first light emitter and light from the second light emitter. Upon emission, a color filter may be used as needed. By making the light emitted from the device white, an object to be exposed to the light of this light emitting device has a high color rendering property. This is an important point upon application of this light emitting device for illumination use.

The light emitting device of the present invention is composed of the above-described phosphor as a wavelength conversion material and a light emitter generating light of 350-415 nm. In this device, the phosphor absorbs light of 350-415 nm generated by the light emitter, whereby visible light with good color rendering property and high intensity can be emitted under any using environment. It is suited as a backlight source, light source for traffic signals, and a light source for image display device such as color liquid-crystal display or an illuminator, such as a vertical cavity surface emitting illuminator.

Figure 3:
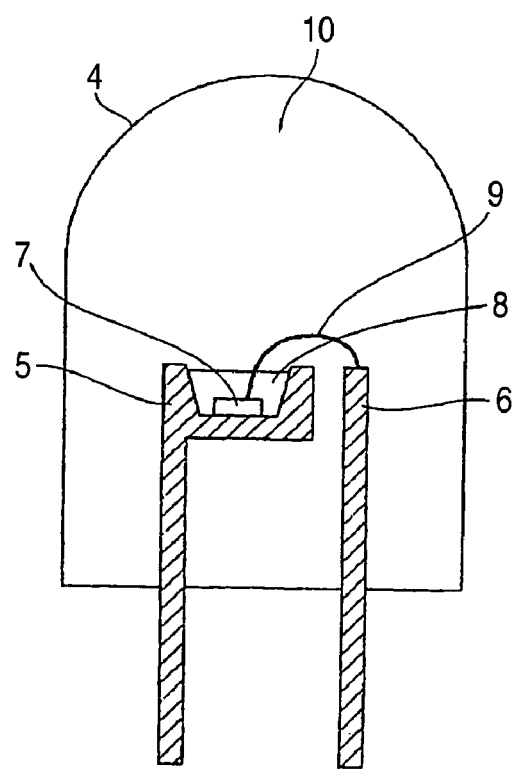
FIG. 3 is a schematic cross-sectional view illustrating one example of a light emitting device of the present invention.

The light emitting device of the present invention will next be described referring to diagrams. FIG. 3 is a schematic cross-sectional view illustrating one example of a light emitting device having a first light emitter (emits light of 350-415 nm) and a second light emitter, in which indicated at numeral 4 is a light emitting device, 5 a mount lead, 6 an inner lead, 7 a first light emitter (which emits light of 350-415 nm), 8 a phosphor-containing resin portion as a second light emitter, 9 a conductive wire and 10 a molding member.

The light emitting device which is one example of the present invention has a bullet-like shape as illustrated in FIG. 3. In an upper cap of the mount lead 5, the first light emitter (emitter of light with 350-415 nm) 7 is fixed by the phosphor-containing resin portion 8, which has been formed as the second light emitter by mixing and dispersing the phosphor in a binder such as epoxy resin or acrylic resin and then casting the dispersion in the cup. The first light emitter 7 and mount lead 5, and the first light emitter 7 and inner lead 6 are electrically connected each other via the conductive wire 9. They are all covered and protected with the molding member 10 made of an epoxy resin or the like.

In a vertical cavity surface emitting illuminator 98 having this light emitting device 1 incorporated therein, a number of light emitting devices 91 are placed on the bottom surface of a square holding case 910 having an opaque inner surface, for example, a white flat inner surface while disposing, outside the case, a power supply and circuit (not illustrated) for driving the light emitting devices 91. At a position corresponding to a lid of the holding case 910, a diffusion plate 99 such as an opalescent acryl plate is fixed to accomplish uniform light emission.

The vertical cavity surface emitting illuminator 98 is switched on and a voltage is applied to the first light emitter of the light emitting devices 91, whereby light of 350-415 nm is emitted. The phosphor in the phosphor-containing resin portion as the second light emitter absorbs a portion of the light and emits visible light. The visible light is mixed with blue light and the like not absorbed by the phosphor. The resulting light with high color rendering property transmits through the diffusion plate 99 and outputs in the upward direction of the diagram, whereby light with uniform brightness is available in the plane of the diffusion plate 99 of the holding case 910.

EXAMPLES

The present invention will hereinafter be described in further detail. It should however be borne in mind that the present invention is not limited by the below-described examples insofar as it does not depart from the scope of the invention.

In Examples 1 to 10, 12 to 17 and Comparative Examples 1 and 2, the relative emission intensity (i) is a value provided that the emission intensity of the phosphor obtained in Comparative Example 1 is 100. In Examples 19 to 23 and Comparative Example 3, the relative emission intensity (i) is a value provided that the emission intensity of the phosphor obtained in Comparative Example 3 excited at each of 400 nm and 254 nm is 100. In Examples 25 to 35 and Comparative Examples 4 and 5, the relative emission intensity (i) is a value provided that the emission intensity of the phosphor obtained in Comparative Example 4 is 100. In Examples 37 to 44 and Comparative Example 6, the relative integrated intensity is a value provided that the integrated intensity of the phosphor obtained in Comparative Example 6 is 1. In Examples 37 to 41, and 45 to 47, the relative emission intensity (i) is a value provided that the emission intensity of the phosphor obtained in Example 40 excited at each of 400 nm and 254 nm is 100.

Example 1

With pure water, 0.1055 mole of $SrHPO_4$, 0.0352 mole of $SrCO_3$, 0.0176 mole of $SrCl_2$ and 0.0088 mole of $Eu_2O_3$ were pulverized and mixed in a wet-type ball mill made of alumina and containing beads. After drying, the resulting mixture was caused to pass through a nylon mesh. The pulverized mixture was sintered by heating at 1200° C. for 2 hours in an alumina crucible under a nitrogen gas stream containing 4% of hydrogen. The sintered mixture was then washed with water, dried and classified, whereby a phosphor $Sr_{4.5}Eu_{0.5}(PO_4)_3Cl$ was prepared.

Figure 4:
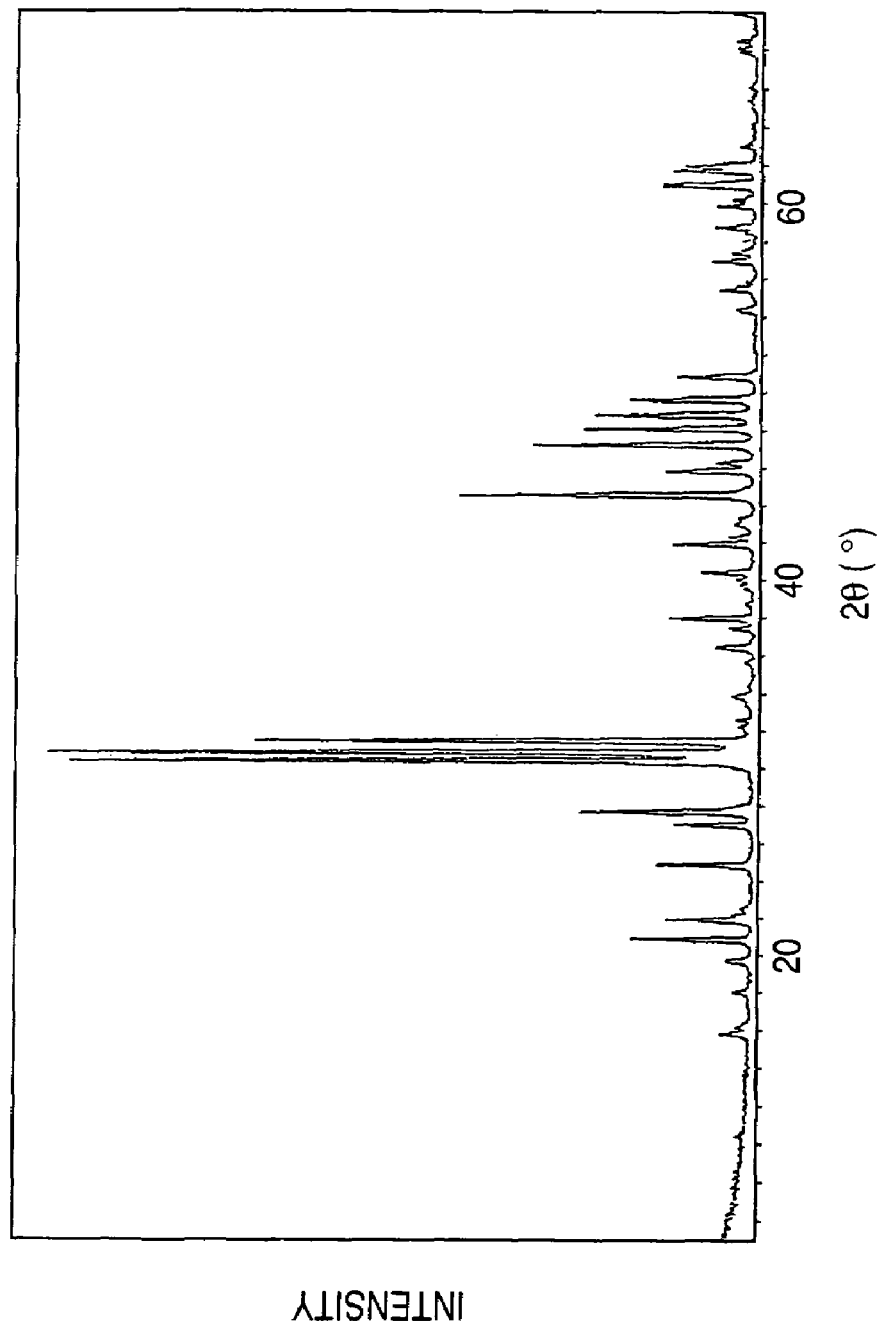
FIG. 4 is an X-ray diffraction pattern (X-ray source: Cu Kα) of the phosphor of Example 1 of the present invention.

The X-ray diffraction pattern of the resulting phosphor is shown in FIG. 4. From the diagram, it has been found that the peak pattern of FIG. 4 is crystallographically identical to that of $Sr_5(PO_4)_3Cl$ of FIG. 1.

Figure 5:
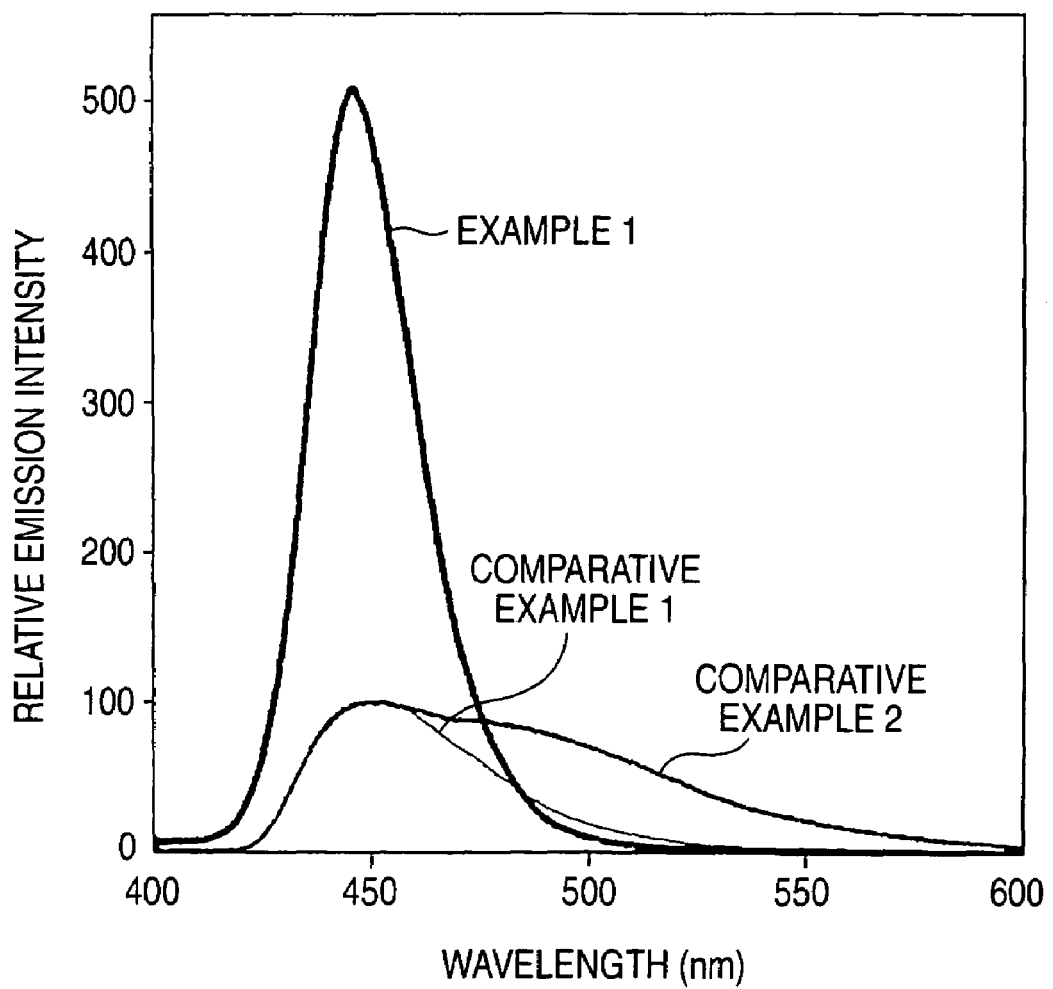
FIG. 5 illustrates, in one diagram, emission spectra of phosphors of Example 1 of the present invention, Comparative Example 1 and Comparative Example 2 each exposed to a GaN light emitting diode having an emission wavelength of 400 nm.

The emission spectrum of the resulting phosphor excited at 400 nm which is a dominant wavelength of the ultraviolet region of a GaN light emitting diode is shown in FIG. 5.

In Table 1, the wavelength of emission peak and relative emission intensity (i) when the resulting phosphor was excited at 400 nm, that is, a dominant wavelength of the ultraviolet region of a GaN light emitting diode; and a quantum absorption efficiency $\alpha_q$ of the phosphor and a product $\alpha_q \cdot \eta_i$ of the quantum absorption efficiency $\alpha_q$ and the internal quantum efficiency $\eta_i$ of the phosphor as measured using a reflector having a reflectance of 98% are shown.

With regards to $Sr_{(5-x)}Eu_x(PO_4)_3Cl$ the number of Eu(s) per volume of the crystalline matrix was found from x and the volume of a unit lattice calculated based on the lattice constant of the hexagonal system: a=9.859 Å, b=9.859 Å and c=7.206 Å and the reciprocal of the number was raised to the ⅓rd power to calculate the Eu—Eu mean distance. As a result, the Eu—Eu mean distance in $Sr_{4.5}Eu_{0.5}(PO_4)_3Cl$ was 8.5 Å.

Example 2

In a similar manner to Example 1 except for the use of 0.1055 mole of $SrHPO_4$, 0.0176 mole of $SrCO_3$, 0.0176 mole of $SrCl_2$ and 0.0176 mole of $Eu_2O_3$ as raw materials instead, a phosphor $Sr_4Eu_1(PO_4)_3Cl$ was prepared.

Figure 6:
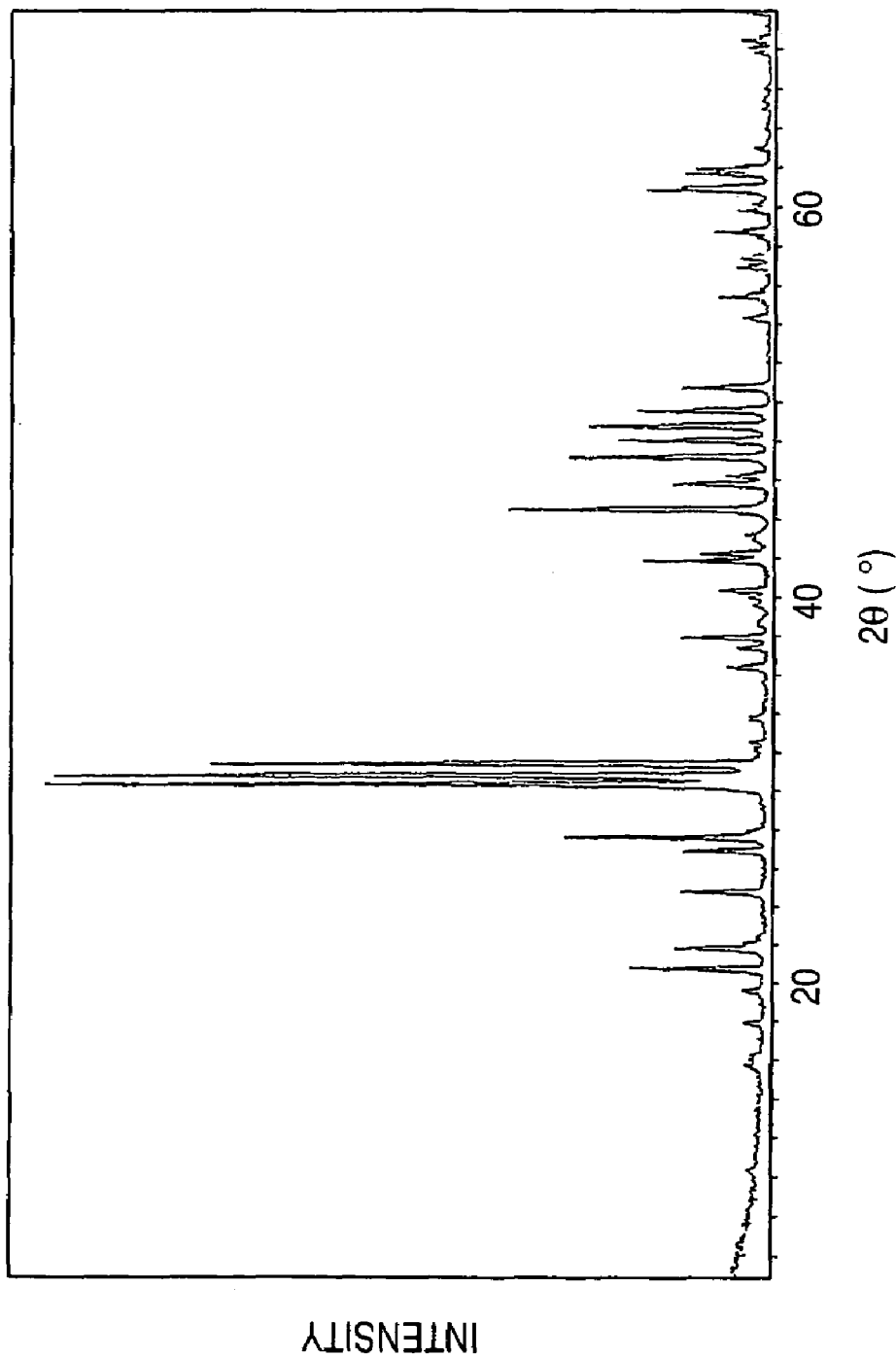
FIG. 6 is an X-ray diffraction pattern (X-ray source: Cu Kα) of the phosphor of Example 2 of the present invention.

The X-ray diffraction pattern of the resulting phosphor is shown in FIG. 6. From the diagram, it has been found that the peak pattern of FIG. 6 is crystallographically identical to that of $Sr_5(PO_4)_3Cl$ of FIG. 1.

The resulting phosphor was excited at 400 nm, that is, a dominant wavelength of the ultraviolet region of a GaN light emitting diode. The wavelength of its emission peak, relative emission intensity (i), a quantum absorption efficiency $\alpha_q$ of the phosphor and a product $\alpha_q \cdot \eta_i$ of the quantum absorption efficiency $\alpha_q$ and the internal quantum efficiency $\eta_i$ of the phosphor as measured using a reflector having a reflectance of 98% are shown.

The Eu—Eu mean distance was 6.7 Å.

Example 3

In a similar manner to Example 1 except for the use of 0.1055 mole of $SrHPO_4$, 0.0176 mole of $SrCl_2$ and 0.0264 mole of $Eu_2O_3$ as raw materials instead, a phosphor $Sr_{3.5}Eu_{1.5}(PO_4)_3Cl$ was prepared.

Figure 7:
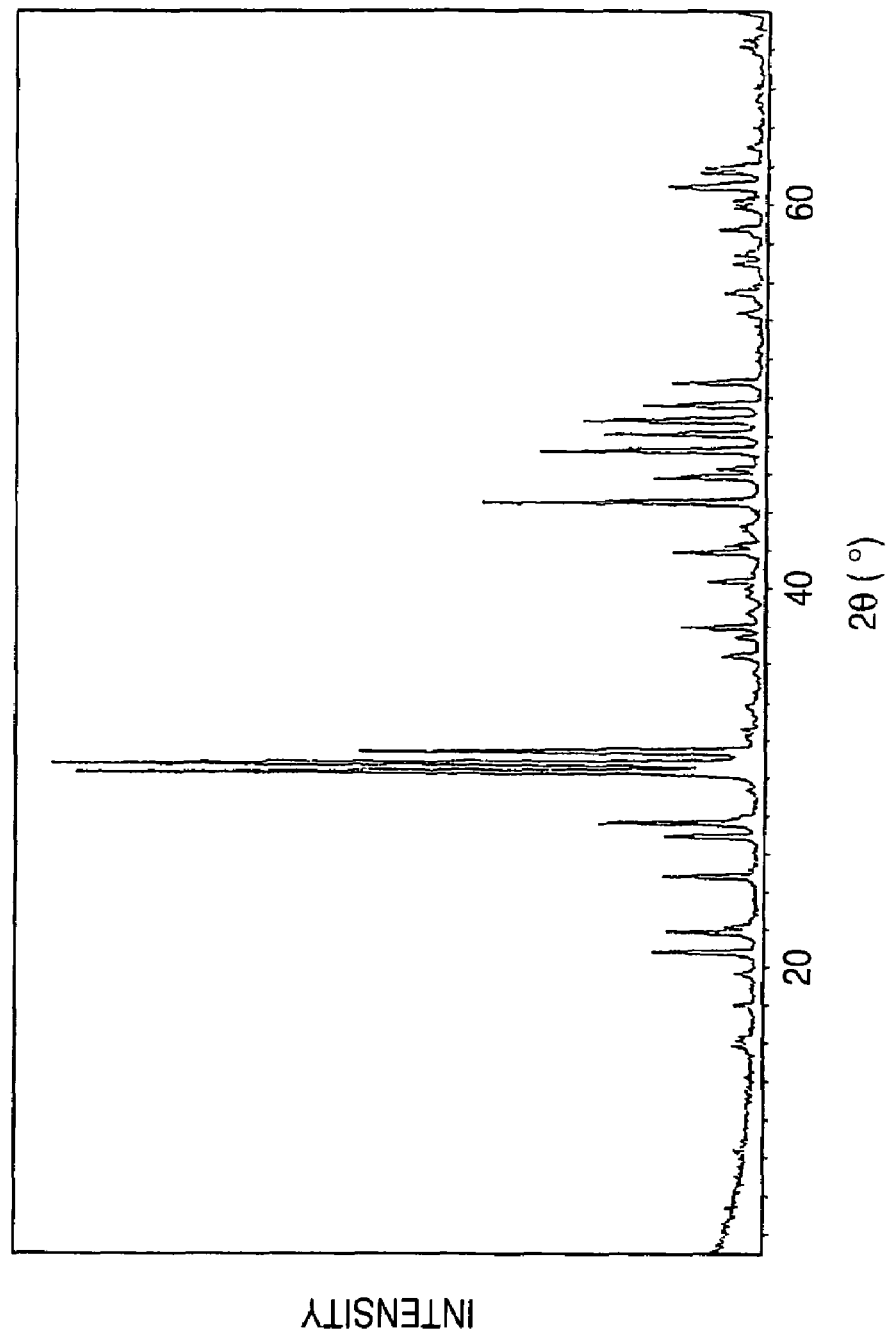
FIG. 7 is an X-ray diffraction pattern (X-ray source: Cu Kα) of the phosphor of Example 3 of the present invention.
Figure 9:
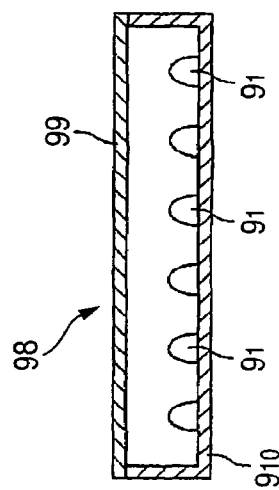
FIG. 9 is a schematic cross-sectional view illustrating one example of a vertical cavity surface emitting illuminator of the present invention.

The X-ray diffraction pattern of the resulting phosphor is shown in FIG. 7. From the diagram, it has been found that the peak pattern of FIG. 7 is crystallographically identical to that of $Sr_5(PO_4)_3Cl$ of FIG. 1.

The resulting phosphor was excited at 400 nm, that is, a dominant wavelength of the ultraviolet region of a GaN light emitting diode and emission spectrum was measured. The wavelength of its emission peak, relative emission intensity (i), and a quantum absorption efficiency $\alpha_q$ of the phosphor and a product $\alpha_q \cdot \eta_i$ of the quantum absorption efficiency $\alpha_q$ and the internal quantum efficiency $\eta_i$ of the phosphor as measured using a reflector having a reflectance of 98% are shown.

The Eu—Eu mean distance was 5.9 Å.

Example 4

In a similar manner to Example 1 except for the use of 0.0879 mole of $SrHPO_4$, 0.0176 mole of $SrCl_2$, 0.0352 mole of $Eu_2O_3$ and 0.0176 mole of $(NH_4)_2HPO_4$ as raw materials instead, a phosphor $Sr_3Eu_2(PO_4)_3Cl$ was prepared.

Figure 8:
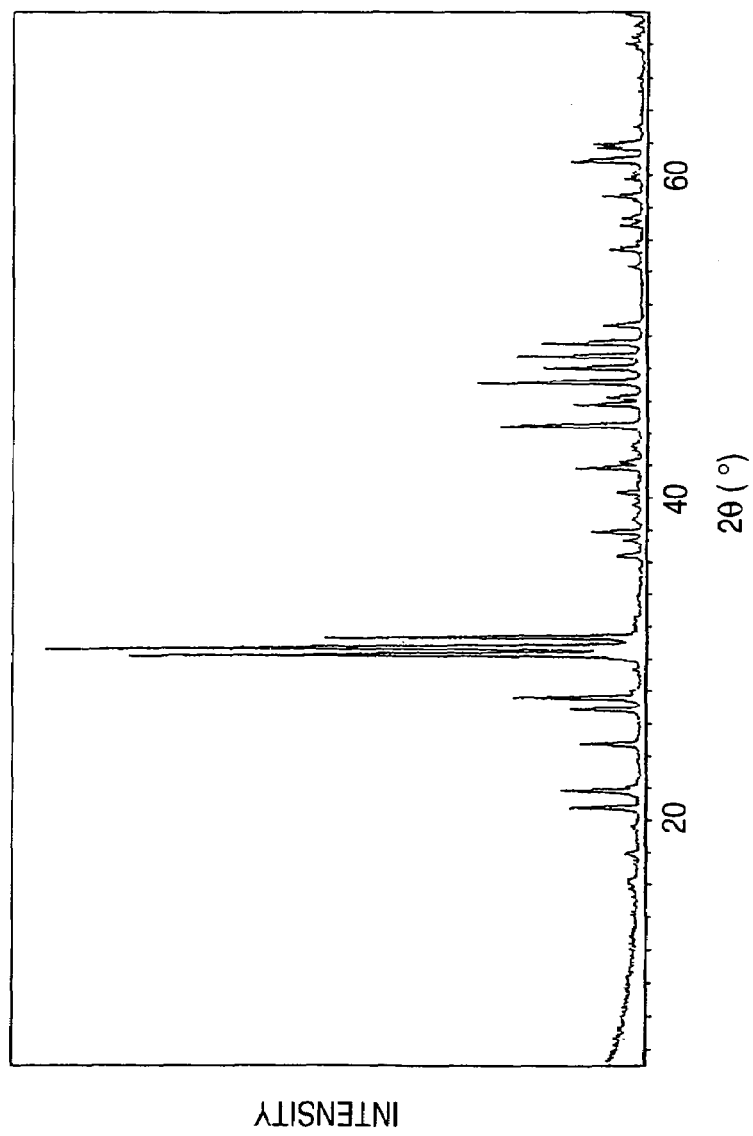
FIG. 8 is an X-ray diffraction pattern (X-ray source: Cu Kα) of the phosphor of Example 4 of the present invention.

The X-ray diffraction pattern of the resulting phosphor is shown in FIG. 8. From the diagram, it has been found that the peak pattern of FIG. 8 is crystallographically identical to that of $Sr_5(PO_4)_3Cl$ of FIG. 1.

The resulting phosphor was excited at 400 nm, that is, a dominant wavelength of the ultraviolet region of a GaN light emitting diode and its emission spectrum was measured. The wavelength of its emission peak and relative emission intensity (i) are shown in Table 1.

The Eu—Eu mean distance was 5.3 Å.

Example 5

In a similar manner to Example 1 except for the use of 0.1055 mole of $SrHPO_4$, 0.0484 mole of $SrCO_3$, 0.0176 mole of $SrCl_2$ and 0.00176 mole of $CaCO_3$, basic magnesium carbonate (0.00088 mole as Mg) and 0.00088 mole of $Eu_2O_3$ as raw materials instead, a phosphor $Sr_{4.875}Ca_{0.05}Mg_{0.025}Eu_{0.05}(PO_4)_3Cl$ was prepared.

Figure 10:
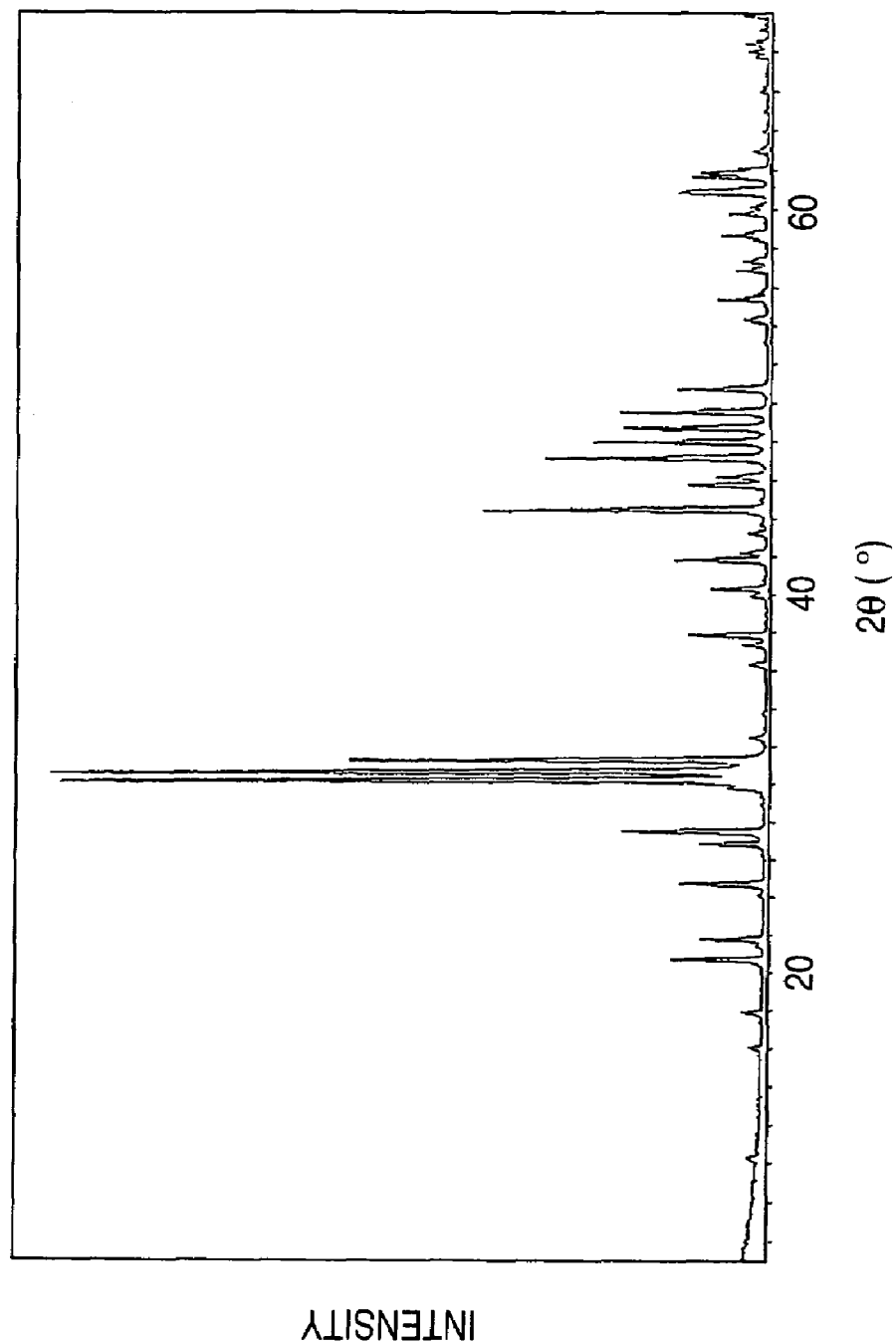
FIG. 10 is an X-ray diffraction pattern (X-ray source: CuKα) of the phosphor of Example 5 of the present invention.

The X-ray diffraction pattern of the resulting phosphor is shown in FIG. 10. From the diagram, it has been found that the peak pattern of FIG. 10 is crystallographically identical to that of $Sr_5(PO_4)_3Cl$ of FIG. 1. The resulting phosphor was excited at 400 nm, that is, a dominant wavelength of the ultraviolet region of a GaN light emitting diode and its emission spectrum was measured. In Table 1, the wavelength of its emission peak and relative emission intensity (i), and a quantum absorption efficiency $\alpha_q$ of the phosphor and a product $\alpha_q \cdot \eta_i$ of the quantum absorption efficiency $\alpha_q$ and the internal quantum efficiency $\eta_i$ of the phosphor as measured using a reflector having a reflectance of 98% are shown.

The Eu—Eu mean distance was 18.2 Å.

Example 6

In a similar manner to Example 1 except for the use of 0.1055 mole of $SrHPO_4$, 0.0396 mole of $SrCO_3$, 0.00879 mole of $BaCO_3$, basic magnesium carbonate (0.00264 mole as Mg), 0.0176 mole of $BaCl_2$, and 0.00088 mole of $Eu_2O_3$ as raw materials instead, a phosphor $Sr_{4.125}Ba_{0.75}Mg_{0.075}Eu_{0.05}(PO_4)_3Cl$ was prepared.

Figure 11:
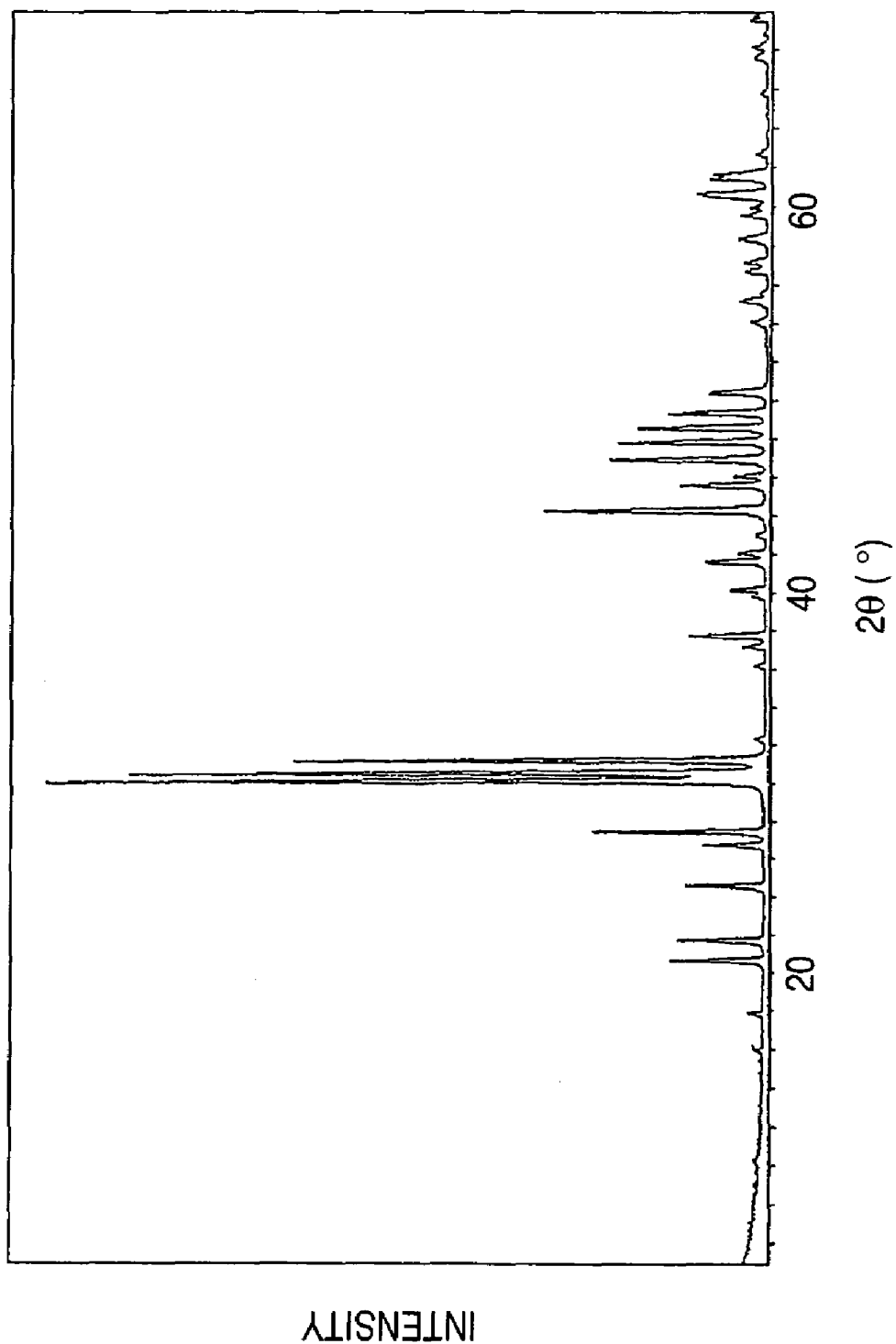
FIG. 11 is an X-ray diffraction pattern (X-ray source: Cu Kα) of the phosphor of Example 6 of the present invention.

The X-ray diffraction pattern of the resulting phosphor is shown in FIG. 11. From the diagram, it has been found that the peak pattern of FIG. 11 is crystallographically identical to that of $Sr_5(PO_4)_3Cl$ of FIG. 1. The resulting phosphor was excited at 400 nm, that is, a dominant wavelength of the ultraviolet region of a GaN light emitting diode and its emission spectrum was measured. The wavelength of its emission peak and relative emission intensity (i) are shown in Table 1.

The Eu—Eu mean distance was 18.2 Å.

Example 7

In a similar manner to Example 1 except for the use of 0.0527 mole of $SrHPO_4$, 0.0176 mole of $SrCl_2$, 0.0527 mole of $Eu_2O_3$ and 0.0527 mole of $(NH_4)_2HPO_4$ as raw materials instead, a phosphor $Sr_2Eu_3(PO_4)_3Cl$ was prepared.

Figure 12:
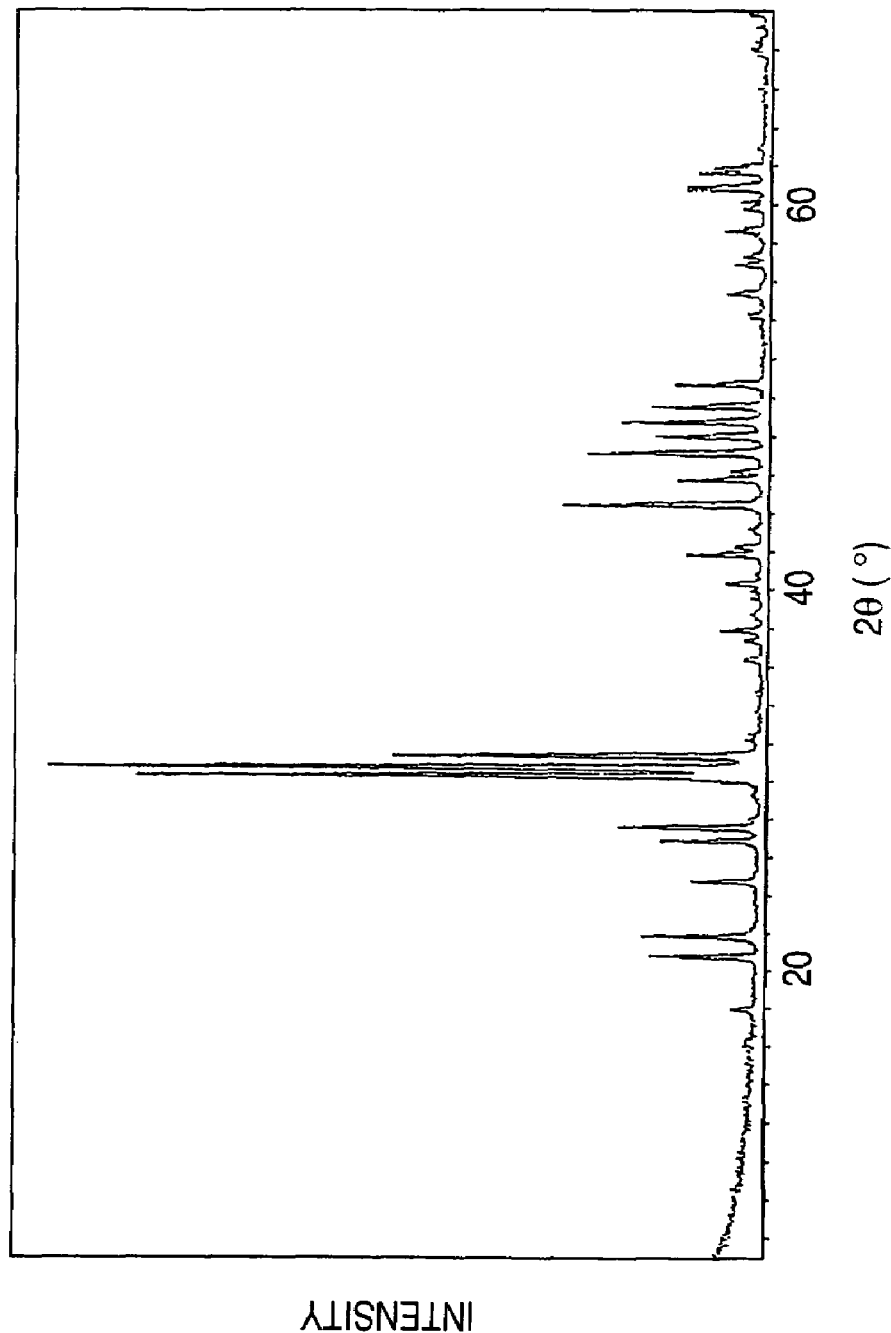
FIG. 12 is an X-ray diffraction pattern (X-ray source: Cu Kα) of the phosphor of Example 7 of the present invention.

The X-ray diffraction pattern of the resulting phosphor is shown in FIG. 12. From the diagram, it has been found that the peak pattern of FIG. 12 is crystallographically identical to that of $Sr_5(PO_4)_3Cl$ of FIG. 1.

The resulting phosphor was excited at 400 nm, that is, a dominant wavelength of the ultraviolet region of a GaN light emitting diode and its emission spectrum was measured. In Table 1, the wavelength of its emission peak and relative emission intensity (i), and a quantum absorption efficiency $\alpha_q$ of the phosphor and a product $\alpha_q \cdot \eta_i$ of the quantum absorption efficiency $\alpha_q$ and the internal quantum efficiency $\eta_i$ of the phosphor as measured using a reflector having a reflectance of 98% are shown.

The Eu—Eu mean distance was 4.7 Å.

Example 8

In a similar manner to Example 1 except for the use of 0.0176 mole of $SrCl_2$, 0.0791 mole of $Eu_2O_3$ and 0.1055 mole of $(NH_4)_2HPO_4$ as raw materials instead, a phosphor $Sr_{0.5}Eu_{4.5}(PO_4)_3Cl$ was prepared.

Figure 13:
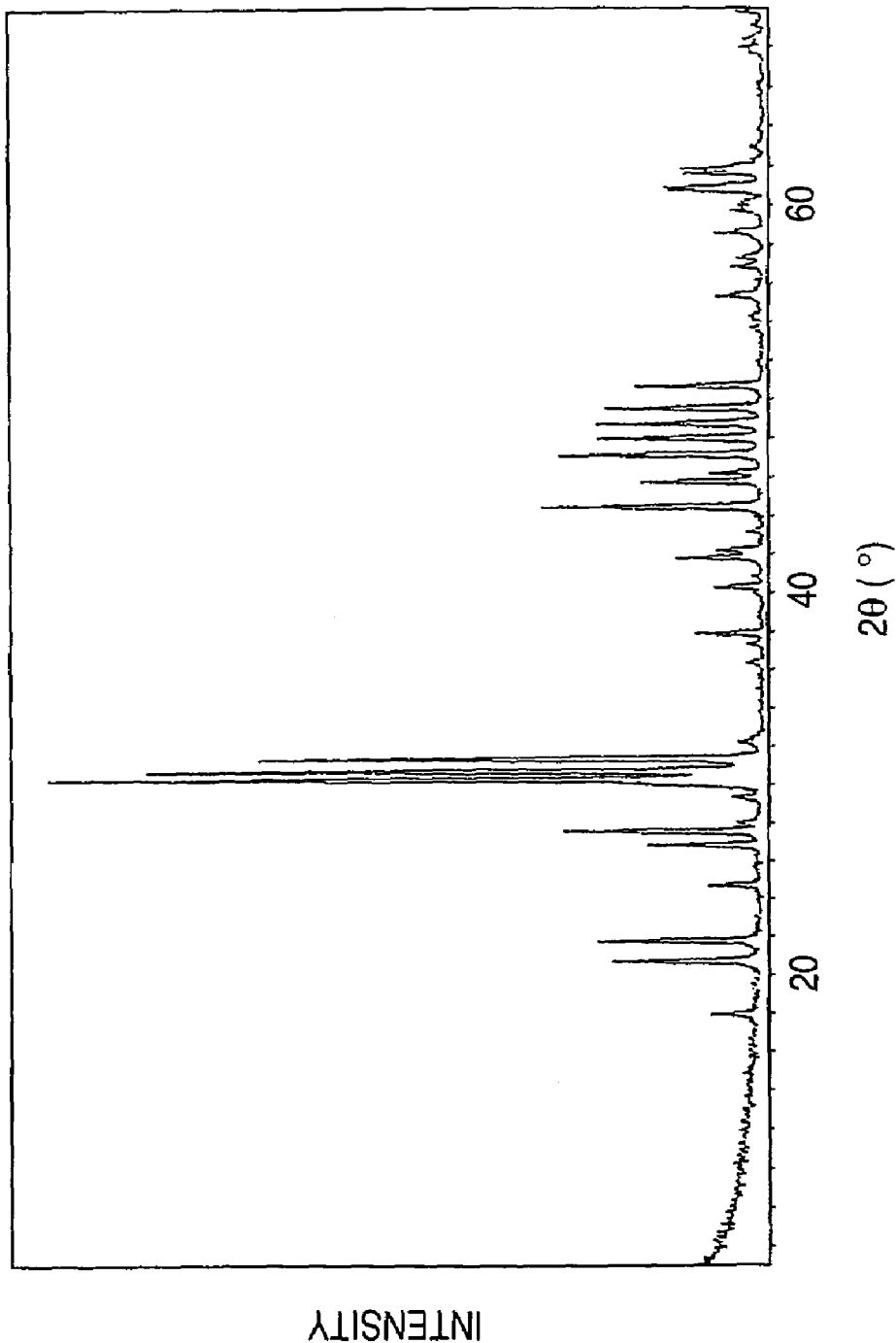
FIG. 13 is an X-ray diffraction pattern (X-ray source: Cu Kα) of the phosphor of Example 8 of the present invention.

The X-ray diffraction pattern of the resulting phosphor is shown in FIG. 13. From the diagram, it has been found that the peak pattern of FIG. 13 is crystallographically identical to that of $Sr_5(PO_4)_3Cl$ of FIG. 1.

The resulting phosphor was excited at 400 nm, that is, a dominant wavelength of the ultraviolet region of a GaN light emitting diode and its emission spectrum was measured. In Table 1, the wavelength of its emission peak and relative emission intensity (i), and a quantum absorption efficiency $\alpha_q$ of the phosphor and a product $\alpha_q \cdot \eta_i$ of the quantum absorption efficiency $\alpha_q$ and the internal quantum efficiency $\eta_i$ of the phosphor as measured using a reflector having a reflectance of 98% are shown.

The Eu—Eu mean distance was 4.1 Å.

Example 9

In a similar manner to Example 1 except for the use of 0.1055 mole of $SrHPO_4$, 0.0302 mole of $SrCO_3$, 0.0199 mole of $CaCO_3$, basic magnesium carbonate (0.00088 mole as Mg), 0.0176 mole of $BaCl_2$, and 0.00088 mole of $Eu_2O_3$ as raw materials instead, a phosphor $Sr_{3.86}Ba_{0.5}Ca_{0.565}Mg_{0.025}Eu_{0.05}(PO_4)_3Cl$ was prepared.

Figure 14:
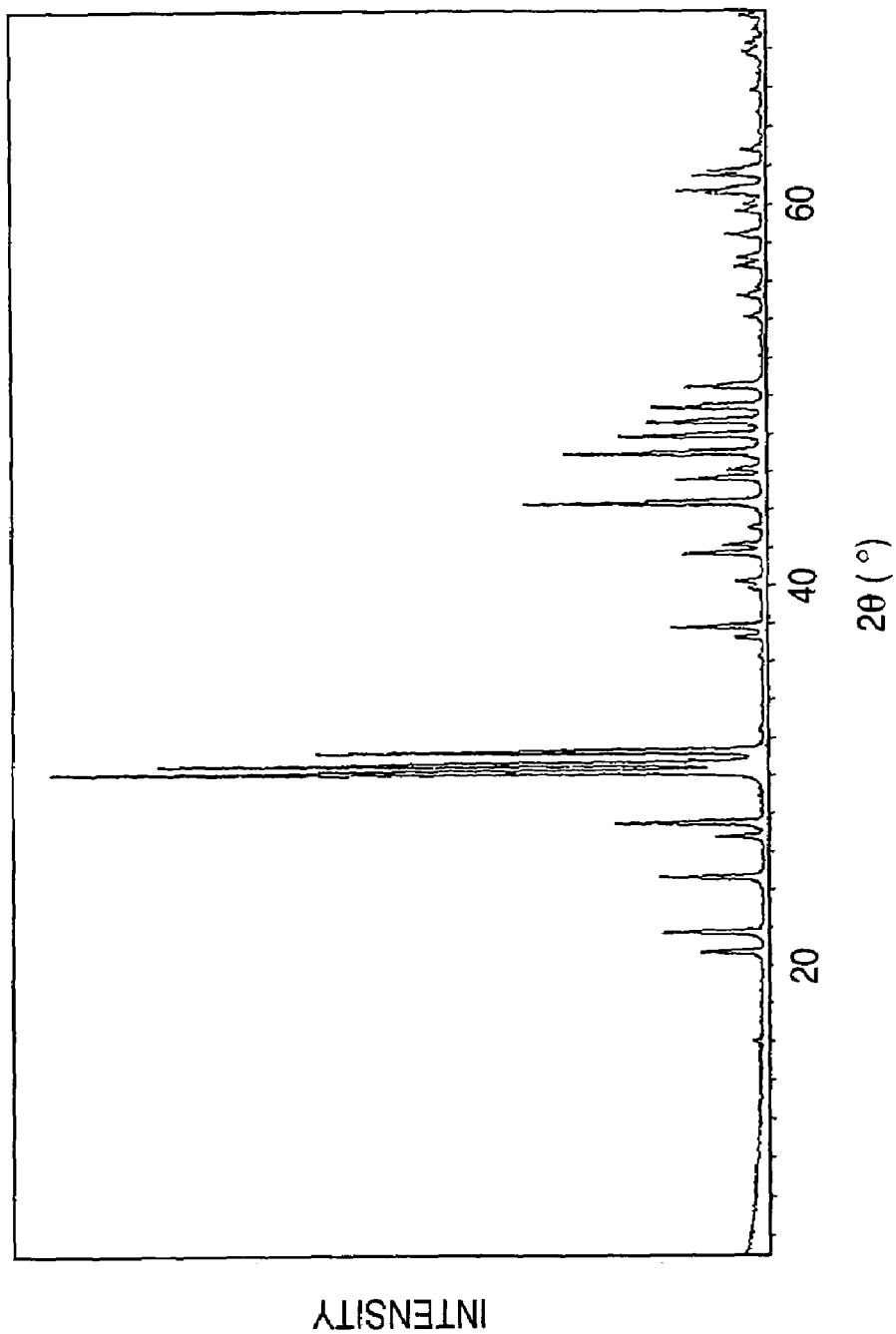
FIG. 14 is an X-ray diffraction pattern (X-ray source: Cu Kα) of the phosphor of Example 9 of the present invention.

The X-ray diffraction pattern of the resulting phosphor is shown in FIG. 14. From the diagram, it has been found that the peak pattern of FIG. 14 is crystallographically identical to that of $Sr_5(PO_4)_3Cl$ of FIG. 1.

The resulting phosphor was excited at 400 nm, that is, a dominant wavelength of the ultraviolet region of a GaN light emitting diode and its emission spectrum was measured. The wavelength of its emission peak and relative emission intensity (i) are shown in Table 1.

The Eu—Eu mean distance was 18.2 Å.

Example 10

In a similar manner to Example 1 except for the use of 0.1055 mole of $SrHPO_4$, 0.0121 mole of $SrCO_3$, 0.0204 mole of $BaCO_3$, 0.0176 mole of $CaCO_3$, basic magnesium carbonate (0.00088 mole as Mg), 0.0176 mole of $BaCl_2$, and 0.00088 mole of $Eu_2O_3$ as raw materials instead, a phosphor $Sr_{3.345}Ba_{1.08}Ca_{0.5}Mg_{0.025}Eu_{0.05}(PO_4)_3Cl$ was prepared.

Figure 15:
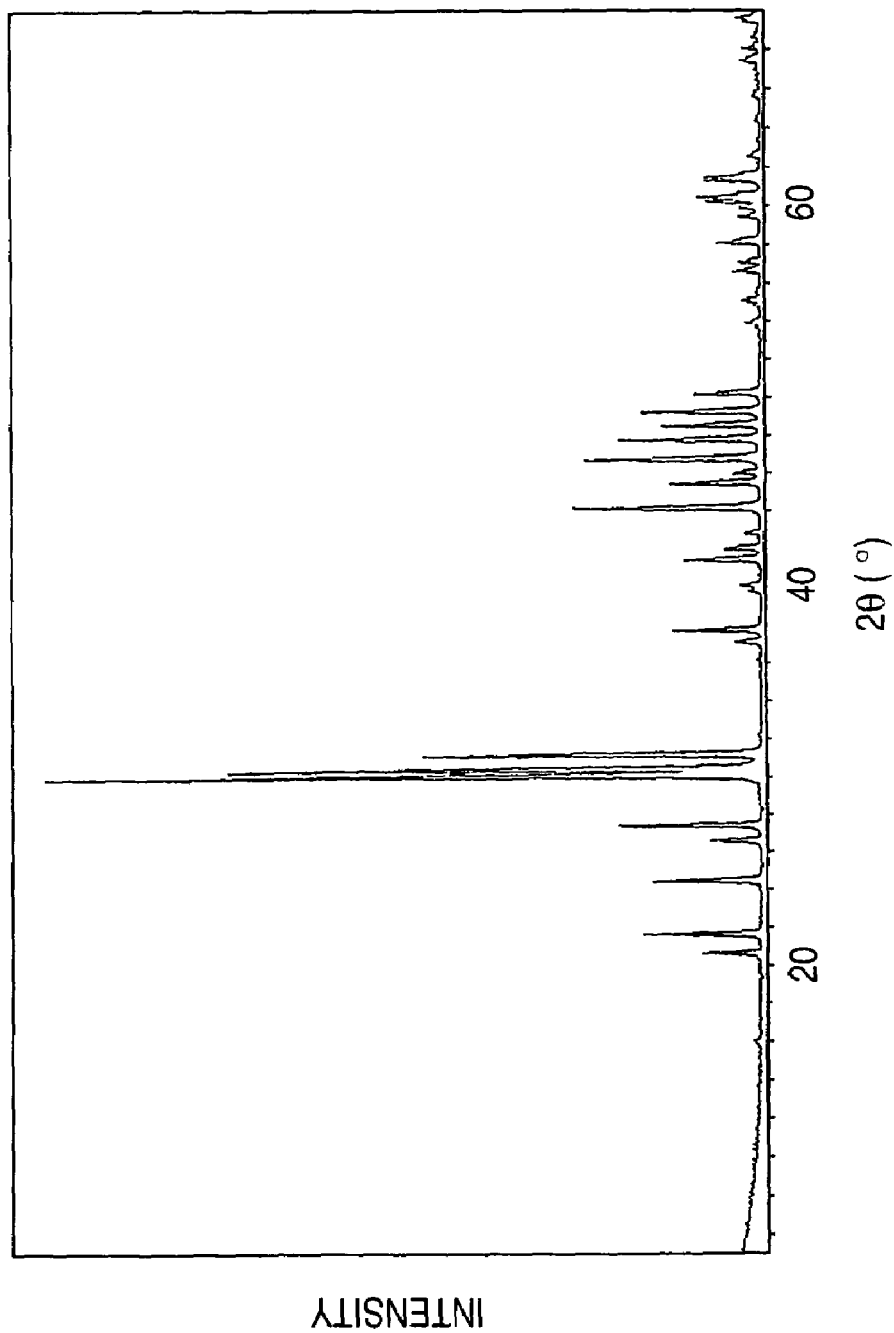
FIG. 15 is an X-ray diffraction pattern (X-ray source: Cu Kα) of the phosphor of Example 10 of the present invention.

The X-ray diffraction pattern of the resulting phosphor is shown in FIG. 15. From the diagram, it has been found that the peak pattern of FIG. 15 is crystallographically identical to that of $Sr_5(PO_4)_3Cl$ of FIG. 1.

The resulting phosphor was excited at 400 nm, that is, a dominant wavelength of the ultraviolet region of a GaN light emitting diode and its emission spectrum was measured. The wavelength of its emission peak and relative emission intensity (i) are shown in Table 1.

The Eu—Eu mean distance was 18.2 Å.

Comparative Example 1

With pure water, 0.0103 mole of $BaCO_3$, basic magnesium carbonate (0.0103 mole as Mg) and 0.0570 mole of $\gamma$-$Al_2O_3$ and as an element source compound for an emission center ion, 0.00057 mole of $Eu_2O_3$ were pulverized and mixed in a wet-type ball mill made of alumina and containing beads. After drying, the resulting mixture was caused to pass through a nylon mesh. The pulverized mixture was sintered by heating at 1500° C. for 2 hours in an alumina crucible under a nitrogen gas stream containing 4% of hydrogen. The sintered body was then washed with water, dried and classified, whereby a blue light emitting phosphor $Ba_{0.9}Eu_{0.1}MgAl_{10}O_{17}$ was prepared.

The emission spectrum of the resulting phosphor excited at 400 nm, that is, a dominant wavelength of the ultraviolet region of a GaN light emitting diode is shown in FIG. 5. The performance of the blue light emitting phosphor obtained in Comparative Example 1 and that obtained in Example 1 was compared.

In Table 1, the wavelength of the emission peak and relative emission intensity (i) when the phosphor was excited at 400 nm, that is, a dominant wavelength in the ultraviolet region of a GaN light emitting diode are shown. From the table, it has been found that the emission intensity of the phosphor of Example 1 is 5.1 times that of the phosphor obtained in Comparative Example 1, when excited at 400 nm.

Comparative Example 2

In a similar manner to Example 1 except for the use of 0.0897 mole of $SrHPO_4$, 0.0325 mole of $BaCO_3$, 0.0176 mole of $CaCO_3$, basic magnesium carbonate (0.00088 mole as Mg), 0.0176 mole of $BaCl_2$, 0.0158 mole of $BaHPO_4$, and 0.00088 mole of $Eu_2O_3$ as raw materials instead, a phosphor $Sr_{2.55}Ba_{1.875}Ca_{0.5}Mg_{0.025}Eu_{0.05}(PO_4)_3Cl$ was prepared.

The emission spectrum of the resulting phosphor excited at 400 nm, that is, a dominant wavelength of the ultraviolet region of a GaN light emitting diode is shown in FIG. 5. The performance of the blue light emitting phosphor obtained in Comparative Example 2 and that obtained in Example 1 was compared.

In Table 1, the wavelength of the emission peak and relative emission intensity (i) when the phosphor was excited at 400 nm, that is, a dominant wavelength in the ultraviolet region of a GaN light emitting diode are shown. It has been found from the table that the emission intensity of the phosphor of Example 1 is 5.1 times that of the phosphor obtained in Comparative Example 2, when excited at 400 nm.

TABLE 1

|  | Chemical composition of phosphor | Wavelength (nm) of emission peak when excited at 400 nm | Relative emission intensity (i) when excited at 400 nm | $\alpha_q$ | $\alpha_q \cdot \eta_i$ |
| --- | --- | --- | --- | --- | --- |
| Ex. 1 | $Sr_{4.5}Eu_{0.5}(PO_4)_3Cl$ | 446 | 507 | 0.919 | 0.677 |
| Ex. 2 | $Sr_4Eu_1(PO_4)_3Cl$ | 447 | 492 | 0.954 | 0.602 |
| Ex. 3 | $Sr_{3.5}Eu_{1.5}(PO_4)_3Cl$ | 449 | 419 | 0.967 | 0.482 |
| Ex. 4 | $Sr_3Eu_2(PO_4)_3Cl$ | 449 | 341 | 0.975 | 0.367 |

TABLE 1-continued

| | Chemical composition of phosphor | Wavelength (nm) of emission peak when excited at 400 nm | Relative emission intensity (i) when excited at 400 nm | $\alpha_q$ | $\alpha_q \cdot \eta_i$ |
|---|---|---|---|---|---|
| Ex. 5 | $Sr_{4.875}Ca_{0.05}Mg_{0.025}Eu_{0.05}(PO_4)_3Cl$ | 445 | 323 | 0.782 | 0.506 |
| Ex. 6 | $Sr_{4.125}Ba_{0.75}Mg_{0.075}Eu_{0.05}(PO_4)_3Cl$ | 445 | 290 | — | — |
| Ex. 7 | $Sr_2Eu_3(PO_4)_3Cl$ | 451 | 265 | 0.978 | 0.251 |
| Ex. 8 | $Sr_{0.5}Eu_{4.5}(PO_4)_3Cl$ | 453 | 196 | 0.998 | 0.150 |
| Ex. 9 | $Sr_{3.86}Ba_{0.5}Ca_{0.565}Mg_{0.025}Eu_{0.05}(PO_4)_3Cl$ | 446 | 201 | — | — |
| Ex. 10 | $Sr_{3.345}Ba_{1.08}Ca_{0.5}Mg_{0.025}Eu_{0.05}(PO_4)_3Cl$ | 446 | 159 | — | — |
| Comp. Ex. 1 | $Ba_{0.9}Eu_{0.1}MgAl_{10}O_{17}$ | 450 | 100 | — | — |
| Comp. Ex. 2 | $Sr_{2.55}Ba_{1.875}Ca_{0.5}Mg_{0.025}Eu_{0.05}(PO_4)_3Cl$ | 449 | 99 | — | — |

Example 11

In a similar manner to Example 1 except that the amounts of $SrHPO_4$, $SrCl_2$, $Eu_2O_3$ and $(NH_4)_2HPO_4$ were changed, a phosphor $Sr_{(5-x)}Eu_x(PO_4)_3Cl$ with x falling within a range of from 0.05 to 5 was prepared. The phosphor thus obtained was exposed to light of 254 nm and 400 nm and each emission spectrum was measured.

Figure 18:
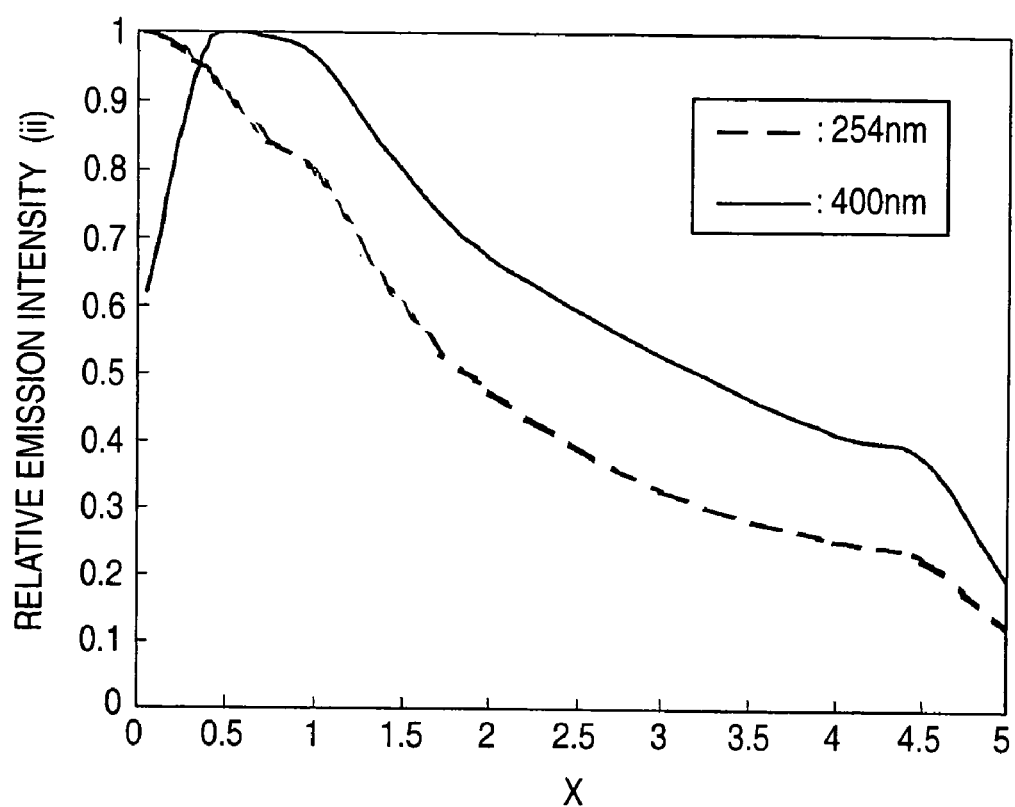
FIG. 18 illustrates the relationship between x of $Sr_{(5-x)}Eu_x(PO_4)_3Cl$ and emission intensity upon excitation at each of 254 nm and 400 nm.

In FIG. 18, the relationship between x and the emission intensity when excited at each of 254 nm and 400 nm is shown.

The relative emission intensity (ii) used here means emission intensity at the concentration of x provided that the maximum emission intensity at each of 254 nm and 400 nm is 1.

From FIG. 18, it has been found that the Eu concentrations (mole numbers) x at the maximum emission intensity excited at 400 nm and 254 nm were 0.5 and $\leq 0.05$, respectively and the former is greater than the latter. It has also been found that in Examples 1 to 4, 7 and 8, each Eu concentration is at least 1.1 times that ($\leq 0.05$) at the maximum emission intensity upon excitation at 254 nm and it falls within a range of from 0.5 to 9 times that (0.5) at the maximum emission intensity upon excitation at 400 nm.

Example 12

Calcium chloride dihydrate (0.01382 mole) and 0.00028 mole of europium chloride hexahydrate were weighed and dissolved in 20 ml of water. To the resulting aqueous solution was added 85% phosphoric acid in an amount of 0.00846 mole in terms of phosphoric acid. The resulting mixture was transferred into a magnetic dish to give a total amount of from 30 to 40 ml. The solution was heated and dried under stirring. The solid remained after drying was collected and pulverized in an agate mortar. A portion of the pulverized product was transferred to an alumina crucible and sintered at 1000° C. for 2 hours under a nitrogen gas stream containing 4% of hydrogen, whereby a phosphor $Ca_{4.9}Eu_{0.1}(PO_4)_3Cl$ was prepared.

In Table 2, the wavelength of the emission peak and relative emission intensity (i) when the phosphor was excited at 400 nm, that is, a dominant wavelength in the ultraviolet region of a GaN light emitting diode are shown.

With regards to $Ca_{(5-x)}Eu_x(PO_4)_3Cl$, the number of Eu(s) per volume of the crystalline matrix was determined from x and the volume of a unit lattice calculated based on the lattice constant of the hexagonal system: a=9.54 Å, b=9.54 Å and c=6.86 Å and the reciprocal of the number was raised to the ⅓rd power to calculate the Eu—Eu mean distance. As a result, the Eu—Eu mean distance in $Ca_{4.9}Eu_{0.1}(PO_4)_3Cl$ was 13.9 Å.

Example 13

Calcium chloride dihydrate (0.01325 mole) and 0.00055 mole of europium chloride hexahydrate were weighed and dissolved in 20 ml of water. To the resulting aqueous solution was added 85% phosphoric acid in an amount of 0.00828 mole in terms of phosphoric acid. The resulting mixture was transferred into a magnetic dish to give a total amount of from 30 to 40 ml. The solution was heated and dried under stirring. The solid remained after drying was treated in a similar manner to Example 12, whereby a phosphor $Ca_{4.8}Eu_{0.2}(PO_4)_3Cl$ was prepared.

In Table 2, the wavelength of the emission peak and relative emission intensity (i) when the phosphor was excited at 400 nm, that is, a dominant wavelength in the ultraviolet region of a GaN light emitting diode are shown.

The Eu—Eu mean distance was 11.1 Å.

Example 14

Calcium chloride dihydrate (0.0122 mole) and 0.00106 mole of europium chloride hexahydrate were weighed and dissolved in 20 ml of water. To the resulting aqueous solution was added 85% phosphoric acid in an amount of 0.00796 mole in terms of phosphoric acid. The resulting mixture was transferred into a magnetic dish to give a total amount of from 30 to 40 ml. A 35% aqueous hydrochloric acid solution (50 mL) was added dropwise, followed by heating and drying under stirring. The solid remained after drying was treated in a similar manner to Example 12, whereby a phosphor $Ca_{4.6}Eu_{0.4}(PO_4)_3Cl$ was prepared.

In Table 2, the wavelength of the emission peak and relative emission intensity (i) when the phosphor was excited at 400 nm, that is, dominant wavelength in the ultraviolet region of a GaN light emitting diode are shown.

The Eu—Eu mean distance was 8.8 Å.

Example 15

Calcium chloride dihydrate (0.0117 mole) and 0.0013 mole of europium chloride hexahydrate were weighed and dissolved in 20 ml of water. To the resulting aqueous solution was added 85% phosphoric acid in an amount of 0.0078 mole in terms of phosphoric acid. The resulting mixture was transferred into a magnetic dish to give a total amount of from 30 to 40 ml. A 35% aqueous hydrochloric acid solution (50 mL) was added dropwise, followed by heating and drying under stirring. The solid remained after drying was treated in a similar manner to Example 12, whereby a phosphor $Ca_{4.5}Eu_{0.5}(PO_4)_3Cl$ was prepared.

In Table 2, the wavelength of the emission peak and relative emission intensity (i) when the phosphor was excited at 400 nm, that is, dominant wavelength in the ultraviolet region of a GaN light emitting diode are shown.

The Eu—Eu mean distance was 8.2A.

Example 16

Calcium chloride dihydrate (0.01054 mole) and 0.00186 mole of europium nitrate hexahydrate were weighed and dissolved in 20 ml of water. To the resulting aqueous solution was added 85% phosphoric acid in an amount of 0.00744 mole in terms of phosphoric acid. The resulting mixture was transferred into a magnetic dish to give a total amount of from 30 to 40 ml. A 35% aqueous hydrochloric acid solution (100 mL) was added dropwise, followed by heating and drying under stirring. The solid remained after drying was treated in a similar manner to Example 12, whereby a phosphor $Ca_{4.25}Eu_{0.75}(PO_4)_3Cl$ was prepared. The X-ray diffraction pattern of the resulting phosphor was found to be crystallographically identical to that of $Ca_5(PO_4)_3Cl$.

In Table 2, the wavelength of the emission peak and relative emission intensity (i) when the phosphor was excited at 400 nm, that is, a dominant wavelength in the ultraviolet region of a GaN light emitting diode are shown.

The Eu—Eu mean distance was 7.1 Å.

Example 17

Calcium chloride dihydrate (0.00948 mole) and 0.00237 mole of europium nitrate hexahydrate were weighed and dissolved in 20 ml of water. To the resulting aqueous solution was added 85% phosphoric acid in an amount of 0.00711 mole in terms of phosphoric acid. The resulting mixture was transferred into a magnetic dish to give a total amount of from 30 to 40 ml. A 35% aqueous hydrochloric acid solution (150 mL) was added dropwise, followed by heating and drying under stirring. The solid remained after drying was treated in a similar manner to Example 12, whereby a phosphor $Ca_4Eu_1(PO_4)_3Cl$ was prepared.

In Table 2, the wavelength of the emission peak and relative emission intensity (i) when the phosphor was excited at 400 nm, that is, a dominant wavelength in the ultraviolet region of a GaN light emitting diode are shown.

The Eu—Eu mean distance was 6.5 Å.

TABLE 2

| | Chemical composition of phosphor | Wavelength (nm) of emission peak when excited at 400 nm | Relative emission intensity (i) when excited at 400 nm |
|---|---|---|---|
| Ex. 12 | $Ca_{4.9}Eu_{0.1}(PO_4)_3Cl$ | 456 | 305 |
| Ex. 13 | $Ca_{4.8}Eu_{0.2}(PO_4)_3Cl$ | 457 | 312 |
| Ex. 14 | $Ca_{4.6}Eu_{0.4}(PO_4)_3Cl$ | 459 | 356 |
| Ex. 15 | $Ca_{4.5}Eu_{0.5}(PO_4)_3Cl$ | 460 | 334 |
| Ex. 16 | $Ca_{4.25}Eu_{0.75}(PO_4)_3Cl$ | 462 | 400 |
| Ex. 17 | $Ca_4Eu_1(PO_4)_3Cl$ | 463 | 315 |

Example 18

Calcium chloride dihydrate (0.00948 mole) and 0.00237 mole of europium nitrate hexahydrate were weighed and dissolved in 20 ml of water. To the resulting aqueous solution was added 85% phosphoric acid as phosphoric acid. In a similar manner to Example 12 except that the amounts of calcium chloride, europium nitrate, europium chloride, phosphoric acid and hydrochloric acid were changed, a phosphor $Ca_{(5-x)}Eu_x(PO_4)_3Cl$ with x falling within a range of from 0.01 to 1.25 was prepared. The resulting phosphor was exposed to light of each of 254 nm and 400 nm to measure its emission spectrum.

Figure 19:
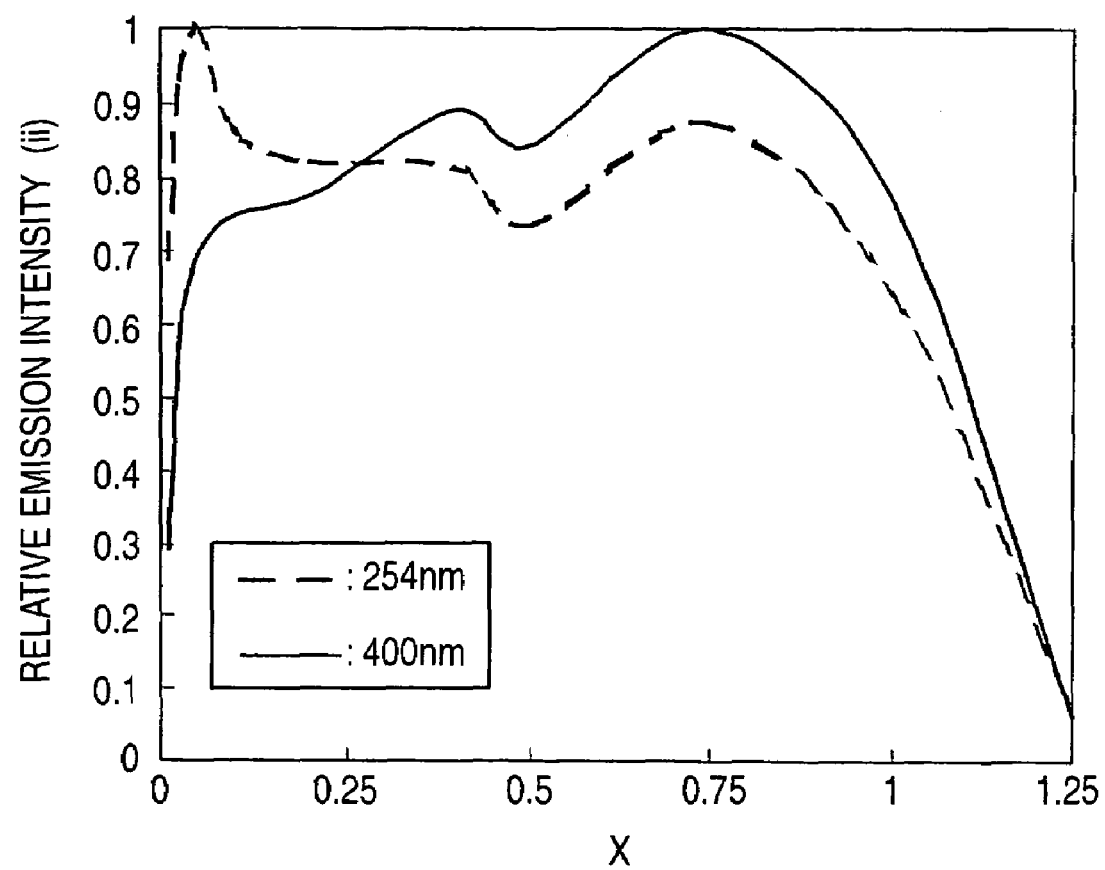
FIG. 19 illustrates the relationship between x of $Ca_{(5-x)}Eu_x(PO_4)_3Cl$ and emission intensity upon excitation at each of 254 nm and 400 nm.

The relationship between x and the emission intensity when the phosphor was excited at each of 254 nm and 400 nm is shown in FIG. 19.

The relative emission intensity (ii) used here means emission intensity at the concentration x provided that the maximum emission intensity at each of 254 nm and 400 nm is 1.

From FIG. 19, it has been found that the Eu concentrations (mole numbers) at the maximum emission intensity when the phosphor was excited at 400 nm and 254 nm were 0.75 and 0.05, respectively, and the former is greater than the latter. It has also been found that the Eu concentrations in Examples 14 to 17 are each at least 1.1 times the Eu concentration (<0.05) at the maximum emission intensity upon excitation at 254 nm and it falls within a range of from 0.5 to 9 times the Eu concentration (0.5) at the maximum emission intensity upon excitation at 400 nm.

Example 19

With pure water, 0.00798 mole of $BaCO_3$, basic magnesium carbonate (0.0114 mole as Mg), 0.0570 mole of $\gamma$-$Al_2O_3$, and 0.00171 mole of $Eu_2O_3$ were pulverized and mixed in a wet-type ball mill made of alumina and containing beads. After drying, the resulting mixture was caused to pass through a nylon mesh. The pulverized mixture was sintered by heating at 1600° C. for 2 hours in an alumina crucible under a nitrogen gas stream containing 4% of hydrogen. The sintered body was then washed with water, dried and classified, whereby a blue light emitting phosphor $Ba_{0.7}Eu_{0.3}MgAl_{10}O_{17}$ was prepared.

The resulting phosphor was excited at 400 nm, that is, a dominant wavelength in the ultraviolet region of a GaN light emitting diode and 254 nm, that is, a dominant wavelength of a low-pressure mercury lamp to be used for ordinary fluorescent lamps, whereby the emission spectra were measured. In Table 3, the wavelength of the emission peak when the phosphor was excited at 400 nm and the relative emission intensity (i) when the phosphor was excited at each of 400 nm and 254 nm are shown.

With regards to $Ba_{(1-x)}Eu_xMgAl_{10}O_{17}$, the number of Eu(s) per volume of the crystalline matrix determined from the x and the volume of a unit lattice calculated based on the lattice constant of the hexagonal system: a=5.628 Å, b=5.628 Å and c=22.66 Å and the reciprocal of the number was raised to the ⅓rd power to calculate the Eu—Eu mean distance. As a result, the Eu—Eu mean distance in $Ba_{0.7}Eu_{0.3}MgAl_{10}O_{17}$ was 10.1 Å.

Example 20

In a similar manner to Example 19 except for the use of 0.00570 mole of $BaCO_3$, basic magnesium carbonate (0.0114 mole as Mg), 0.0570 mole of $\gamma$-$Al_2O_3$, and 0.00285 mole of $Eu_2O_3$ as raw materials instead, a phosphor $Ba_{0.5}Eu_{0.5}MgAl_{10}O_{17}$ was prepared.

Figure 21:
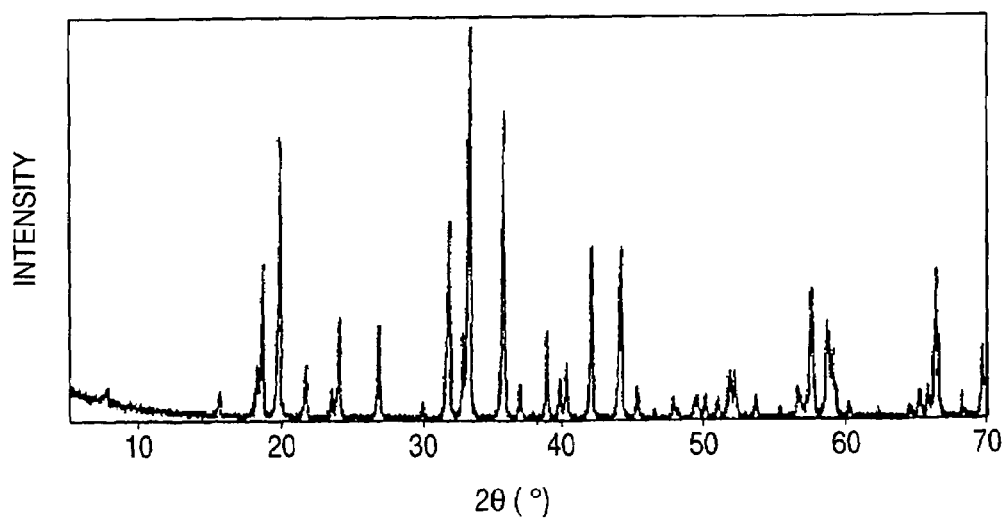
FIG. 21 is an X-ray diffraction pattern (X-ray source: Cu Kα) of the phosphor obtained in Example 20 of the present invention.

The X-ray diffraction pattern of the resulting phosphor is shown in FIG. 21. From this diagram, it has been found that the peak pattern of FIG. 21 is crystallographically identical to that of $BaMgAl_{10}O_{17}$ of FIG. 20.

The resulting phosphor was excited at 400 nm, that is, a dominant wavelength in the ultraviolet region of a GaN light emitting diode and at 254 nm, that is, a dominant wavelength of a low-pressure mercury lamp to be used for ordinary fluorescent lamps, whereby the emission spectra were measured. In Table 3, the wavelength of the emission peak when the phosphor was excited at 400 nm and the relative emission intensity (i) when the phosphor was excited at each of 400 nm and 254 nm are shown.

The Eu—Eu mean distance was 8.5 Å.

Example 21

In a similar manner to Example 19 except for the use of 0.00912 mole of $BaCO_3$, basic magnesium carbonate (0.0114 mole as Mg), 0.0570 mole of γ-$Al_2O_3$, and 0.00114 mole of $Eu_2O_3$ as raw materials instead, a phosphor $Ba_{0.8}Eu_{0.2}MgAl_{10}O_{17}$ was prepared.

The resulting phosphor was excited at 400 nm, that is, a dominant wavelength in the ultraviolet region of a GaN light emitting diode and at 254 nm, that is, a dominant wavelength of a low-pressure mercury lamp to be used for ordinary fluorescent lamps, whereby the emission spectra were measured. In Table 3, the wavelength of the emission peak when the phosphor was excited at 400 nm and the relative emission intensity (i) when the phosphor was excited at each of 400 nm and 254 nm are shown.

The Eu—Eu mean distance was 11.6 Å.

Example 22

In a similar manner to Example 19 except for the use of 0.00502 mole of $BaCO_3$, 0.00410 mole of $CaCO_3$, basic magnesium carbonate (0.0114 mole as Mg), 0.0570 mole of γ-$Al_2O_3$, and 0.00114 mole of $Eu_2O_3$ as raw materials instead, a phosphor $Ba_{0.44}Ca_{0.36}Eu_{0.2}MgAl_{10}O_{17}$ was prepared.

The resulting phosphor was excited at 400 nm, that is, a dominant wavelength in the ultraviolet region of a GaN light emitting diode to measure its emission spectrum. In Table 3, the wavelength of the emission peak and the relative emission intensity (i) when the phosphor was excited at 400 nm are shown.

The Eu—Eu mean distance was 11.6 Å.

Example 23

In a similar manner to Example 19 except for the use of 0.00502 mole of $BaCO_3$, 0.00410 mole of $SrCO_3$, basic magnesium carbonate (0.0114 mole as Mg), 0.0570 mole of γ-$Al_2O_3$, 0.00114 mole of $Eu_2O_3$ as raw materials instead, a phosphor $Ba_{0.44}Sr_{0.36}Eu_{0.2}MgAl_{10}O_{17}$ was prepared.

The resulting phosphor was excited at 400 nm, that is, a dominant wavelength in the ultraviolet region of a GaN light emitting diode to measure its emission spectrum. In Table 3, the wavelength of the emission peak and the relative emission intensity (i) when the phosphor was excited at 400 nm are shown.

The Eu—Eu mean distance was 11.6 Å.

Comparative Example 3

In a similar manner to Example 19 except for the use of 0.0103 mole of $BaCO_3$, basic magnesium carbonate (0.0114 mole as Mg), 0.0570 mole of γ-$Al_2O_3$, and 0.00057 mole of $Eu_2O_3$ as raw materials instead, a phosphor $Ba_{0.9}Eu_{0.1}MgAl_{10}O_{17}$ having a composition similar to that of the commercially available blue light emitting phosphor was prepared.

The resulting phosphor was excited at 400 nm, that is, a dominant wavelength in the ultraviolet region of a GaN light emitting diode and at 254 nm, that is, a dominant wavelength of a low-pressure mercury lamp to be used for ordinary fluorescent lamps, whereby the emission spectra were measured. In Table 3, the wavelength of the emission peak when the phosphor was excited at 400 nm and the relative emission intensity (i) when the phosphor was excited at each of 400 nm and 254 nm are shown. It has been found from the table that the emission intensity of the phosphor of Example 19 was 1.9 times that of the phosphor obtained in Comparative Example, when they were excited at 400 nm.

The Eu—Eu mean distance was 14.6 Å.

TABLE 3

| | Chemical composition of phosphor | Emission peak wavelength (nm) when excited at 400 nm | Relative emission intensity (i) when excited at 400 nm | Relative emission intensity (i) when excited at 254 nm |
|---|---|---|---|---|
| Ex. 19 | $Ba_{0.7}Eu_{0.3}MgAl_{10}O_{17}$ | 457 | 1.9 | 0.92 |
| Ex. 20 | $Ba_{0.5}Eu_{0.5}MgAl_{10}O_{17}$ | 459 | 1.8 | 0.72 |
| Ex. 21 | $Ba_{0.8}Eu_{0.2}MgAl_{10}O_{17}$ | 456 | 1.5 | 0.98 |
| Ex. 22 | $Ba_{0.44}Ca_{0.36}Eu_{0.2}MgAl_{10}O_{17}$ | 453 | 1.7 | — |
| Ex. 23 | $Ba_{0.44}Ca_{0.36}Eu_{0.2}MgAl_{10}O_{17}$ | 455 | 1.6 | — |
| Comp. Ex. 3 | $Ba_{0.9}Eu_{0.1}MgAl_{10}O_{17}$ | 453 | 1 | 1 |

Example 24

In a similar manner to Example 19 except that the amounts of $BaCO_3$, basic magnesium carbonate, γ-$Al_2O_3$ and $Eu_2O_3$ were changed, a phosphor $Ba_{(1-x)}Eu_xMgAl_{10}O_{17}$ with the x falling within a range of from 0 to 1 was prepared. The resulting phosphor was exposed to light of 254 nm and 400 nm to measure the emission spectra.

Figure 22:
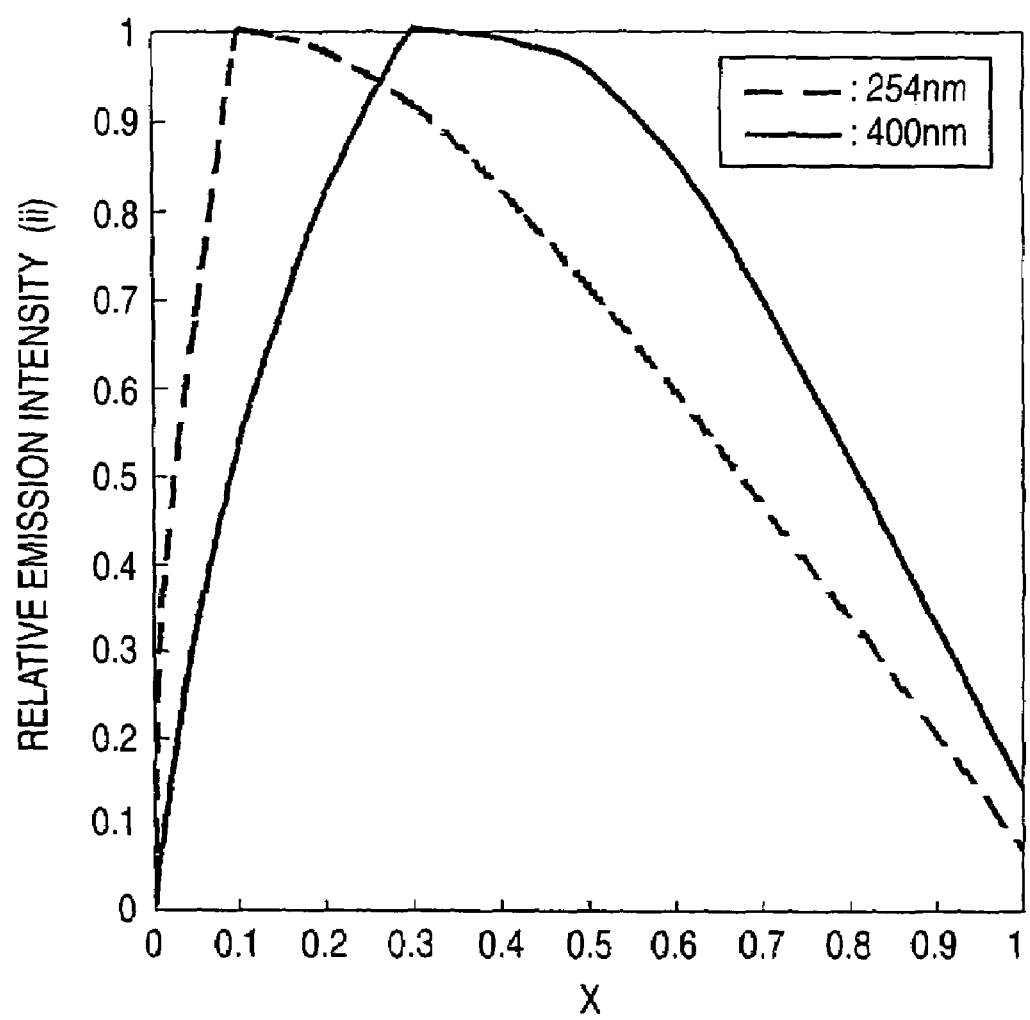
FIG. 22 illustrates the relationship between x of $Ba_{(1-x)}Eu_xMgAl_{10}O_{17}$ and emission intensity upon excitation at each of 254 nm and 400 nm.

In FIG. 22, the relationship between the x and emission intensity when the phosphor was excited at each of 254 nm and 400 nm is shown.

In this system, Eu can be substituted for the Ba site so that a ratio of the actual substitution number of Eu to the number of all the sites for which Eu can be substituted is x. The relative emission intensity (ii) here means emission intensity at the concentration x provided that the maximum emission intensities at 254 nm and 400 nm are each 1.

It has been found from FIG. 22 that the Eu concentrations (mole numbers) x at the maximum emission intensity when the phosphor was excited at 400 nm and 254 nm are 0.3 and 0.1, respectively, and the former is greater than the latter. It has also been found that the Eu concentrations of Examples 19 to 23 are each at least 1.1 times the Eu concentration (0.1) at the maximum emission intensity upon excitation at 254 nm, and it falls within a range of from 0.5 to 9 times the Eu concentration (0.3) at the maximum emission intensity upon excitation at 400 nm.

Figure 23:
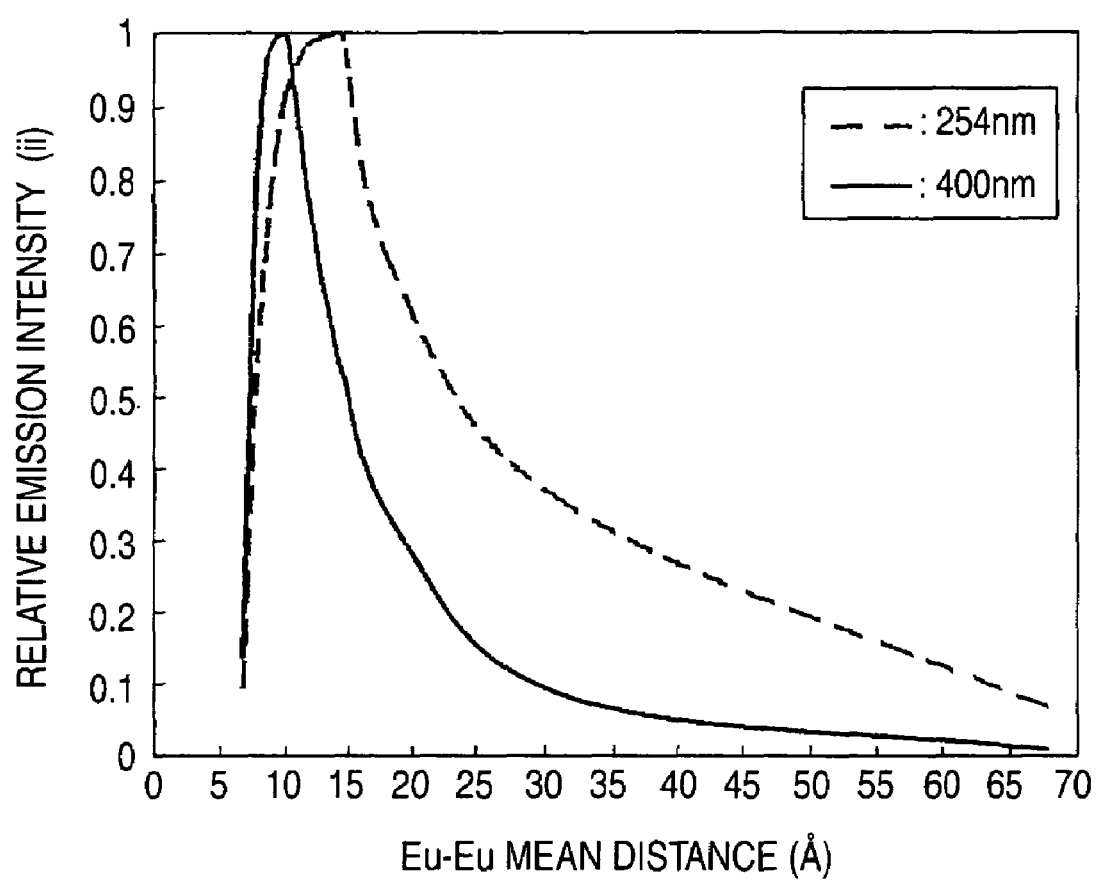
FIG. 23 illustrates the relationship between Eu—Eu mean distance of $Ba_{(1-x)}Eu_xMgAl_{10}O_{17}$ and emission intensity upon excitation at each of 254 nm and 400 nm.

The relationship between the Eu—Eu mean distance of each of these phosphors and the emission intensity when they are excited at each of 254 nm and 400 nm is shown in FIG. 23. The relative emission intensity (ii) here means emission intensity at an Eu—Eu mean distance provided that the maximum emission intensities upon excitation at 254 nm and 400 nm are 1, respectively. The Eu—Eu mean distance when the emission intensity reached the maximum one upon excitation at 400 nm was 10.12 Å. The Eu—Eu mean distance when the emission intensity reached the maximum one upon excitation at 254 nm was 14.59 Å, suggesting that it is longer than the Eu—Eu mean distance when the emission intensity reached the maximum one upon excitation at 400 nm.

Example 25

With pure water, 0.0553 mole of $BaCO_3$, 0.0186 mole (as Mg) of basic magnesium carbonate, 0.0372 mole of $SiO_2$, and 0.00018 mole of $Eu_2O_3$ were pulverized and mixed in a wet-type ball mill made of alumina and containing beads. After drying, the resulting mixture was caused to pass through a nylon mesh. The pulverized mixture was sintered by heating at 1200° C. for 2 hours in an alumina crucible under a nitrogen gas stream containing 4% of hydrogen. The sintered body was then washed with water, dried and classified, whereby a phosphor was prepared.

Figure 27:
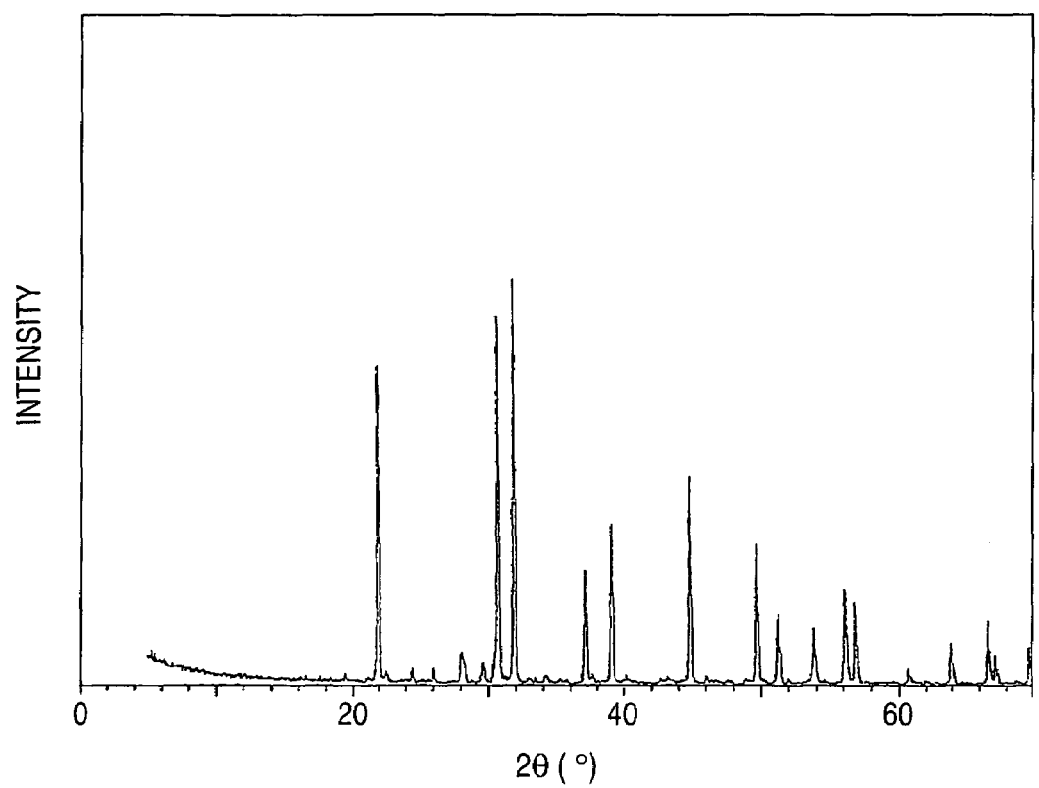
FIG. 27 is an X-ray diffraction pattern (X-ray source: Cu Kα) of the phosphor obtained in Example 25.

The X-ray diffraction pattern of the resulting phosphor $Ba_{2.98}Eu_{0.02}MgSi_2O_8$ is shown in FIG. 27. It suggests that the peak pattern of FIG. 27 is crystallographically identical to that of $Ba_3MgSi_2O_8$ of FIG. 24.

Figure 28:
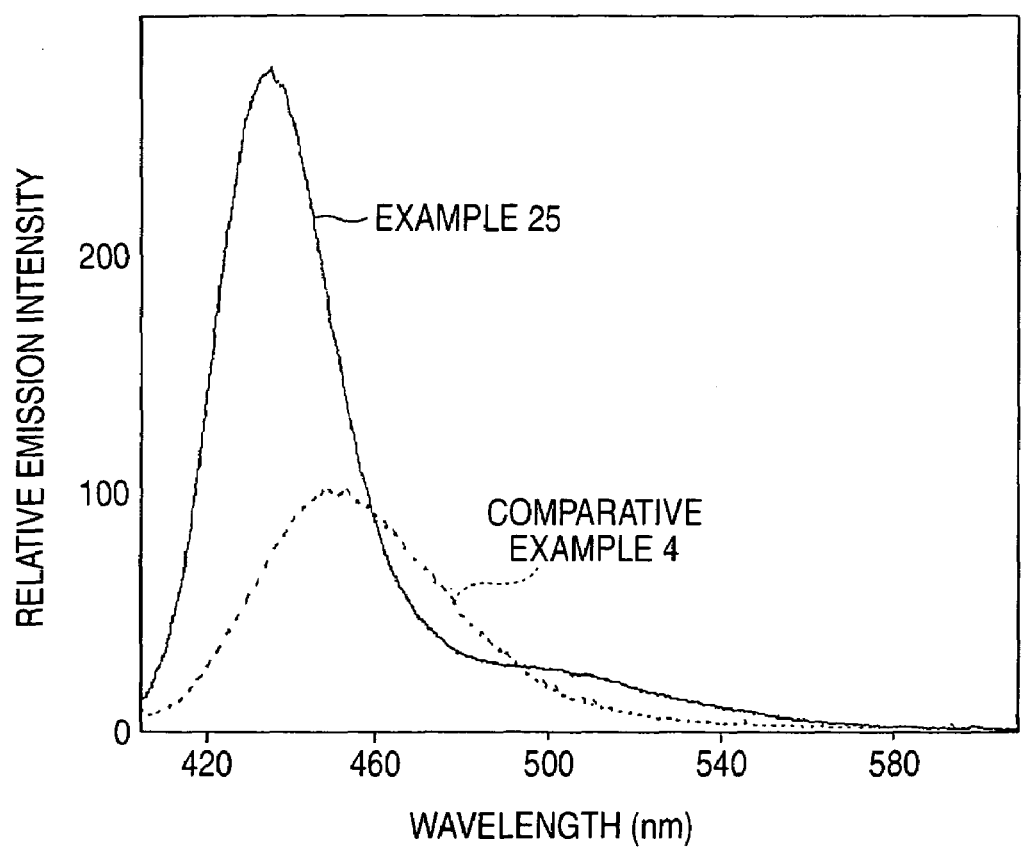
FIG. 28 illustrates an emission spectrum when a GaN light emitting diode having an emission wavelength of 400 nm is used in combination with the phosphor of Example 2 of the present invention or the phosphor of Comparative Example 4.

The emission spectrum of the resulting phosphor excited at 400 nm, that is, a dominant wavelength of the ultraviolet region of a GaN light emitting diode is shown in FIG. 28. The wavelength of the emission peak and relative emission intensity (i) are shown in Table 4.

Example 26

In a similar manner to Example 25 except for the use of 0.0553 mole of $SrCO_3$ instead of $BaCO_3$, a phosphor was prepared.

Figure 29:
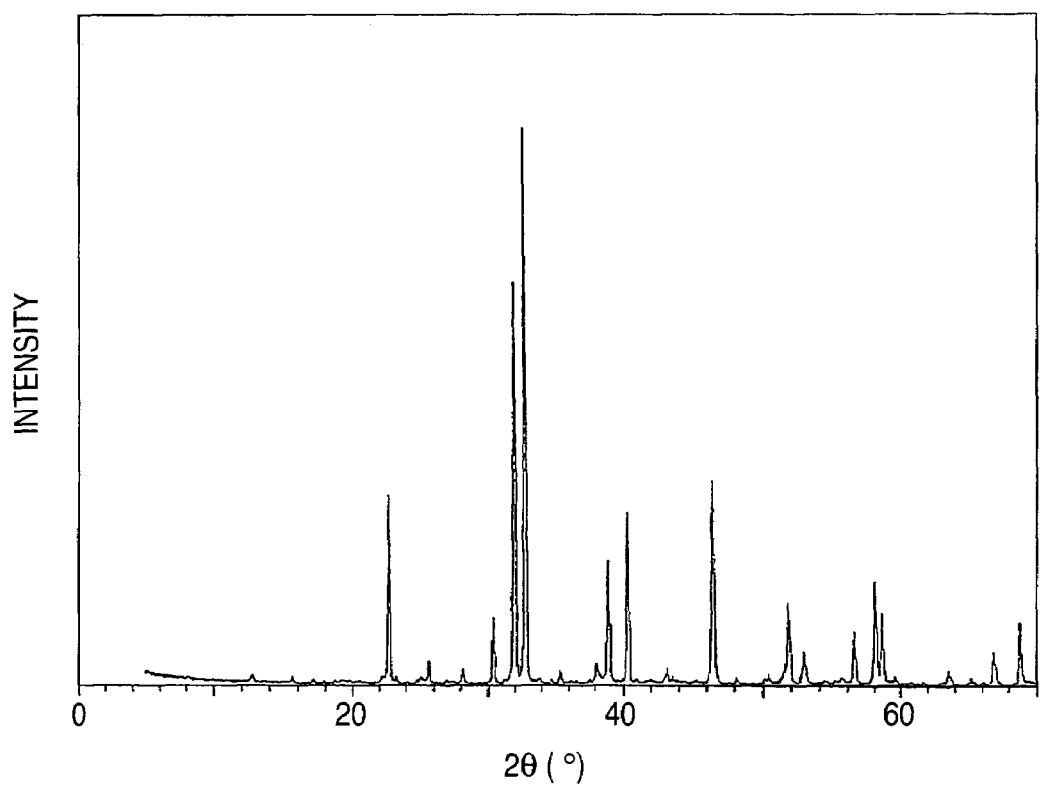
FIG. 29 is an X-ray diffraction pattern (X-ray source: Cu Kα) of the phosphor obtained in Example 26.

The X-ray diffraction pattern of the resulting phosphor $Sr_{2.98}Eu_{0.02}MgSi_2O_8$ is shown in FIG. 29. It has been found that the peak pattern of FIG. 29 is crystallographically identical to that of $Sr_3MgSi_2O_8$ of FIG. 25. The wavelength of the emission peak and relative emission intensity (i) when the phosphor was excited at 400 nm, that is, a predominant wavelength in the ultraviolet region of a GaN light emitting diode are shown in Table 4.

Example 27

In a similar manner to Example 25 except for the use of 0.0442 mole of $BaCO_3$, 0.0084 mole of $CaCO_3$ and 0.0028 mole of $MnCO_3$ instead of $BaCO_3$, a phosphor $Ba_{2.38}Eu_{0.02}Ca_{0.45}Mn_{0.15}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 28

In a similar manner to Example 25 except for the use of 0.0186 mole (as Zn) of basic zinc carbonate instead of basic magnesium carbonate, a phosphor $Ba_{2.98}Eu_{0.02}ZnSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 29

In a similar manner to Example 25 except that the amounts of $BaCO_3$ and $Eu_2O_3$ were changed to 0.0556 mole and 0.000074 mole, respectively, a phosphor $Ba_{2.992}Eu_{0.008}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 30

In a similar manner to Example 25 except that the sintering temperature was changed to 1300° C., a phosphor $Ba_{2.98}Eu_{0.02}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 31

In a similar manner to Example 25 except that the amounts of $BaCO_3$ and $Eu_2O_3$ were changed to 0.0549 mole and 0.00047 mole, respectively, a phosphor $Ba_{2.95}Eu_{0.05}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 32

In a similar manner to Example 25 except that the amounts of $BaCO_3$ and $Eu_2O_3$ were changed to 0.0539 mole and 0.00093 mole, respectively, a phosphor $Ba_{2.9}Eu_{0.1}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 33

In a similar manner to Example 25 except that the amounts of $BaCO_3$ and $Eu_2O_3$ were changed to 0.0530 mole and 0.00140 mole, respectively, a phosphor $Ba_{2.85}Eu_{0.15}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 34

In a similar manner to Example 25 except that the amounts of $BaCO_3$ and $Eu_2O_3$ were changed to 0.0521 mole and 0.00186 mole, respectively, a phosphor $Ba_{2.8}Eu_{0.2}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Example 35

In a similar manner to Example 25 except that the amounts of $BaCO_3$ and $Eu_2O_3$ were changed to 0.0502 mole and 0.00279 mole, respectively, a phosphor $Ba_{2.7}Eu_{0.3}MgSi_2O_8$ was prepared.

The wavelength of the emission peak and relative emission intensity (i) when the phosphor was excited at 400 nm, that is, a predominant wavelength in the ultraviolet region of a GaN light emitting diode are shown in Table 4.

Comparative Example 4

With pure water, 0.0103 mole of $BaCO_3$, 0.0103 mole (as Mg) of basic magnesium carbonate, 0.0570 mole of $\gamma$-$Al_2O_3$, and 0.00057 mole of $Eu_2O_3$ were pulverized and mixed in a wet-type ball mill made of alumina and containing beads. After drying, the resulting mixture was caused to pass through a nylon mesh. The pulverized mixture was sintered by heating at 1500° C. for 2 hours in an alumina crucible under a nitrogen gas stream containing 4% of hydrogen. The sintered body was then washed with water, dried and classified, whereby a blue light emitting phosphor ($Ba_{0.9}Eu_{0.1}MgAl_{10}O_{17}$) was prepared.

The emission spectrum of the resulting phosphor excited at 400 nm, that is, a dominant wavelength of the ultraviolet region of a GaN light emitting diode is shown in FIG. 28 and the performance was compared between the blue light emitting phosphors obtained in Example 25 and Comparative Example 4. The wavelength of the emission peak and relative emission intensity (i) are shown in Table 4. It has been found that the emission intensity of the phosphor obtained in Example 25 was 2.8 times that of the phosphor obtained in Comparative Example 4 when each phosphor was excited at 400 nm.

Comparative Example 5

With pure water, 0.0238 mole of $Y_2O_3$, 0.0400 mole of $\gamma$-$Al_2O_3$, and 0.00048 mole of $CeO_2$ were pulverized and mixed in a wet-type ball mill made of alumina and containing beads. After drying, the resulting mixture was caused to pass through a nylon mesh. The pulverized mixture was sintered by heating at 1500° C. for 2 hours in an alumina crucible under a nitrogen gas stream containing 4% of hydrogen. The sintered body was then washed with water, dried and classified, whereby a yellow-emitting phosphor ($Y_{2.98}Ce_{0.03}Al_5O_{12}$) was prepared.

The wavelength of emission peak and relative emission intensity (i) of the phosphor are shown in Table 4. It has been found that the emission intensity of the phosphor obtained in Example 25 is 250 times that of the phosphor obtained in Comparative Example 5, when these phosphors were excited at 400 nm.

TABLE 4

| Chemical composition of phosphor | Wavelength (nm) of emission peak when excited at 400 nm | Relative emission intensity (i) when excited at 400 nm |
| --- | --- | --- |
| Ex. 25 | $Ba_{2.98}Eu_{0.02}MgSi_2O_8$ | 434 | 277 |
| Ex. 26 | $Sr_{2.98}Eu_{0.02}MgSi_2O_8$ | 455 | 238 |
| Ex. 27 | $Ba_{2.38}Eu_{0.02}Ca_{0.45}Mn_{0.15}MgSi_2O_8$ | 440 | 227 |
| Ex. 28 | $Ba_{2.98}Eu_{0.02}ZnSi_2O_8$ | 436 | 255 |
| Ex. 29 | $Ba_{2.992}Eu_{0.008}MgSi_2O_8$ | 435 | 225 |
| Ex. 30 | $Ba_{2.98}Eu_{0.02}MgSi_2O_8$ | 434 | 277 |
| Ex. 31 | $Ba_{2.95}Eu_{0.05}MgSi_2O_8$ | 438 | 299 |
| Ex. 32 | $Ba_{2.9}Eu_{0.01}MgSi_2O_8$ | 440 | 320 |
| Ex. 33 | $Ba_{2.85}Eu_{0.15}MgSi_2O_8$ | 440 | 261 |
| Ex. 34 | $Ba_{2.8}Eu_{0.02}MgSi_2O_8$ | 440 | 199 |
| Ex. 35 | $Ba_{2.7}Eu_{0.03}MgSi_2O_8$ | 441 | 113 |
| Comp. Ex. 4 | $Ba_{0.9}Eu_{0.1}MgAl_{10}O_{17}$ | 448 | 100 |
| Comp. Ex. 5 | $Y_{2.98}Ce_{0.03}Al_5O_{12}$ | 561 | 1.1 |

Example 36

In a similar manner to Example 25 except that the amounts of $BaCO_3$ and $Eu_2O_3$ were changed, a phosphor $Ba_{(1-x)}Eu_xMgSi_2O_8$ with the x falling within a range of from 0.003 to 2 was prepared. The resulting phosphor was exposed to light of 254 nm and 400 nm to measure emission spectra.

Figure 30:
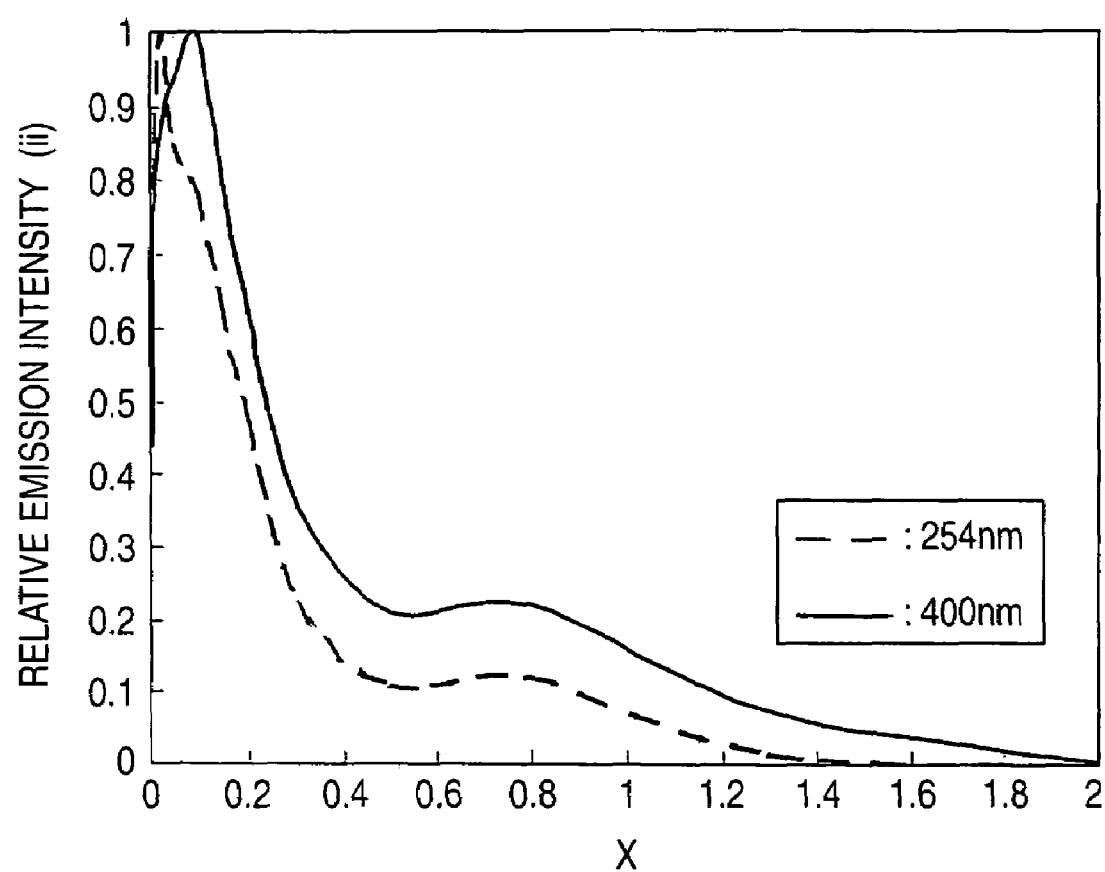
FIG. 30 illustrates the relationship between x of $Ba_{(1-x)}Eu_xMgSi_2O_8$ and emission intensity upon excitation at each of 254 nm and 400 nm.

The relationship between the x and emission intensity upon excitation at each of 254 nm and 400 nm is shown in FIG. 30.

The relative emission intensity (ii) here means emission intensity at the concentration of x provided that the maximum emission intensities at 254 nm and 400 nm are each 1.

From FIG. 30, it has been found that the Eu concentrations (mole numbers) x of the maximum emission intensities upon excitation at 400 nm and 254 nm are 0.1 and 0.02, respectively and the former is greater than the latter. It has also been found that the Eu concentrations in Examples 31 to 35 are each at least 1.1 times the Eu concentration (0.02) at the maximum emission intensity upon excitation at 254 nm and it falls within a range of from 0.5 to 9 times the Eu concentration (0.5) at the maximum emission intensity upon excitation at 400 nm.

Example 37

With pure water, 0.06 mole of $CaHPO_4$, 0.0255 mole of $CaCO_3$, 0.06 mole of $MgHPO_4$, 0.0255 mole of $MgCO_3$ and 0.0045 mole of $Eu_2O_3$ were pulverized and mixed in a wet-type ball mill made of alumina and containing beads After drying, the resulting mixture was caused to pass through a nylon mesh. The pulverized mixture was sintered by heating at 1100° C. for 2 hours in an alumina crucible under a nitrogen gas stream containing 4% of hydrogen. The sintered body was then washed with water, dried and classified, whereby a blue light emitting phosphor $Eu_{0.15}Ca_{1.425}Mg_{1.425}(PO_4)_2$ was prepared.

Figure 31:
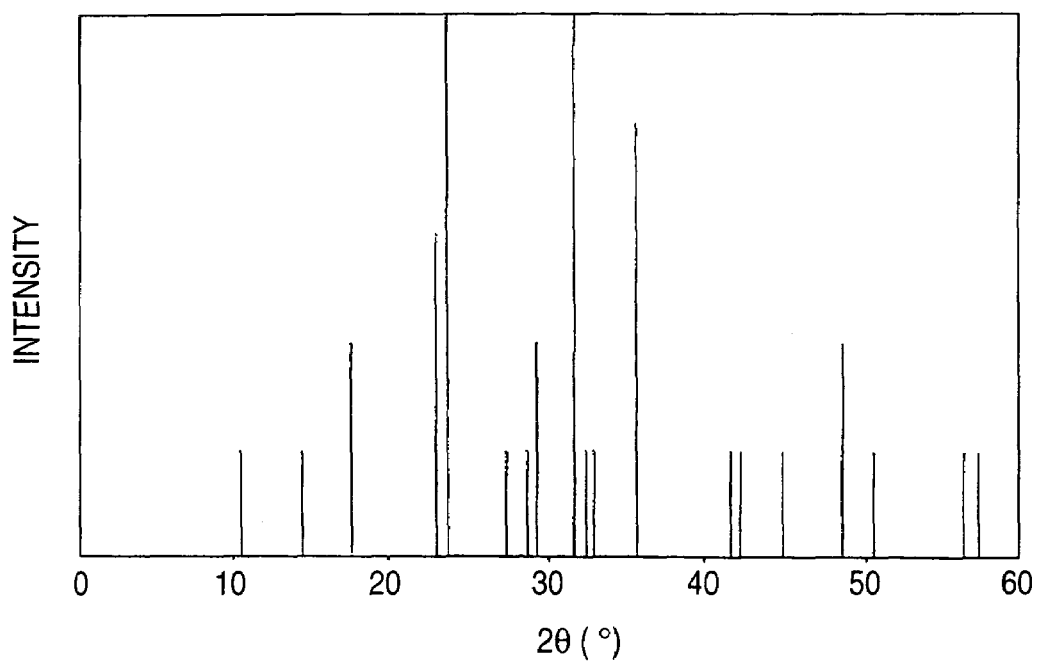
FIG. 31 is an X-ray diffraction pattern (in terms of X-ray source Cu Kα) of $Ca_3Mg_3(PO_4)_4$.
Figure 32:
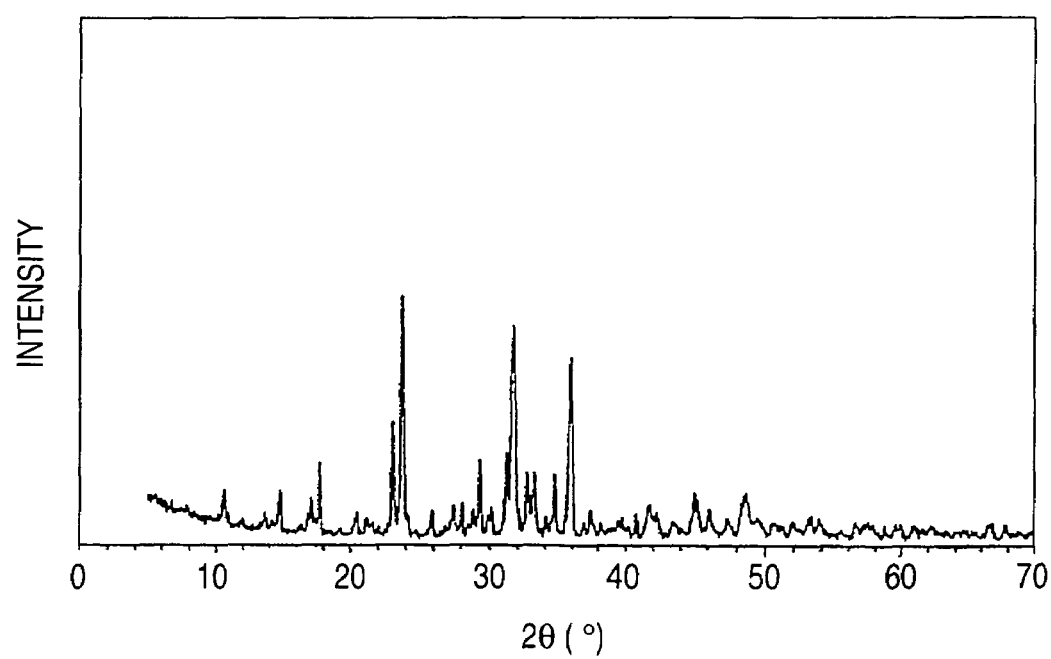
FIG. 32 is an X-ray diffraction pattern (X-ray source: Cu Kα) of the phosphor obtained in Example 37.

The X-ray diffraction pattern of the resulting phosphor is shown in FIG. 32. It suggests that the peak pattern of FIG. 32 is crystallographically identical to that of $Ca_3Mg_3(PO_4)_4$ of FIG. 31.

Figure 33:
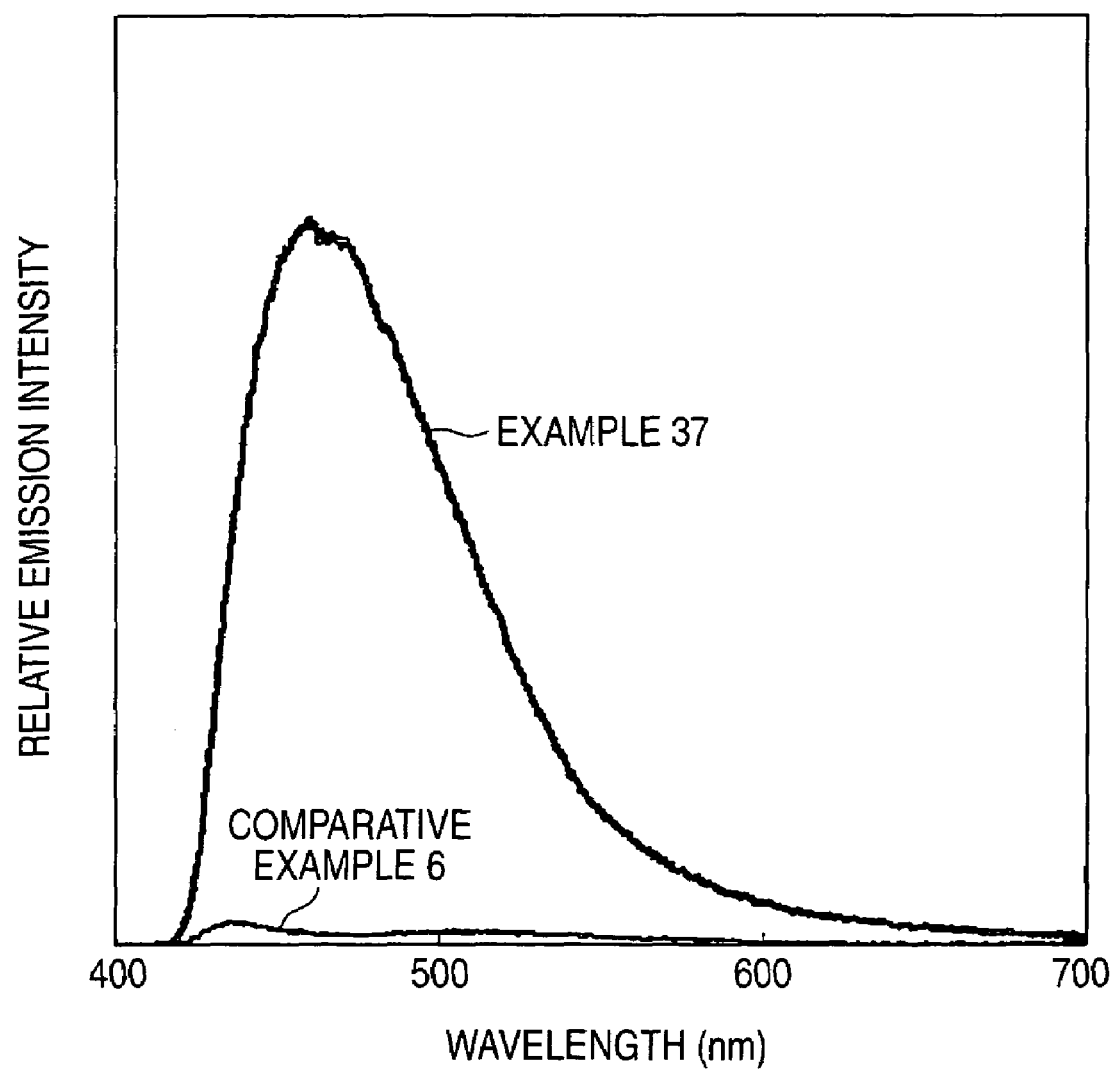
FIG. 33 illustrates, in one diagram, emission spectra of the phosphors of Example 37 and Comparative Example 6, each exposed to a GaN light emitting diode having an emission wavelength of 400 nm.

The emission spectrum of the resulting phosphor excited at 400 nm, that is, a dominant wavelength of the ultraviolet region of a GaN light emitting diode is shown in FIG. 33. In Table 5, the wavelength, relative integrated intensity, half-width, and relative emission intensity (i) of the emission peak, and the relative emission intensity (i) upon excitation at 254 nm are shown.

With regards to $Eu_xCa_{(1.5-0.5x)}Mg_{(1.5-0.5x)}(PO_4)_2$, the number of Eu(s) per volume of crystalline matrix was determined from x and the volume of a unit lattice calculated based on the lattice constant of the hexagonal system: a=7.280 Å, b=7.280 Å, c=7.280 Å, $\alpha$=43.35°, $\beta$=43.35°, and $\gamma$=43.35° and the reciprocal of the number was raised to the ⅓rd power to calculate the Eu—Eu mean distance.

As a result, the Eu—Eu mean distance in $Eu_{0.15}Ca_{1.425}Mg_{1.425}(PO_4)_2$ was 10.3 Å.

Example 38

In a similar manner to Example 37 except for the use of 0.06 mole of $CaHPO_4$, 0.0282 mole of $CaCO_3$, 0.06 mole of $MgHPO_4$, 0.0282 mole of $MgCO_3$ and 0.0018 mole of $Eu_2O_3$ instead as raw materials, a phosphor $Eu_{0.06}Ca_{1.47}Mg_{1.47}(PO_4)_2$ was prepared.

Figure 34:
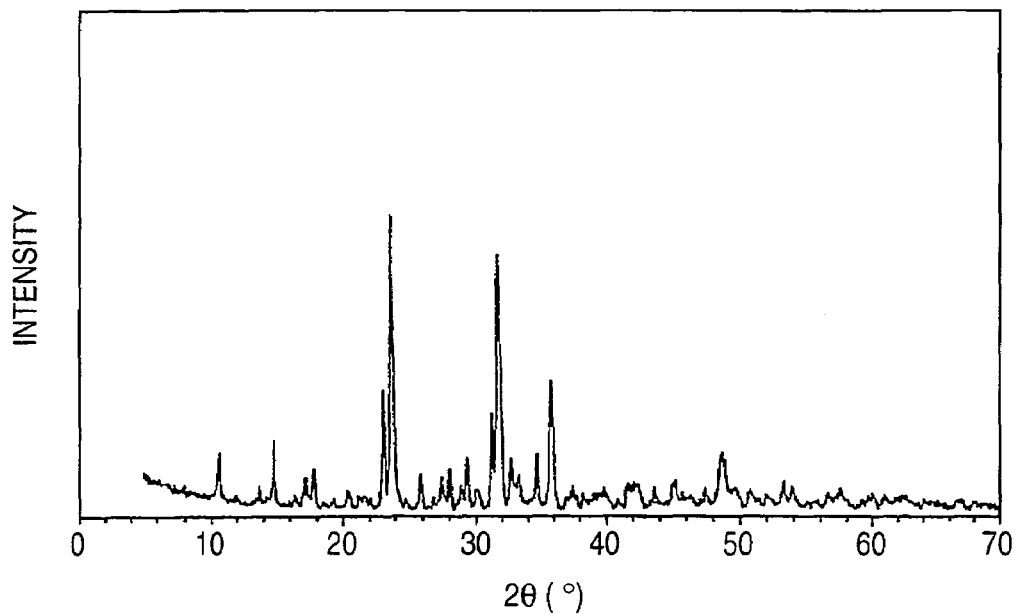
FIG. 34 is an X-ray diffraction pattern (X-ray source: Cu Kα) of the phosphor obtained in Example 38.

The X-ray diffraction pattern of the resulting phosphor is shown in FIG. 34. It suggests that the peak pattern of FIG. 34 is crystallographically identical to that of $Ca_3Mg_3(PO_4)_4$ of FIG. 31.

The resulting phosphor was excited at 400 nm, that is, a dominant wavelength of the ultraviolet region of a GaN light emitting diode to measure its emission spectrum. In Table 5, the wavelength, relative integrated intensity, half-width, and relative emission intensity (i) of its emission peak, and the relative emission intensity (i) upon excitation at 254 nm are shown.

The Eu—Eu mean distance was 14.0 Å.

Example 39

In a similar manner to Example 37 except for the use of 0.06 mole of $CaHPO_4$, 0.0291 mole of $CaCO_3$, 0.06 mole of $MgHPO_4$, 0.0291 mole of $MgCO_3$ and 0.0009 mole of $Eu_2O_3$ instead as raw materials, a phosphor $Eu_{0.03}Ca_{1.485}Mg_{1.485}(PO_4)_2$ was prepared.

The resulting phosphor was excited at 400 nm, that is, a dominant wavelength of the ultraviolet region of a GaN light emitting diode to measure its emission spectrum. In Table 5, the wavelength, relative integrated intensity, half-width, and relative emission intensity (i) of the emission peak, and the relative emission intensity (i) upon excitation at 254 nm are shown.

The Eu—Eu mean distance was 17.7 Å.

Example 40

In a similar manner to Example 37 except for the use of 0.06 mole of $CaHPO_4$, 0.02955 mole of $CaCO_3$, 0.06 mole of $MgHPO_4$, 0.02955 mole of $MgCO_3$ and 0.00045 mole of $Eu_2O_3$ instead as raw materials, a phosphor $Eu_{0.015}Ca_{1.4925}Mg_{1.4925}(PO_4)_2$ was prepared.

Figure 35:
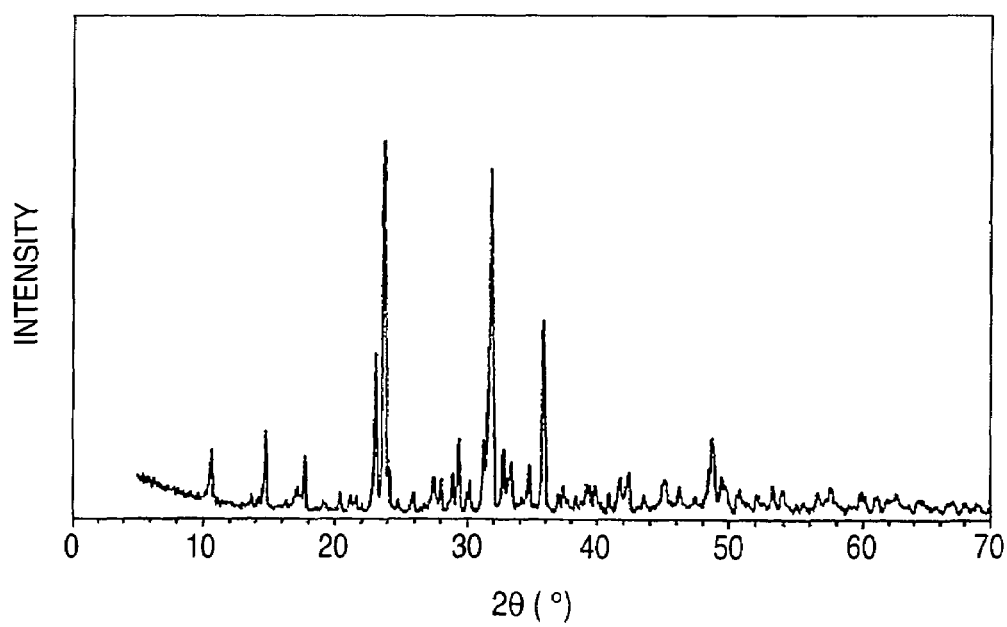
FIG. 35 illustrates an X-ray diffraction pattern (X-ray source: Cu Kα) of the phosphor obtained in Example 40.

The X-ray diffraction pattern of this phosphor is shown in FIG. 35. It suggests that the peak pattern of FIG. 35 is crystallographically identical to that of $Ca_3Mg_3(PO_4)_4$ of FIG. 31.

The resulting phosphor was excited at 400 nm, that is, a dominant wavelength of the ultraviolet region of a GaN light emitting diode to measure its emission spectrum. In Table 5, the wavelength, relative integrated intensity, half-width, and relative emission intensity (i) of its emission peak, and the relative emission intensity (i) upon excitation at 254 nm are shown.

The Eu—Eu mean distance was 22.2 Å.

Example 41

In a similar manner to Example 37 except for the use of 0.06 mole of $CaHPO_4$, 0.02991 mole of $CaCO_3$, 0.06 mole of $MgHPO_4$, 0.02991 mole of $MgCO_3$ and 0.00009 mole of $Eu_2O_3$ instead as raw materials, a phosphor $Eu_{0.003}Ca_{1.4985}Mg_{1.4985}(PO_4)_2$ was prepared.

The resulting phosphor was excited at 400 nm, that is, a dominant wavelength of the ultraviolet region of a GaN light emitting diode to measure its emission spectrum. In Table 5, the wavelength, relative integrated intensity, half-width, and relative emission intensity (i) of its emission peak, and the relative emission intensity (i) upon excitation at 254 nm are shown.

The Eu—Eu mean distance was 38.0 Å.

Example 42

In a similar manner to Example 37 except for the use of 0.0802 mole of $CaHPO_4$, 0.0389 mole of $CaCO_3$, 0.0398 mole of $MgHPO_4$, 0.0193 mole of $MgCO_3$ and 0.0009 mole of $Eu_2O_3$ instead as raw materials, a phosphor $Eu_{0.03}Ca_{1.985}Mg_{0.985}(PO_4)_2$ was prepared.

The resulting phosphor was excited at 400 nm, that is, a dominant wavelength of the ultraviolet region of a GaN light emitting diode to measure its emission spectrum. In Table 5, the wavelength, relative integrated intensity and half-width of its emission peak are shown.

The Eu—Eu mean distance was 17.7 Å.

Example 43

In a similar manner to Example 37 except for the use of 0.12 mole of $CaHPO_4$, 0.0582 mole of $CaCO_3$ and 0.0009 mole of $Eu_2O_3$ instead as raw materials, a phosphor $Eu_{0.03}Ca_{2.97}(PO_4)_2$ was prepared.

The resulting phosphor was excited at 400 nm, that is, a dominant wavelength of the ultraviolet region of a GaN light emitting diode to measure its emission spectrum. In Table 5, the wavelength, relative integrated intensity and half-width of its emission peak are shown.

The Eu—Eu mean distance was 17.7 Å.

Example 44

In a similar manner to Example 37 except for the use of 0.0398 mole of $CaHPO_4$, 0.0193 mole of $CaCO_3$, 0.0802 mole of $MgHPO_4$, 0.0389 mole of $MgCO_3$ and 0.0009 mole of $Eu_2O_3$ instead as raw materials, a phosphor $Eu_{0.03}Ca_{0.985}Mg_{1.985}(PO_4)_2$ was prepared.

The resulting phosphor was excited at 400 nm, that is, a dominant wavelength of the ultraviolet region of a GaN light emitting diode to measure its emission spectrum. In Table 5, the wavelength, relative integrated intensity and half-width of its emission peak are shown.

The Eu—Eu mean distance was 17.7 Å.

Example 45

In a similar manner to Example 37 except for the use of 0.05 mole of $CaHPO_4$, 0.01875 mole of $CaCO_3$, 0.05 mole of $MgHPO_4$, 0.01875 mole of $MgCO_3$ and 0.00625 mole of $Eu_2O_3$ instead as raw materials, a phosphor $Eu_{0.25}Ca_{1.375}Mg_{1.375}(PO_4)_2$ was prepared. The resulting phosphor was excited at 400 nm, that is, a dominant wavelength of the ultraviolet region of a GaN light emitting diode to measure its emission spectrum. In Table 5, the wavelength, half-width, and relative emission intensity (i) of its emission peak, and the relative emission intensity (i) upon excitation at 254 nm are shown.

The Eu—Eu mean distance was 8.7 Å.

Example 46

In a similar manner to Example 37 except for the use of 0.05 mole of $CaHPO_4$, 0.0175 mole of $CaCO_3$, 0.05 mole of $MgHPO_4$, 0.0175 mole of $MgCO_3$ and 0.0075 mole of $Eu_2O_3$ instead as raw materials, a phosphor $Eu_{0.3}Ca_{1.35}Mg_{1.35}(PO_4)_2$ was prepared. The resulting phosphor was excited at 400 nm, that is, a dominant wavelength of the ultraviolet region of a GaN light emitting diode to measure its emission spectrum. In Table 5, the wavelength, half-width, and relative emission intensity (i) of its emission spectrum, and the relative emission intensity (i) upon excitation at 254 nm are shown.

The Eu—Eu mean distance was 8.19 Å.

Example 47

In a similar manner to Example 37 except for the use of 0.05 mole of $CaHPO_4$, 0.015 mole of $CaCO_3$, 0.05 mole of $MgHPO_4$, 0.015 mole of $MgCO_3$ and 0.01 mole of $Eu_2O_3$ instead as raw materials, a phosphor $Eu_{0.4}Ca_{1.3}Mg_{1.3}(PO_4)_2$ was prepared. The resulting phosphor was excited at 400 nm, that is, a dominant wavelength of the ultraviolet region of a GaN light emitting diode to measure its emission spectrum. In Table 5, the wavelength, half-width, and relative emission intensity (i) of its emission peak, and the relative emission intensity (i) upon excitation at 254 nm are shown.

The Eu—Eu mean distance was 7.44 Å.

Comparative Example 6

In a similar manner to Example 37 except for the use of 0.12 mole of $MgHPO_4$, 0.0594 mole of $MgCO_3$ and 0.0003 mole of $Eu_2O_3$ instead as raw materials, a phosphor $Eu_{0.01}Mg_{2.99}(PO_4)_2$ was prepared.

The resulting phosphor was excited at 400 nm, that is, a dominant wavelength of the ultraviolet region of a GaN light emitting diode to measure its emission spectrum. In Table 5, the wavelength, relative integrated intensity and half-width of its emission peak are shown. Compared with a phosphor having a Ca-containing composition, the phosphor having a Ca-free composition has lower emission intensity and smaller half-width of the emission peak so that it has inferior color rendering property.

upon excitation at 400 nm and 254 nm are 0.25 and 0.015, respectively and the former is greater than the latter. It has also been found that the Eu concentration of each of the phosphors obtained in Examples 37, and 45 to 47 was at least 1.1 times the Eu concentration (0.015) at the maximum emission intensity upon excitation at 254 nm and it falls within a range of from 0.5 to 9 times the Eu concentration (0.25) at the maximum emission intensity upon excitation at 400 nm.

Although the present invention was described in detail or described referring to certain embodiments, it is evident for those skilled in the art that various changes or modifications can be added thereto without departing from the spirit and scope of the present invention.

The present application is based on Japanese Patent Application (Patent Appliation No. 2002-038705) filed on Feb. 15, 2002, Japanese Patent Application (Patent Application No. 2002-050938) filed on Feb. 27, 2002, Japanese Patent Application (Patent Application No. 2002-129143) filed on Apr. 30, 2002, Japanese Patent Application (Patent Application No. 2002-214992) filed on Jul. 24, 2002, Japanese Patent Application (Patent Application No. 2002-348200) filed on Nov. 29, 2002, and Japanese Patent Application (Patent Application No. 2003-004521) filed on Jan. 10, 2003, and they are incorporated herein for reference.

INDUSTRIAL APPLICABILITY

The present invention makes it possible to provide a light emitting device having a high emission intensity and also a light emitting device having a high emission intensity and good color rendering property.

TABLE 5

| | Chemical composition of phosphor | Wavelength (nm) of emission peak upon excitation at 400 nm | Half-width (nm) of emission peak | Relative integrated intensity of emission peak | Relative emission intensity (i) upon excitation at 400 nm | Relative emission intensity (i) upon excitation at 254 nm |
|---|---|---|---|---|---|---|
| Ex. 37 | $Eu_{0.15}Ca_{1.425}Mg_{1.425}(PO_4)_2$ | 464 | 81 | 27.3 | 176 | 88 |
| Ex. 38 | $Eu_{0.06}Ca_{1.47}Mg_{1.47}(PO_4)_2$ | 457 | 75 | 21.1 | 138 | 97 |
| Ex. 39 | $Eu_{0.03}Ca_{1.485}Mg_{1.485}(PO_4)_2$ | 453 | 71 | 16.4 | 114 | 95 |
| Ex. 40 | $Eu_{0.015}Ca_{1.4925}Mg_{1.4925}(PO_4)_2$ | 451 | 68 | 12.8 | 100 | 100 |
| Ex. 41 | $Eu_{0.003}Ca_{1.4985}Mg_{1.4985}(PO_4)_2$ | 450 | 74 | 3.9 | 26 | 62 |
| Ex. 42 | $Eu_{0.03}Ca_{1.985}Mg_{0.985}(PO_4)_2$ | 456 | 71 | 8 | — | — |
| Ex. 43 | $Eu_{0.03}Ca_{2.97}(PO_4)_2$ | 511 | 137 | 12.3 | — | — |
| Ex. 44 | $Eu_{0.03}Ca_{0.985}Mg_{1.985}(PO_4)_2$ | 444 | 46 | 12.8 | — | — |
| Ex. 45 | $Eu_{0.25}Ca_{1.375}Mg_{1.375}(PO_4)_2$ | 457 | 83 | — | 216 | 81 |
| Ex. 46 | $Eu_{0.3}Ca_{1.35}Mg_{1.35}(PO_4)_2$ | 461 | 85 | — | 214 | 71 |
| Ex. 47 | $Eu_{0.4}Ca_{1.3}Mg_{1.3}(PO_4)_2$ | 451 | 76 | — | 194 | 87 |
| Comp. Ex. 6 | $Eu_{0.01}Mg_{2.99}(PO_4)_2$ | 437 | 36 | 1 | — | — |

Example 48

In a similar manner to Example 37 except that the amounts of $CaHPO_4$, $CaCO_3$, $MgHPO_4$, $MgCO_3$ and $Eu_2O_3$ were changed, a phosphor $Eu_xCa_{(1.5-0.5x)}Mg_{(1.5-0.5x)}(PO_4)_2$ with the x falling within a range of from 0.003 to 1.5 was prepared. The resulting phosphor was exposed to light of 254 nm and 400 nm to measure emission spectra.

Figure 36:
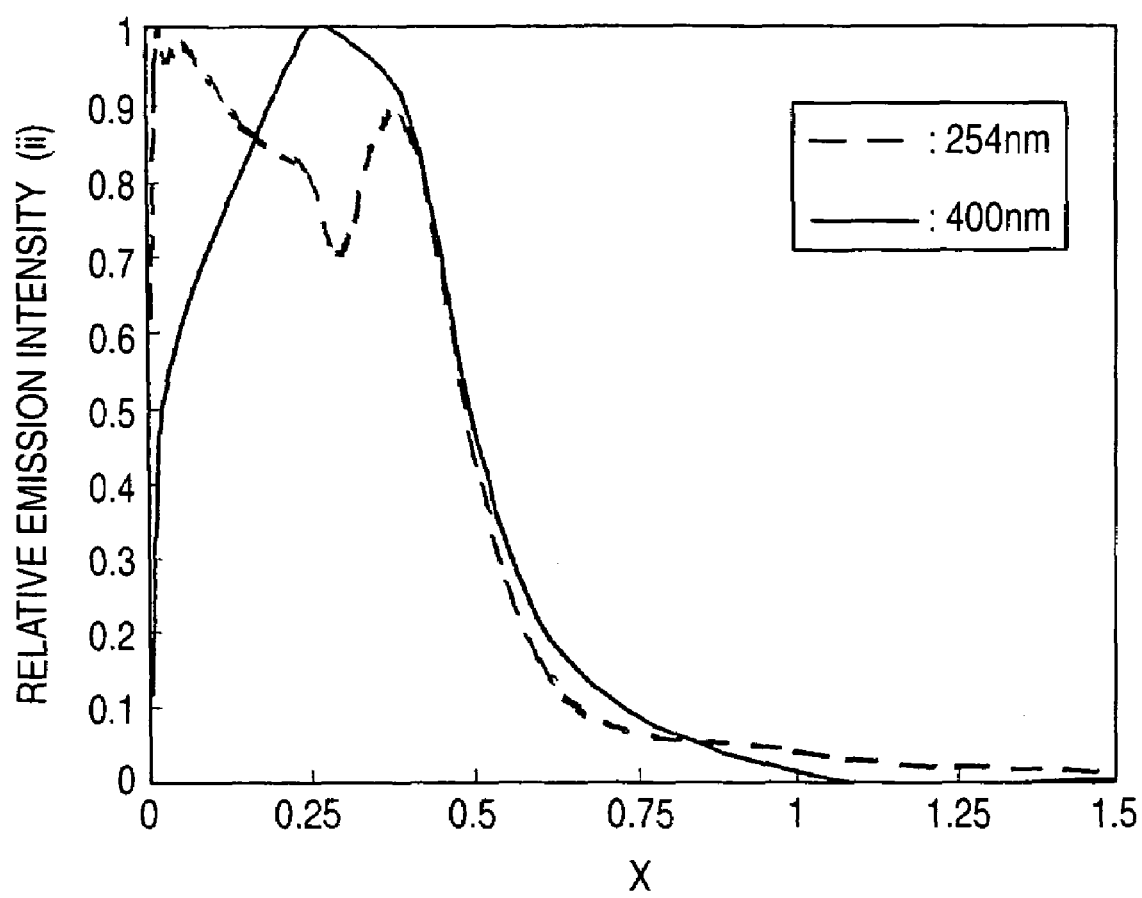
FIG. 36 illustrates the relationship between x of $Eu_xCa_{(1.5-0.5x)}Mg_{(1.5-0.5x)}(PO_4)_2$ and emission intensity upon excitation at each of 254 nm and 400 nm.

The relationship between the x and the emission intensity upon excitation at each of 254 nm and 400 nm is shown in FIG. 36.

The relative emission intensity (ii) used here means emission intensity at the concentration x provided that the maximum emission intensities at 254 nm and 400 nm are each 1.

From FIG. 36, it has been found that the Eu concentrations (mole numbers) x of the maximum emission intensity

The invention claimed is:

1. A light emitting device comprising a first light emitter emitting light of from 350 to 415 nm and a second light emitter emitting visible light by exposure to the light from the first light emitter, wherein said second light emitter comprises a phosphor having a crystal phase having a chemical composition of one of the following formula [1]-[4]:

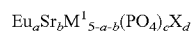

$Eu_aSr_bM^1{}_{5-a-b}(PO_4)_cX_d$      [1]

(wherein, $M^1$ represents a metal element other than Eu and Sr, X represents a monovalent anionic group other than $PO_4$, a and b stand for numbers satisfying $a>0$, $b \geq 0$, $a+b \leq 5$ and at least one of $a \geq 0.1$ and $b \geq 3$, c stands for a number satisfying $2.7 \leq c \leq 3.3$, and d stands for a number satisfying $0.9 \leq d \leq 1.1$, and wherein said other metal element is a divalent metal element and/or, in an amount effective for accelerating crystallization of a complex oxide caused by the diffusion, in solid, of the divalent metal element and emission center $Eu^{2+}$ upon sintering, a monovalent-, trivalent-, tetravalent-, pentavalent-, or hexavalent-metal element);

$$M^2_{(e-ex)}M^{2'}_{ex}Eu_fM^3_{(g-gy)}M^{3'}_{gy}M^4_{(h-hz)}M^{4'}_{(h-hz)}O_i \quad [2]$$

(wherein, $M^2$ represents at least one element selected from the group consisting of Ba, Sr and Ca, $M^{2'}$ represents a monovalent element or a divalent metal element (except Ba, Sr, Ca and Eu) having a radius of 0.92 Å or greater in the divalent form upon coordination number 6, $M^3$ represents at least one element selected from the group consisting of Mg and Zn, $M^{3'}$ represents a divalent metal element (except Mg and Zn) having a radius less than 0.92 Å in the divalent form upon coordination number 6, $M^4$ represents at least one element selected from the group consisting of Al, Ga and Sc, $M^{4'}$ represents a trivalent metal element (except Al, Ga and Sc), f stands for a number satisfying $0.11 \leq f \leq 0.99$, e stands for a number satisfying $0.9 \leq (e+f) \leq 1.1$, g stands for a number satisfying $0.9 \leq g \leq 1.11$, h stands for a number satisfying $0 \leq h11$, I stands for a number satisfying $15.3 \leq i \leq 18.7$, x stands for a number satisfying $0 \leq x < 0.2$, y stands for a number satisfying $0 \leq y < 0.2$, and z stands for a number satisfying $0 \leq z < 0.2$);

$$M^5_jEu_kM^6_lM^7_mO_n \quad [3]$$

(wherein, $M^5$ represents a metal element comprising at least one element selected from the group consisting of Ba, Sr and Ca in a total amount of 90 mol % or greater, $M^6$ represents a metal element comprising at least one element selected from the group consisting of Mg and Zn in a total amount of 90 mol % or greater, $M^7$ represents a metal element comprising at least one element selected from the group consisting of Si and Ge in a total amount of 90 mol % or greater, j stands for a number satisfying $2.5 \leq j \leq 3.3$, k stands for a number satisfying $0.0001 \leq k \leq 1.0$, l stands for a number satisfying $0.9 \leq l \leq 1.1$, m stands for a number satisfying $1.8 \leq m \leq 2.2$ and n stands for a number satisfying $7.2 \leq n \leq 8.8$, and wherein $M^5$ and $M^6$ may each independently include another divalent metal element, and $M^7$ may include another tetravalent element, and/or, $M^5$, $M^6$ and $M^7$ may include in an amount effective for accelerating crystallization of a complex oxide caused by the diffusion, in solid, of divalent and tetravalent metal elements and emission center $Eu^{2+}$ upon sintering, a monovalent-, trivalent-, pentavalent-, or hexavalent-metal element); and $$Eu_oM^8_p(PO_4)_q(BO_3)_{2-q}Z_r \quad [4]$$

(wherein, $M^8$ represents a metal element which contains Ca and 80 mol % or greater of which is composed of at least one element selected from the group consisting of Ca and Mg; Z represents an anionic group other than $PO_4^{3-}$ and $BO_3^{3-}$; o stands for a number satisfying $0.003 \leq o \leq 2.1$, p stands for a number satisfying $2.7 \leq (o+p) \leq 3.3$, q stands for a number satisfying $1.2 \leq q \leq 2$ and r stands for a number satisfying $0 \leq r \leq 0.1$, and wherein $M^8$ may include another divalent metal element and/or, in an amount effective for accelerating crystallization of a complex oxide caused by the diffusion, in solid, of the divalent metal element and emission center $Eu^{2+}$ upon sintering, a monovalent-, trivalent-, tetravalent-, pentavalent-, or hexavalent-metal element).

2. The light emitting device according to claim 1, wherein the phosphor has formula [1].

3. The light emitting device according to claim 2, wherein a and b satisfy $0.1 \leq a < 5$ and $0.01 \leq b < 5$; or $0.0001 \leq a < 5$ and $3 \leq b < 5$.

4. The light emitting device according to claim 2, wherein 70 mol % or greater of $M^1$ is composed of at least one element selected from the group consisting of Ba, Mg, Ca, Zn and Mn.

5. The light emitting device according to claim 2, wherein 50 mol % or greater of X is composed of Cl.

6. The light emitting device according to claim 2, wherein a and b satisfy $a \leq 0.1$ and $b \leq 3$.

7. The light emitting device according to claim 2, wherein a satisfies $a < 0.2$.

8. The light emitting device according to claim 7, wherein a satisfies $0.2 < a \leq 3$.

9. The light emitting device according to claim 2, wherein $M^1$ is composed of at least one element selected from the group consisting of Ba, Mg, Ca, Zn and Mn; and X is composed of Cl.

10. The light emitting device according to claim 2, wherein $M^1$ is composed of at least one element selected from the group consisting of Ba, Mg, and Ca; and X is composed of Cl.

11. A light emitting device according to claim 2, wherein b satisfies $b > 0$.

12. The light emitting device according to claim 1, wherein the phosphor has formula [2].

13. The light emitting device according to claim 12, wherein f stands for $0.15 \leq f \leq 0.85$.

14. The light emitting device according to claim 12, wherein $M^4$ represents Al.

15. The light emitting device according to claim 12, wherein a ratio of Ba to the total of $M^2$ and $M^{2'}$ is 30 mol % or greater and at the same time, a ratio of at least one of Sr and Ca to said total is 20 mol % or greater.

16. The light emitting device according to claim 12, wherein z stands for 0.

17. The light emitting device according to claim 12, wherein x and y each stands for 0.

18. The light emitting device according to claim 1, wherein the phosphor has formula [3].

19. The light emitting device according to claim 18, wherein a proportion of the total amounts of Ba, Sr and Ca in $M^5$, a proportion of the total amounts of Mg and Zn in $M^6$, and a proportion of the total amounts of Si and Ge in $M^7$ is each 95 mol % or greater.

20. The light emitting device according to claim 18, wherein $M^5$ represents at least one metal element selected from Ba, Sr and Ca, $M^6$ represents at least one metal element selected from Mg and Zn and $M^7$ represents at least one metal element selected from Si and Ge.

21. The light emitting device according to claim 18, wherein $M^5$ represents at least one metal element selected from Ba and Sr, $M^6$ represents Mg, and $M^7$ represents Si.

22. The light emitting device according to claim 18, wherein k stands for a number satisfying $0.001 \leq k \leq 1$.

23. The light emitting device according to claim 18, wherein a molar ratio of Ba to Sr in $M^5$ is 0.05 or greater.

24. The light emitting device according to claim 18, wherein j stands for a number satisfying $2.7 \leq j \leq 3.3$.

25. The light emitting device according to claim 1, wherein the phosphor has formula [4].

26. The light emitting device according to claim 25, wherein o stands for a number satisfying $0.015 \leq o \leq 2.1$.

27. The light emitting device according to claim 25, wherein a proportion, in $M^8$, of Ca to the total amount of Ca and Mg is 40 mol % or greater.

28. The light emitting device according to claim 25, wherein q stands for a number satisfying $1.6 \leq q \leq 2$.

29. The light emitting device according to claim 25, wherein $M^8$ has least one element selected from the group consisting of Ca and Mg and comprises 40 mol % or greater of Ca.

30. The light emitting device according to claim 25, wherein q is 2.

31. The light emitting device according to claim 1, wherein the first light emitter is a laser diode or light emitting diode.

32. The light emitting device according to claim 31, wherein the first light emitter is a laser diode.

33. The light emitting device according to claim 31, wherein the first light emitter uses a GaN compound semiconductor.

34. The light emitting device according to claim 31, wherein the first light emitter is a vertical cavity surface emitting GaN laser diode.

35. The light emitting device according to claim 1, wherein the second light emitter is in the film form.

36. The light emitting device according to claim 35, wherein the visible light is emitted directly while bringing a film surface of the second light emitter into direct contact with a light emitting surface of the first light emitter.

37. The light emitting device according to claim 1, wherein the second light emitter is obtainable by dispersing the phosphor in the powder form in a resin.

38. The light emitting device according to claim 1, wherein the light coming out from the light emitting device is a mixture of the light from the first light emitter and the light from the second light emitter and is white in color.

39. An illuminator having a light emitting device according to claim 1.

* * * * *